US012776616B2

(12) United States Patent
Yamanaka

(10) Patent No.: US 12,776,616 B2
(45) Date of Patent: Oct. 27, 2026

(54) SEMICONDUCTOR LIGHT-EMITTING DEVICE AND LIGHT SOURCE DEVICE

(71) Applicant: Nuvoton Technology Corporation Japan, Kyoto (JP)

(72) Inventor: Kazuhiko Yamanaka, Toyama (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 756 days.

(21) Appl. No.: 18/172,120

(22) Filed: Feb. 21, 2023

(65) Prior Publication Data

US 2023/0198221 A1 Jun. 22, 2023

Related U.S. Application Data

(63) Continuation of application No. PCT/JP2021/029884, filed on Aug. 16, 2021.

(30) Foreign Application Priority Data

Aug. 25, 2020 (JP) ................................ 2020-141924

(51) Int. Cl.
*H01S 5/02216* (2021.01)
*H01S 5/00* (2006.01)
(Continued)

(52) U.S. Cl.
CPC ........ *H01S 5/02257* (2021.01); *H01S 5/0064* (2013.01); *H01S 5/0071* (2013.01);
(Continued)

(58) Field of Classification Search
CPC ............... H01S 5/02216; H01S 5/0232; H01S 5/02218; H01S 5/02469; H01S 5/0237;
(Continued)

(56) References Cited

U.S. PATENT DOCUMENTS

2006/0292720 A1* 12/2006 Nishikawa ............ H01S 5/0231
438/26
2009/0086769 A1* 4/2009 Minamio ............... B82Y 20/00
372/5

(Continued)

FOREIGN PATENT DOCUMENTS

JP 2004-087543 A 3/2004
JP 2004087543 * 3/2004 ............. H01S 5/022

(Continued)

OTHER PUBLICATIONS

International Search Report issued on Oct. 26, 2021 in International Patent Application No. PCT/JP2021/029884, with English translation.

*Primary Examiner* — Xinning(Tom) Niu
*Assistant Examiner* — Delma R Forde
(74) *Attorney, Agent, or Firm* — Rimon P.C.

(57) ABSTRACT

A semiconductor light-emitting device is provided which includes: a wiring substrate; a semiconductor light-emitting element disposed above an upper surface of the wiring substrate; and a cap unit which covers the semiconductor light-emitting element. The wiring substrate includes: a first substrate; a first metal layer and a second metal layer that are spaced apart from each other above the first substrate; and a spacer layer disposed above the first substrate. The cap unit includes a bonding surface which is bonded to the wiring substrate. The bonding surface intersects the first metal layer and the second metal layer in a top view of the wiring substrate, and the spacer layer is disposed between the bonding surface and the first substrate, at a position different from positions of the first metal layer and the second metal layer.

28 Claims, 38 Drawing Sheets

(51) Int. Cl.

| | |
|---|---|
| ***H01S 5/02218*** | (2021.01) |
| ***H01S 5/02257*** | (2021.01) |
| ***H01S 5/023*** | (2021.01) |
| ***H01S 5/024*** | (2006.01) |

(52) U.S. Cl.
CPC .......... *H01S 5/02218* (2021.01); *H01S 5/023* (2021.01); *H01S 5/02461* (2013.01); *H01S 5/02469* (2013.01)

(58) Field of Classification Search
CPC ....... H01S 5/02315; H01S 5/022–0239; H01S 5/024–02492; H01S 5/02257; H01S 5/023–0239
See application file for complete search history.

(56) References Cited

U.S. PATENT DOCUMENTS

| | | | | |
|---|---|---|---|---|
| 2009/0321777 | A1* | 12/2009 | Mitsuyama | H01S 5/0231 257/E31.11 |
| 2013/0194165 | A1* | 8/2013 | Tanaka | F21V 5/007 362/240 |
| 2019/0214784 | A1 | 7/2019 | Yamamoto et al. | |

FOREIGN PATENT DOCUMENTS

| | | | | | |
|---|---|---|---|---|---|
| JP | 2013-157364 | A | | 8/2013 | |
| JP | 6305668 | B1 | | 4/2018 | |
| JP | 2018-106973 | A | | 7/2018 | |
| JP | 2018106973 | | * | 7/2018 | F21S 2/00 |
| JP | 2019-071331 | A | | 5/2019 | |
| WO | WO-2011142059 | A1 | * | 11/2011 | H10W 42/00 |

* cited by examiner

FIG. 9

| | Metal layer | | Applied current (A) | Metal layer dimensions | | | Resistance (Ω) | Voltage increase (V) |
|---|---|---|---|---|---|---|---|---|
| | Metal material | Resistivity (Ω·m) | | Thickness T (mm) | Width W (mm) | Length L (mm) | | |
| Design example 1 | Tungsten | 5.7E-08 | 2 | 0.020 | 0.5 | 20 | 0.1140 | 0.228 |
| Design example 2 | Tungsten | 5.7E-08 | 2 | 0.050 | 1.0 | 20 | 0.0228 | 0.046 |
| Design example 3 | Copper | 1.8E-08 | 2 | 0.018 | 0.5 | 20 | 0.0400 | 0.080 |
| Design example 4 | Copper | 1.8E-08 | 2 | 0.050 | 1.0 | 20 | 0.0072 | 0.014 |
| Design example 5 | Copper | 1.8E-08 | 5 | 0.100 | 1.0 | 20 | 0.0036 | 0.018 |
| Design example 6 | Copper | 1.8E-08 | 30 | 0.070 | 7.0 | 5 | 0.0002 | 0.006 |

SEMICONDUCTOR LIGHT-EMITTING DEVICE AND LIGHT SOURCE DEVICE

CROSS REFERENCE TO RELATED APPLICATIONS

This is a continuation application of PCT International Application No. PCT/JP2021/029884 filed on Aug. 16, 2021, designating the United States of America, which is based on and claims priority of Japanese Patent Application No. 2020-141924 filed on Aug. 25, 2020. The entire disclosures of the above-identified applications, including the specifications, drawings and claims are incorporated herein by reference in their entirety.

FIELD

The present disclosure relates to a semiconductor light-emitting device and a light source device.

BACKGROUND

A semiconductor light-emitting device has been proposed in which a semiconductor light-emitting element such as a semiconductor laser element is mounted above a substrate and a cap covers the semiconductor light-emitting element (see Patent Literature (PTL) 1 and 2, etc., for example).

A configuration in which a semiconductor laser element is mounted above a substrate via a submount, and a cap that covers the semiconductor laser element is disposed above the substrate is proposed in PTL 1 and 2. A transparent plate for extracting out laser light is provided on a side surface of the cap.

According to PTL 1 and 2, the heat dissipation property of the semiconductor laser element is enhanced by the submount and the substrate, and the cap hermetically seals the semiconductor laser element, thereby trying to enhance the reliability of the semiconductor laser element.

CITATION LIST

Patent Literature

PTL 1: Japanese Patent No. 6305668
PTL 2: Japanese Unexamined Patent Application Publication No. 2019-71331

SUMMARY

Technical Problem

In such a configuration as described in PTL 1 and 2, the increase in optical output of the semiconductor light-emitting element disposed inside the cap requires a large amount of current to be supplied to the semiconductor light-emitting element. For this reason, it is necessary to use, as wiring for supplying current to the semiconductor light-emitting element, a wiring having a large cross-sectional area which is suitable to supply a large amount of current, i.e., wiring with low resistance. When such a wiring having a large cross-sectional area is disposed above the substrate, the wiring having a large cross-sectional area is placed between the cap and the substrate, and thus a gap is created between the cap and the substrate. This makes it difficult to seal the gap between the cap and the substrate. In order to avoid such a problem, the wiring could be disposed inside the substrate, but this makes the configuration of the substrate complicated and increases costs.

The present disclosure solves such problems and provides a semiconductor light-emitting device, etc. having a simplified configuration and capable of achieving an increase in optical output and enhanced reliability of the semiconductor light-emitting element.

Solution to Problem

In order to solve the above-described problems, a semiconductor light-emitting device according to one aspect of the present disclosure includes a wiring substrate; a semiconductor light-emitting element disposed above an upper surface of the wiring substrate; and a cap unit which is disposed above the upper surface of the wiring substrate and covers the semiconductor light-emitting element. In the semiconductor light-emitting device, the wiring substrate includes: a first substrate; a first metal layer and a second metal layer that are spaced apart from each other above the first substrate; and a spacer layer disposed above the first substrate, the cap unit includes a bonding surface which is bonded to the wiring substrate, the bonding surface intersecting the first metal layer and the second metal layer in a top view of the wiring substrate, and the spacer layer is disposed between the bonding surface and the first substrate, at a position different from positions of the first metal layer and the second metal layer.

In addition, in one aspect of the semiconductor light-emitting device according to the present disclosure, the wiring substrate may further include a first insulating layer disposed above the upper surface of the first substrate, and the first metal layer, the second metal layer, and the spacer layer may be disposed above the first insulating layer.

In addition, in one aspect of the semiconductor light-emitting device according to the present disclosure, the first substrate may be a metal substrate.

In addition, in one aspect of the semiconductor light-emitting device according to the present disclosure, the metal substrate may comprise a metal flat plate.

In addition, in one aspect of the semiconductor light-emitting device according to the present disclosure, the first insulating layer may include an opening, and the semiconductor light-emitting element may be disposed in the opening.

In addition, in one aspect of the semiconductor light-emitting device according to the present disclosure, the spacer layer may be disposed along the bonding surface.

In addition, in one aspect of the semiconductor light-emitting device according to the present disclosure, the wiring substrate may include a second insulating layer that covers at least one of a portion of the first metal layer, a portion of the second metal layer, or a portion of the spacer layer.

In addition, in one aspect of the semiconductor light-emitting device according to the present disclosure, the spacer layer may comprise a metal material.

In addition, in one aspect of the semiconductor light-emitting device according to the present disclosure, the spacer layer may comprise a material that one of the first metal layer or the second metal layer includes, and may be electrically connected to the one of the first metal layer or the second metal layer.

In addition, in one aspect of the semiconductor light-emitting device according to the present disclosure, the cap unit may include a top plate which is rectangular, and four side walls each connected to a corresponding one of four sides at a peripheral edge of the top plate, one of the four side walls may be a light-transmissive window including an inorganic light-transmissive plate and an antireflection film disposed on the inorganic light-transmissive plate, and emitted light from the semiconductor light-emitting element may pass through the light-transmissive window.

In addition, in one aspect of the semiconductor light-emitting device according to the present disclosure, the top plate may be transparent.

In addition, in one aspect of the semiconductor light-emitting device according to the present disclosure, a gap between the light-transmissive window and an emission surface of the semiconductor light-emitting element may be greater than zero and less than a thickness of the light-transmissive window.

In addition, in one aspect of the semiconductor light-emitting device according to the present disclosure, among the four side walls, side walls other than the light-transmissive window may each have a thickness greater than the thickness of the light-transmissive window.

In addition, in one aspect of the semiconductor light-emitting device according to the present disclosure, the cap unit may include a top plate which is rectangular, and four side walls each connected to a corresponding one of four sides at a peripheral edge of the top plate, the top plate may be a light-transmissive window including an inorganic light-transmissive plate and an antireflection film disposed on the inorganic light-transmissive plate, and emitted light from the semiconductor light-emitting element may pass through the light-transmissive window.

In addition, in one aspect of the semiconductor light-emitting device according to the present disclosure, the semiconductor light-emitting device may include a reflective optical element, and the emitted light from the semiconductor light-emitting element may be reflected by the reflective optical element, and propagate in a direction perpendicular to the upper surface of the wiring substrate.

In addition, in one aspect of the semiconductor light-emitting device according to the present disclosure, the semiconductor light-emitting device may include a functional element disposed above the wiring substrate.

In addition, in one aspect of the semiconductor light-emitting device according to the present disclosure, the functional element may be covered by the cap unit.

In addition, in one aspect of the semiconductor light-emitting device according to the present disclosure, the functional element may be a temperature sensing element.

In addition, in one aspect of the semiconductor light-emitting device according to the present disclosure, the temperature sensing element may be disposed at a position at which the temperature sensing element does not intersect an optical axis of the semiconductor light-emitting element.

In addition, in one aspect of the semiconductor light-emitting device according to the present disclosure, the semiconductor light-emitting device may further include a shielding component disposed between the temperature sensing element and the semiconductor light-emitting element.

In addition, in one aspect of the semiconductor light-emitting device according to the present disclosure, the first substrate may include a slanted cut surface at an end portion.

In addition, in order to solve the above-described problems, a light source device according to one aspect of the present disclosure includes the above-described semiconductor light-emitting device, a heat sink on which the semiconductor light-emitting device is disposed, and a fixing screw that fixes the semiconductor light-emitting device to the heat sink. In the light source device, the wiring substrate includes a through-hole, and the fixing screw penetrates through the through-hole and is fixed to the heat sink.

In addition, the light source device according to one aspect of the present disclosure may include a cable including a terminal, and a terminal fixing screw. In the light source device, the wiring substrate may include an extraction electrode electrically connected to the first metal layer, the extraction electrode may include an electrode through-hole at a center portion, the terminal fixing screw may penetrate through the electrode through-hole, the terminal may be disposed between the terminal fixing screw and the extraction electrode, and the extraction electrode and the terminal may be electrically connected to each other.

Advantageous Effects

According to the present disclosure, it is possible to provide a semiconductor light-emitting device, etc. having a simplified configuration and capable of achieving an increase in optical output and enhanced reliability of the semiconductor light-emitting element.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 9 is a table indicating design examples of the metal layer.

DESCRIPTION OF EMBODIMENTS

Hereinafter, embodiments of the present disclosure will be described with reference to the drawings. It should be noted that each of the embodiments described below shows a specific example of the present disclosure. Therefore, numerical values, shapes, materials, structural components, the arrangement and connection of the structural components, etc. indicated in the following embodiments are mere examples, and are not intended to limit the scope of the present disclosure.

In addition, each of the diagrams is a schematic diagram and thus is not necessarily strictly illustrated. Therefore, the scale sizes and the like are not necessarily exactly represented in each of the diagrams. In each of the diagrams, substantially the same structural components are assigned with the same reference signs, and redundant descriptions will be omitted or simplified.

Moreover, in the present specification, the terms “above” and “below” do not refer to the vertically upward direction and vertically downward direction in terms of absolute spatial recognition, but are used as terms defined by relative positional relationships based on the layering order in a layered configuration. Furthermore, the terms “above” and “below” are applied not only when two structural components are disposed with a gap therebetween or when a separate structural component is interposed between two structural components, but also when two structural components are disposed in contact with each other.

Embodiment 1

A semiconductor light-emitting device according to Embodiment 1 will be described below.

1-1. Overall Configuration

Figure 1A:
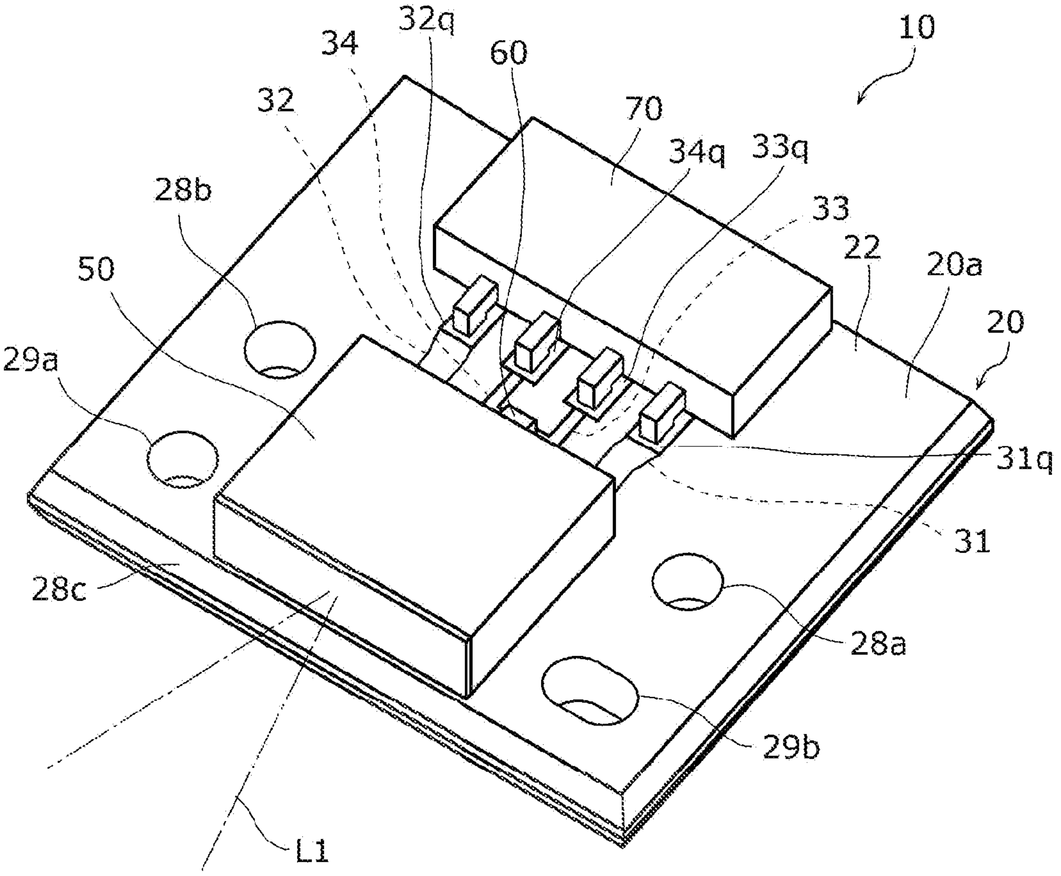
FIG. 1A is a perspective view schematically illustrating the overall configuration of a semiconductor light-emitting device according to Embodiment 1.
Figure 1B:
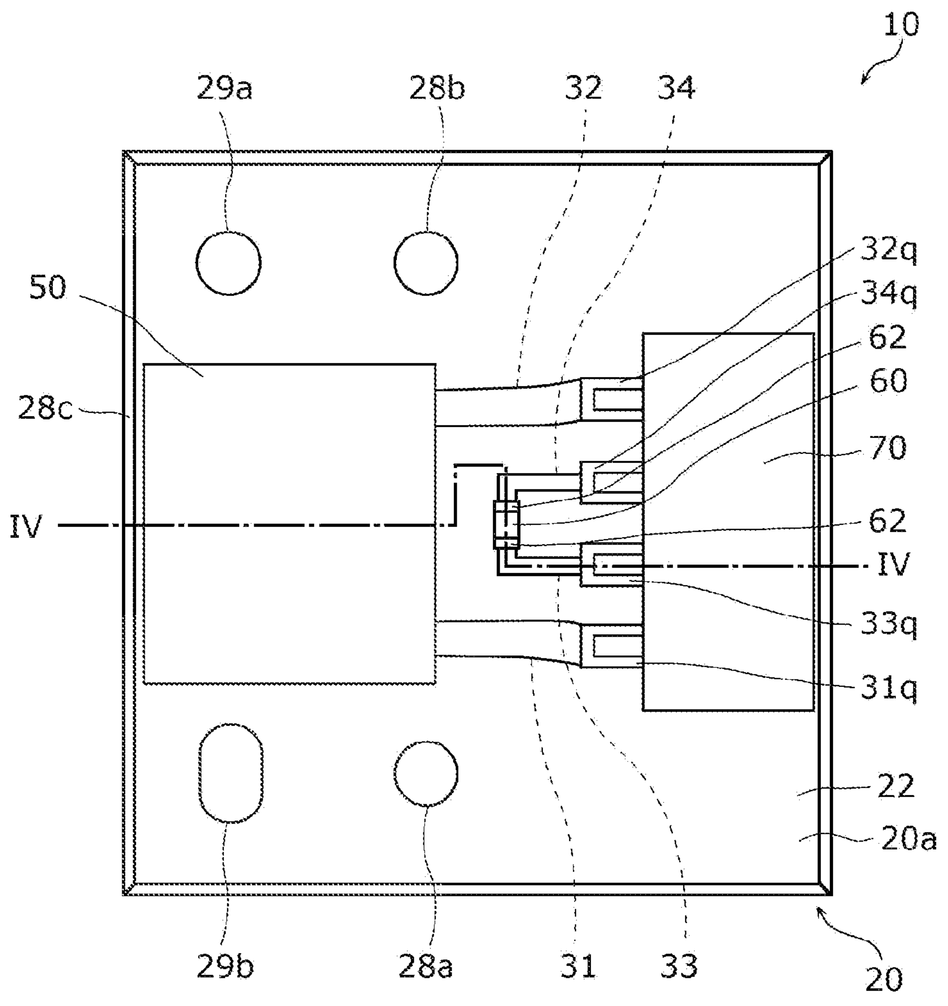
FIG. 1B is a top view schematically illustrating the overall configuration of the semiconductor light-emitting device according to Embodiment 1.
Figure 2:
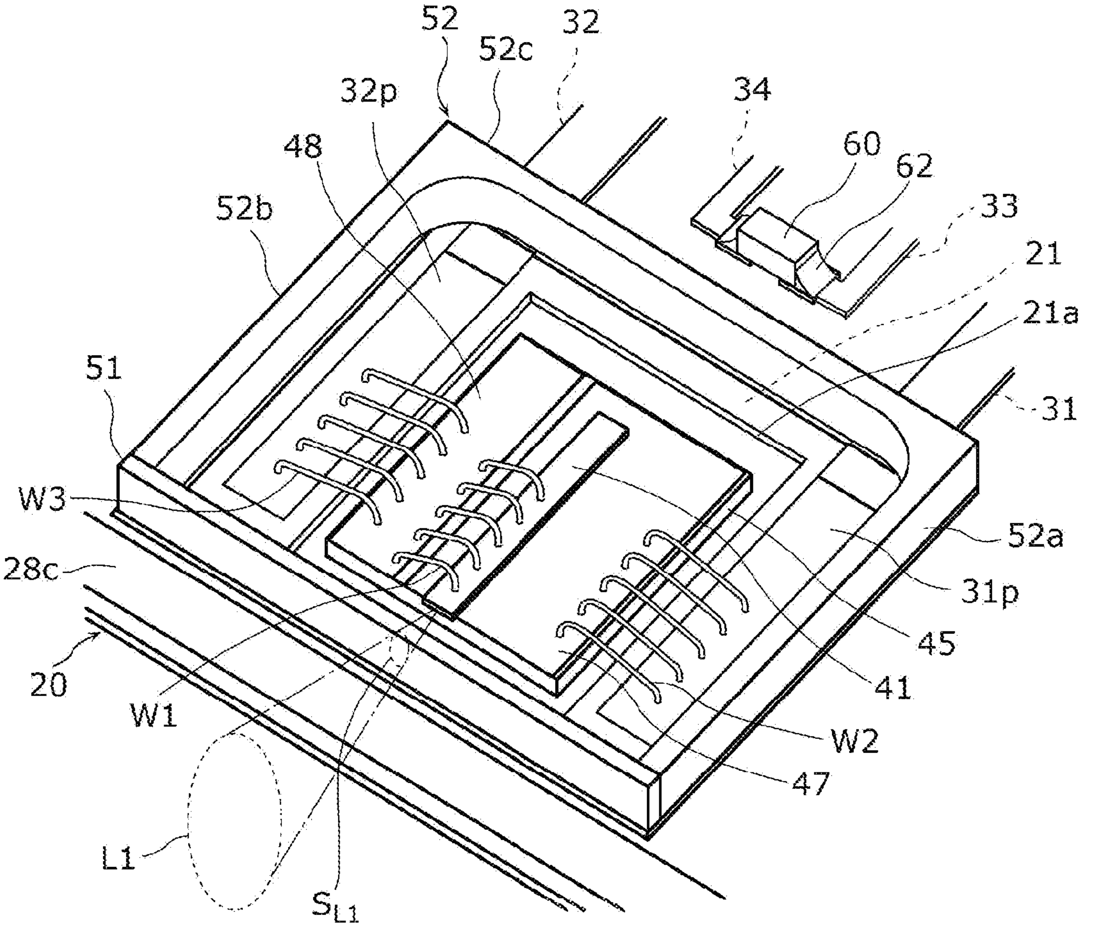
FIG. 2 is a perspective view schematically illustrating the configuration of the inside of a cap unit of the semiconductor light-emitting device according to Embodiment 1.
Figure 3A:
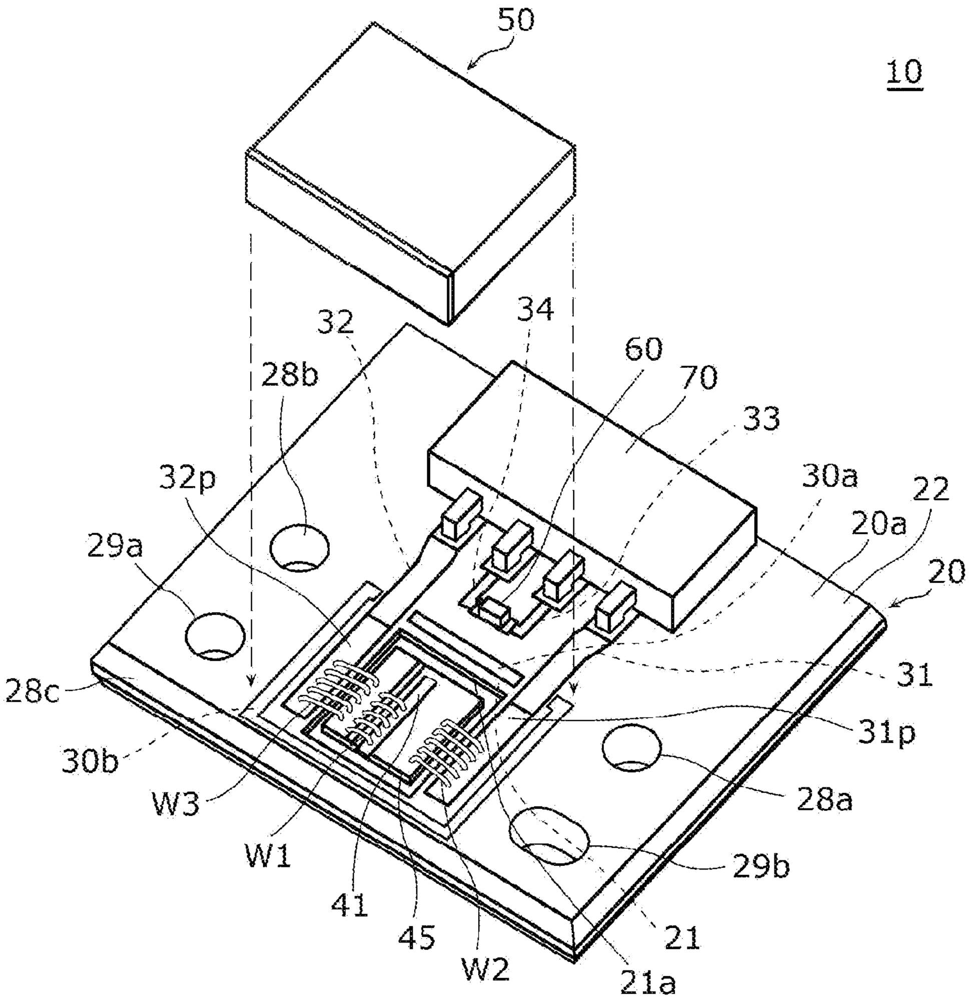
FIG. 3A is an exploded perspective view schematically illustrating the overall configuration of the semiconductor light-emitting device according to Embodiment 1.
Figure 3B:
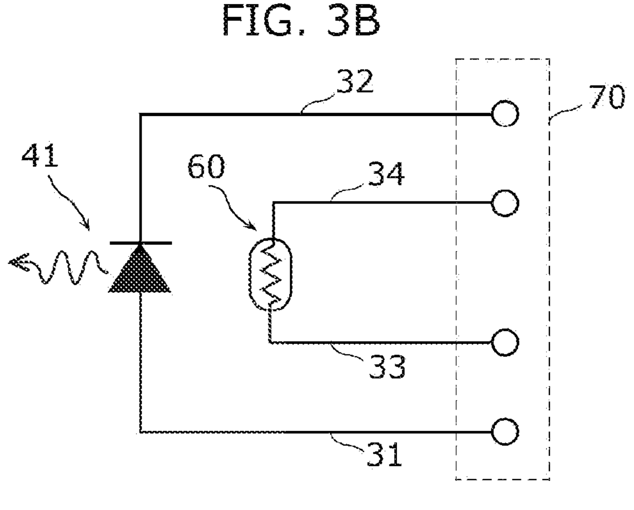
FIG. 3B is an equivalent circuit illustrating the circuit configuration of the semiconductor light-emitting device according to Embodiment 1.
Figure 4:
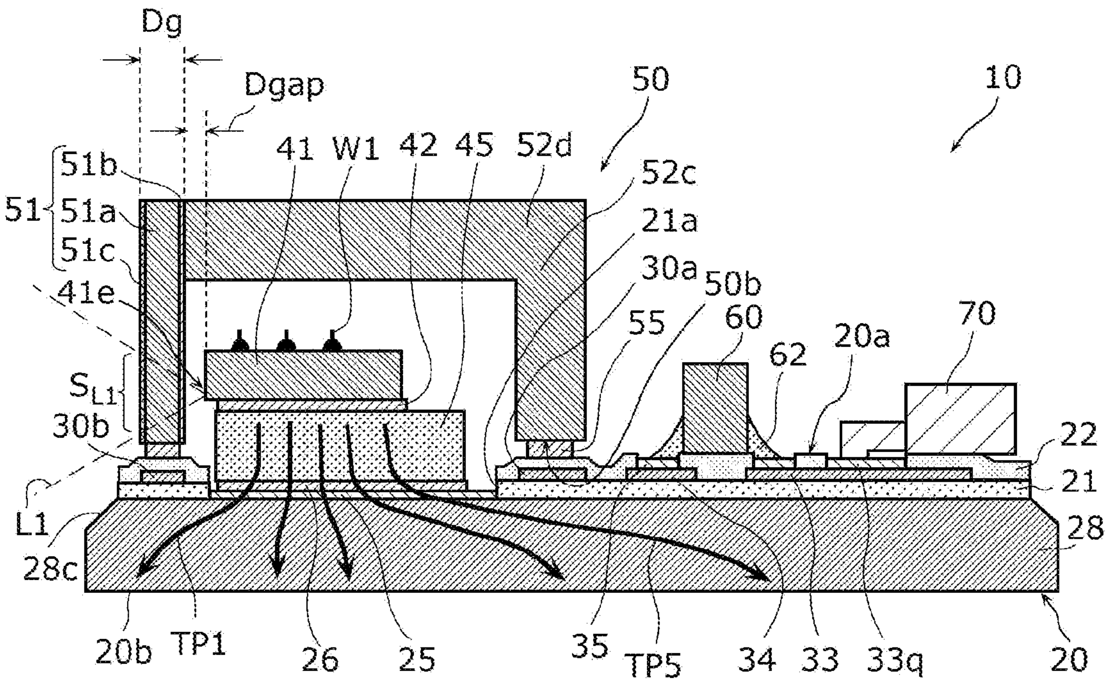
FIG. 4 is a cross-sectional view schematically illustrating the overall configuration of the semiconductor light-emitting device according to Embodiment 1.

First, the overall configuration of the semiconductor light-emitting device according to the present embodiment will be described with reference to FIG. 1A to FIG. 4. FIG. 1A and FIG. 1B are a perspective view and a top view, respectively, each of which illustrates the overall configuration of semiconductor light-emitting device 10 according to the present embodiment. FIG. 2 is a perspective view schematically illustrating the configuration of the inside of cap unit 50 of semiconductor light-emitting device 10 according to the present embodiment. In FIG. 2, semiconductor light-emitting device 10 with a portion of cap unit 50 removed is illustrated. FIG. 3A is an exploded perspective view schematically illustrating the overall configuration of semiconductor light-emitting device 10 according to the present embodiment. FIG. 3B is an equivalent circuit illustrating the circuit configuration of semiconductor light-emitting device 10 according to the present embodiment. FIG. 4 is cross-sectional view schematically illustrating the overall configuration of semiconductor light-emitting device 10 according to the present embodiment. FIG. 4 illustrates semiconductor light-emitting device 10 in cross section taken along line IV-IV indicated in FIG. 1B.

Semiconductor light-emitting device 10 according to the present embodiment is a device that emits light, and includes wiring substrate 20, semiconductor light-emitting element 41, and cap unit 50, as illustrated in FIG. 3A. According to the present embodiment, semiconductor light-emitting device 10 further includes submount 45, temperature sensing element 60, connector 70, and bonding materials 26, 42, 55 and 62, as illustrated in FIG. 4. The following describes each of the structural components of semiconductor light-emitting device 10.

1-1-1. Wiring Substrate

Wiring substrate 20 is a plate-like component which serves as a base of semiconductor light-emitting device 10, and is provided with wiring. Upper surface 20*a* of wiring substrate 20 is a component mounting surface. A lower surface facing away from upper surface 20*a* (i.e., the surface located on the back side of upper surface 20*a*) is heat-dissipating surface 20*b*. As illustrated in FIG. 4, wiring substrate 20 includes metal substrate 28, first insulating layer 21, second insulating layer 22, spacer layers 30*a* and 30*b*, third metal layer 33, fourth metal layer 34, and protection films 25 and 35. In addition, wiring substrate 20 further includes first metal layer 31, second metal layer 32, first pad electrode 31*p*, and second pad electrode 32*p*, as illustrated in FIG. 2 and FIG. 3A. It should be noted that, in FIG. 1A, FIG. 1B, FIG. 2, and FIG. 3A, first metal layer 31, second metal layer 32, third metal layer 33, fourth metal layer 34, and each of the spacer layers are covered by second insulating layer 22, and thus do not appear on the surface. However, a portion of second insulating layer 22 located above each of the above-described layers protrudes upward, and thus the position of an end edge of each of the above-described layers is indicated as the position of a step in second insulating layer 22. In addition, since each of the above-described layers is covered by second insulating layer 22, dashed pull-out lines are added to reference numerals indicating these metal layers. The same holds true for each of the metal layers and each of the spacer layers illustrated in the top views and perspective views that will be described below.

According to the present embodiment, wiring substrate 20 includes through-holes 28*a* and 28*b* and positioning holes 29*a* and 29*b*. Through-holes 28*a* and 28*b* are holes for inserting a fixing component such as a screw when fixing wiring substrate 20 to closely adhere to a heat sink or the like. Through-holes 28*a* and 28*b* are located on one side and the other side of wiring substrate 20, respectively, relative to the region in which semiconductor light-emitting element 41 is disposed. It should be noted that, in the following description, the upward direction and the downward direction of FIG. 1B are referred to as one and the other, respectively. In other words, semiconductor light-emitting element 41 is disposed between through-hole 28*a* and through-hole 28*b*.

Positioning holes 29*a* and 29*b* are holes for positioning wiring substrate 20 to a heat sink or the like when fixing wiring substrate 20 to the heat sink or the like. For example, positioning pins provided on a heat sink or the like at the positions where positioning holes 29*a* and 29*b* are to be arranged are fitted into positioning holes 29*a* and 29*b*, respectively. This allows positioning wiring substrate 20 at a predetermined position of a heat sink or the like. According to the present embodiment, positioning hole 29*a* is a first positioning hole and has a circular shape in a top view of wiring substrate 20. Positioning hole 29*b* is a second positioning hole and has a long hole shape (i.e., an ellipse shape) in the top view of wiring substrate 20.

Metal substrate 28 is an example of a first substrate that wiring substrate 20 includes. Metal substrate 28 comprises a flat plate of metal such as oxygen-free copper or copper alloy. Here, the flat plate is a plate which does not have a patterned unevenness shape with a depth or height greater than the surface roughness on the surface other than the peripheral portion. Since the upper surface of metal substrate 28 is flat, first insulating layer 21 which is flat can be formed above metal substrate 28. This facilitates the formation of a thick metal layer above first insulating layer 21. Metal substrate 28 is, for example, a flat plate that comprises oxygen-free copper having a thickness of approximately greater than or equal to 0.5 mm and less than or equal to 3 mm. The shape of metal substrate 28 (i.e., shape in top view) is, for example, rectangular, and the length of one side of metal substrate 28 is, for example, approximately greater than or equal to 5 mm and less than or equal to 30 mm. According to the present embodiment, slanted cut surface 28*c* which is a slanted surface that is slanted with respect to the main surface of metal substrate 28 is formed at the edge of metal substrate 28. First insulating layer 21 is formed above the upper surface of metal substrate 28, and no insulating layer is formed above the lower surface of metal substrate 28 (i.e., the surface located on the back side of the upper surface). Accordingly, the entire area of the lower surface of metal substrate 28 can be used as heat-dissipating surface 20*b* of wiring substrate 20, and thus it is possible to dissipate heat over a large area. As a result, it is possible to use semiconductor light-emitting element 41 which is high in optical output and large in the amount of heat generation.

First insulating layer 21 is an insulating layer that is disposed above the upper surface of metal substrate 28, as illustrated in FIG. 4. First insulating layer 21 comprises an insulating material such as epoxy glass or ceramic, for example, having a thickness approximately greater than or equal to 0.05 mm and less than or equal to 0.3 mm.

First insulating layer 21 includes opening 21*a* as illustrated in FIG. 2, FIG. 3A, and FIG. 4. According to the present embodiment, a portion of first insulating layer 21 is removed to form opening 21*a* having a rectangular shape. Opening 21*a* is located to be closer to the edge than the center of metal substrate 28 is in a top view. In the region corresponding to opening 21*a* in metal substrate 28, protection film 25 that comprises Ni, Au, or the like is formed as illustrated in FIG. 4, to form a mounting surface for mounting semiconductor light-emitting element 41. According to the present embodiment, semiconductor light-emitting element 41 is disposed in opening 21*a* via submount 45.

First metal layer 31, second metal layer 32, third metal layer 33, and fourth metal layer 34 are metal layers that are spaced apart from each other above the first substrate, and are disposed above first insulating layer 21 according to the presented embodiment. First metal layer 31 and second metal layer 32 are wiring for supplying power to semiconductor light-emitting element 41. Third metal layer 33 and fourth metal layer 34 are wiring connected to temperature sensing element 60. Each of the metal layers forms protrusion above first insulating layer 21. First metal layer 31, second metal layer 32, third metal layer 33, and fourth metal layer 34 are metal layers comprising copper, for example, having a thickness approximately greater than or equal to 0.02 mm and less than or equal to 0.15 mm.

Spacer layers 30*a* and 30*b* are layers disposed at positions different from the positions of first metal layer 31 and second metal layer and 32 above the first substrate, and disposed above first insulating layer 21 according to the present embodiment. Spacer layers 30*a* and 30*b* are disposed between first insulating layer 21 and bonding surface 50*b* of cap unit 50 with wiring substrate 20 as illustrated in FIG. 4. Spacer layers 30*a* and 30*b* each form a protrusion above first insulating layer 21 in the same manner as each of the metal layers.

Figure 5:
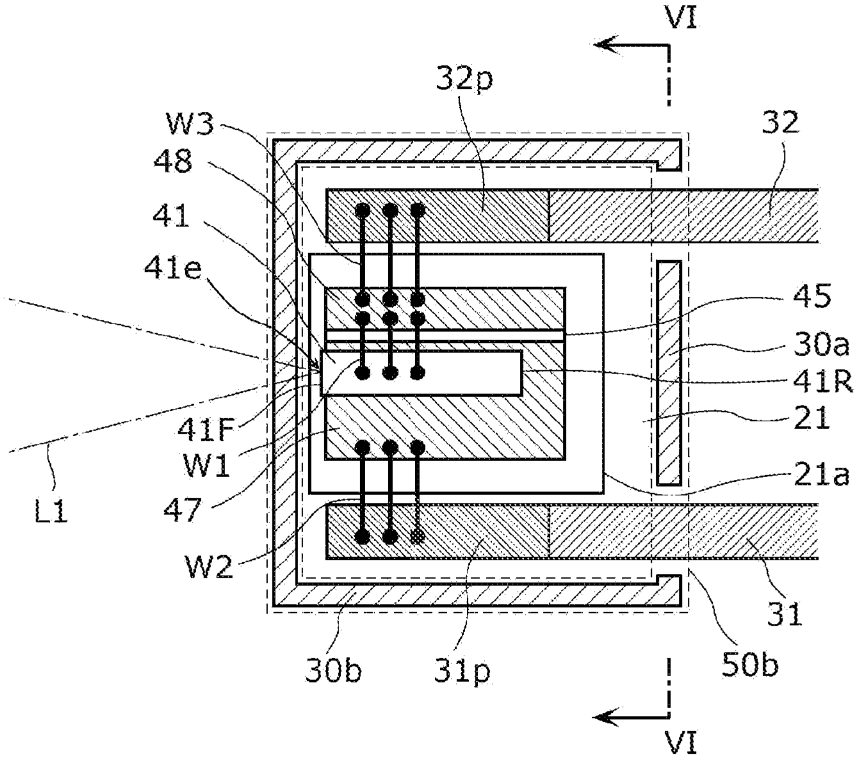
FIG. 5 is a top view schematically illustrating the positional relationship between (i) a bonding surface of the cap unit and (ii) a semiconductor light-emitting element, each of metal layers, and each of spacer layers, of the semiconductor light-emitting device according to Embodiment 1.

According to the present embodiment, spacer layers 30*a* and 30*b* are disposed only between bonding surface 50*b* and the first substrate above the first substrate. As illustrated in FIG. 5, bonding surface 50*b* has a loop shape surrounding semiconductor light-emitting element 41 in a top view of wiring substrate 20. More specifically, bonding surface 50*b* has a rectangular loop shape. Spacer layers 30*a* and 30*b* are disposed along bonding surface 50*b* and surround semiconductor light-emitting element 41 in the top view of wiring substrate 20. It should be noted that the meaning of the description that a certain component surrounds semiconductor light-emitting element 41 includes not only the state in which the certain component is continuously disposed in the entire area surrounding semiconductor light emitting element 41, but also the state in which the certain component is disposed in a large portion of the area surrounding semiconductor light-emitting element 41. For example, the state in which a certain component surrounds semiconductor light-emitting element 41 is defined as a state in which the certain component is disposed in at least 80% of the area surrounding semiconductor light-emitting element 41.

According to the present embodiment, spacer layer 30*a* is disposed linearly along bonding surface 50*b* that has a loop shape in the top view of wiring substrate 20. Spacer layer 30*b* is disposed in a C-shape along bonding surface 50*b* that has a loop shape in the top view of the wiring substrate 20. The materials that spacer layers 30*a* and 30*b* comprise are not particularly limited. According to the present embodiment, spacer layers 30*a* and 30*b* comprise a metal material. Spacer layers 30*a* and 30*b* are metal layers that comprise copper having a thickness approximately greater than or equal to 0.02 mm and less than or equal to 0.15 mm, as with first metal layer 31, for example.

Second insulating layer 22 is an insulating layer disposed above first insulating layer 21. Second insulating layer 22 covers at least a portion of first metal layer 31, second metal layer 32, third metal layer 33, fourth metal layer 34, and spacer layers 30*a* and 30*b*, and also has a function of protecting each of the layers. Second insulating layer 22 is an insulating layer that comprises, for example, resin such as polyimide, epoxy, or the like having a thickness approximately greater than or equal to 0.05 mm and less than or equal to 0.2 mm.

Protection film 25 is a metal film disposed, for example, at a position at which submount 45, etc. are bonded in wiring substrate 20. According to the present embodiment, protection film 25 is disposed in a region of metal substrate 28 corresponding to opening 21*a* of first insulating layer 21. Protection film 35 is a metal film disposed above a surface where a metal layer such as first metal layer 31 is exposed from second insulating layer 22. Protection film 35 is disposed above a portion of the upper surface of first metal layer 31, second metal layer 32, third metal layer 33, and fourth metal layer 34, etc. Protection films 25 and 35 also serve as anti-corrosion films that protect the exposed surfaces or the like of metal substrate 28, first metal layer 31, etc., from oxidation and the like. Protection films 25 and 35 comprise Ni, Au, or the like, for example.

First pad electrode 31*p* and second pad electrode 32*p* are pad-shaped electrodes disposed above the portions of first metal layer 31 and second metal layer 32, respectively, which are adjacent to semiconductor light-emitting element 41. As illustrated in FIG. 2 and FIG. 3A, metal wires W2 and W3 are bonded to first pad electrode 31*p* and second pad electrode 32*p*, respectively. According to the present embodiment, first pad electrode 31*p* and second pad electrode 32*p* are also part of protection film 35 and comprise, for example, Ni, Au, or the like.

1-1-2. Semiconductor Light-Emitting Element

Semiconductor light-emitting element 41 is a light-emitting element disposed above upper surface 20*a* of wiring substrate 20. Semiconductor light-emitting element 41 is disposed in opening 21*a* of first insulating layer 21. Semiconductor light-emitting element 41 is a light-emitting element including a compound semiconductor such as gallium nitride or gallium arsenide, for example. According to the present embodiment, semiconductor light-emitting element 41 is a semiconductor laser element including an optical waveguide that extends in a direction parallel to the main surface of metal substrate 28.

As illustrated in FIG. 4, semiconductor light-emitting element 41 is mounted above submount 45. Semiconductor light-emitting element 41 includes a substrate and a semiconductor layered structure that is layered above the substrate. The optical waveguide is formed in the semiconductor layered structure. According to the present embodiment, the semiconductor layered structure of semiconductor light-emitting element 41 is located to face submount 45. In other words, semiconductor light-emitting element 41 is junction-down mounted to submount 45. An electrode (not illustrated) is formed on each of the upper surface (i.e., the surface on the upper side of semiconductor light-emitting element 41 in FIG. 4) and the lower surface (i.e., the surface on the lower side of semiconductor light-emitting element 41 in FIG. 4). The lower surface of semiconductor light-emitting element 41 faces the upper surface of submount 45. As illustrated in FIG. 5, the electrode formed on the lower surface, which faces submount 45, of semiconductor light-emitting element 41 is electrically connected to first electrode 47 formed on the upper surface of submount 45. More specifically, the electrode formed on the lower surface of semiconductor light-emitting element 41 is electrically connected to first electrode 47 formed on the upper surface of submount 45 via bonding material 42 (see FIG. 4) that comprises AuSn solder or the like. The electrode formed on the upper surface of semiconductor light-emitting element 41 is electrically connected to second electrode 48 formed on the upper surface of submount 45 via metal wire W1. First electrode 47 and second electrode 48 that are formed on the upper surface of submount 45 are electrically connected to first pad electrode 31*p* and second pad electrode 32*p*, respectively, via metal wires W2 and W3. With the above-described configuration, it is possible to supply current to semiconductor light-emitting element 41 using first metal layer 31 and second metal layer 32 which are connected to first pad electrode 31*p* and second pad electrode 32*p*, respectively.

As illustrated in FIG. 4, semiconductor light-emitting element 41 includes light-emitting point 41*e* where emitted light L1 is emitted. According to the present embodiment, emitted light L1 is laser light. Emitted light L1 is laser light having a peak wavelength within a range of from, for example, at least 270 nm to at most 600 nm when semiconductor light-emitting element 41 includes a gallium nitride-based compound semiconductor, and having a peak wavelength within a range of from, for example, at least 600 nm to at most 10.4 μm when semiconductor light-emitting element 41 includes a gallium indium phosphide-based compound semiconductor or a gallium arsine-based compound semiconductor. Light-emitting point 41*e* is an end portion, which is located on the left side of FIG. 4, of the optical waveguide included in semiconductor light-emitting element 41. Semiconductor light-emitting element 41 is disposed such that the emission surface which is an end surface on which light-emitting point 41*e* is located protrudes from an end surface of submount 45 (the left side end surface of submount 45 illustrated in FIG. 4). With this configuration, it is possible to inhibit emitted light L1 that has been emitted from light-emitting point 41*e* from being blocked by submount 45.

Semiconductor light-emitting element 41 has, for example, a rectangular parallelepiped shape with a width approximately greater than or equal to 0.2 mm and less than or equal to 2 mm, a length approximately greater than or equal to 1 mm and less than or equal to 9 mm, and a thickness approximately greater than or equal to 0.08 mm and less than or equal to 0.2 mm.

1-1-3. Submount

Submount 45 is a component disposed between wiring substrate 20 and semiconductor light-emitting element 41. Submount 45 is mounted above upper surface 20*a* of wiring substrate 20. More specifically, as illustrated in FIG. 4, submount 45 is disposed inside opening 21*a* of first insulating layer 21, and mounted above metal substrate 28 via bonding material 26 and protection film 25. Bonding material 26 comprises, for example, AuSn solder, or the like. Semiconductor light-emitting element 41 is mounted above the upper surface of submount 45. According to the present embodiment, submount 45 includes an insulating block that is a rectangular parallelepiped block comprising an insulating material, first electrode 47 and second electrode 48 each of which is a metal film disposed on the upper surface of the insulating block, and a metal film (not illustrated) disposed on the lower surface of the insulating block. The insulating block comprises an insulating material which is high in thermal conductivity, such as AlN, SiC, diamond, etc. The insulating block has, for example, a rectangular parallelepiped shape with a width approximately greater than or equal to 1 mm and less than or equal to 5 mm, a length approximately greater than or equal to 2 mm and less than or equal to 10 mm, and a thickness approximately greater than or equal to 0.2 mm and less than or equal to 4 mm. First electrode 47 and second electrode 48 are spaced apart from each other and electrically insulated. In addition, first electrode 47 and second electrode 48 are electrically insulated from the metal film disposed on the lower surface of the insulating block. The metal films disposed on the lower surfaces of first electrode 47, second electrode 48, and insulating block are metal films that comprise Ni, Cu, Ti, Pt, Au, or the like.

In semiconductor light-emitting device 10 according to the present embodiment, semiconductor light-emitting element 41 is mounted above metal substrate 28 via submount 45 as described above. With such a configuration as described above, it is possible to efficiently dissipate the heat generated in semiconductor light-emitting element 41 through submount 45 to metal substrate 28, as indicated by the arrows in FIG. 4. The lower surface of metal substrate 28 is, for example, adhered closely to a heat sink which is not illustrated. With this configuration, it is possible to efficiently conduct the heat generated in semiconductor light-emitting element 41 from metal substrate 28 to the heat sink. In addition, since metal substrate 28 according to the present embodiment is a flat plate, it is easy to manufacture and it is also possible to reduce the cost. Accordingly, it is possible to implement semiconductor light-emitting device 10 that has a simplified configuration and is manufacturable at low cost.

1-1-4. Cap Unit

Cap unit 50 is a cover component that is disposed above upper surface 20*a* of wiring substrate 20 and covers semiconductor light-emitting element 41 as illustrated in FIG. 1A, FIG. 1B, FIG. 2, and FIG. 4. Cap unit 50 includes bonding surface 50*b* that faces wiring substrate 20 as illustrated in FIG. 4. Bonding surface 50*b* has a loop shape, and bonding surface 50*b* and upper surface 20*a* of wiring substrate 20 are bonded by bonding material 55 comprising an epoxy adhesive, a silicon adhesive, AuSn solder, or the like. In this manner, it is possible to seal the gap between cap unit 50 and wiring substrate 20. According to the present embodiment, as illustrated in FIG. 2, cap unit 50 covers opening 21*a* of first insulating layer 21, semiconductor light-emitting element 41 and submount 45 disposed in opening 21*a*, first pad electrode 31*p* and second pad electrode 32*p*, and a portion of each of first metal layer 31 and second metal layer 32. Cap unit 50 includes top plate 52*d* having a rectangular shape (see FIG. 4) and four side walls 51, 52*a*, 52*b*, and 52*c* each connected to a corresponding one of the four sides of the peripheral edge of top plate 52*d* (see FIG. 2). According to the present embodiment, side wall 51 among the four side walls 51, 52*a*, 52*b*, and 52*c* is a light-transmissive window, and includes inorganic light-transmissive plate 51*a* and antireflection films 51*b* and 51*c* provided to inorganic light-transmissive plate 51*a*. According to the present embodiment, side wall 51 includes antireflection films 51*b* and 51*c* disposed on the respective main surfaces of inorganic light-transmissive plate 51*a*. Antireflection film 51*b* is disposed on one of the main surfaces of inorganic light-transmissive plate 51*a* that faces semiconductor light-emitting element 41, and antireflection film 51*c* is disposed on the other of the main surfaces located on the back side of the one of the main surfaces. The three side walls 52*a*, 52*b*, and 52*c* and top plate 52*d* are integrally formed to be holder 52. Side wall 51 is disposed at a location facing light-emitting point 41*e* of semiconductor light-emitting element 41. With this configuration, emitted light L1 from semiconductor light-emitting element 41 passes through side wall 51 that is the light-transmissive window.

Holder 52 comprises glass, for example. Holder 52 is manufactured by, for example, forming a recess in a glass block having a rectangular parallelepiped shape, by sandblasting or the like, and dividing it.

Side wall 51 which is a light-transmissive window and holder 52 are bonded by optical contact or laser bonding to form a cap unit having a box shape.

As a result of cap unit 50 having the configuration described above, emitted light L1 from the semiconductor light-emitting element can be easily extracted from side wall 51 of cap unit 50 to the outside.

Thickness Dg of side wall 51 which is a light-transmissive window illustrated in FIG. 4 is approximately greater than or equal to 0.01 mm and less than or equal to 0.2 mm. In addition, gap Dgap between side wall 51 which is a light-transmissive window and the emission surface of semiconductor light-emitting element 41 (i.e., the end surface including light-emitting point 41*e*) is greater than zero and less than thickness Dg of side wall 51. With this configuration, it is possible to reduce the distance (Dg+Dgap) from light-emitting point 41*e* of semiconductor light-emitting element 41 to the outside of cap unit 50. As a result, it is possible to reduce beam cross-sectional area $S_{L1}$ of emitted light L1 at the outer surface of cap unit 50. For example, when emitted light L1 is incident on an optical element such as a lens located outside cap unit 50, it is possible to reduce the dimensions of the optical element by reducing beam cross-sectional area $S_{L1}$ of emitted light L1, allowing the optical element to easily couple emitted light L1.

The thickness of each of side walls 52*a*, 52*b*, and 52*c* is greater than the thickness of side wall 51 which is the light-transmissive window. With this configuration, it is possible to increase the structural strength of the holder and cap unit 50 while reducing the distance (Dg+Dgap) from light-emitting point 41*e* of semiconductor light-emitting element 41 to the outside of cap unit 50.

1-1-5. Functional Element

Semiconductor light-emitting device 10 may include a functional element other than semiconductor light-emitting element 41. According to the present embodiment, semiconductor light-emitting device 10 includes temperature sensing element 60 as one example of the functional element. The following describes temperature sensing element 60 that is one example of the functional element. Temperature sensing element 60 is a temperature sensor that is disposed above wiring substrate 20. As illustrated in FIG. 4, temperature sensing element 60 is electrically connected to third metal layer 33 and fourth metal layer 34 via bonding material 62 and protection film 35. Protection film 35 is also a pad electrode disposed above third metal layer 33 and fourth metal layer 34. Temperature sensing element 60 is mounted on the surface of wiring substrate 20 by means of bonding material 62 which is, for example, SnAgCu cream solder or the like. The temperature of wiring substrate 20 can be sensed by temperature sensing element 60. It is possible to estimate the temperature of semiconductor light-emitting element 41 mounted above wiring substrate 20 via submount 45, by sensing the temperature of wiring substrate 20. Accordingly, it is possible to estimate the temperature of semiconductor light-emitting element 41 by temperature sensing element 60 and use the temperature for controlling semiconductor light-emitting element 41. For example, when temperature sensing element 60 has detected that the temperature of semiconductor light-emitting element 41 is higher than a predetermined threshold, it is possible to reduce or stop the current supplied to semiconductor light-emitting element 41. As temperature sensing element 60, for example, a thermistor cab be used. In this case, the resistance value of temperature sensing element 60 is detected by applying a predetermined voltage to temperature sensing element 60 and detecting the current flowing through temperature sensing element 60. The temperature of wiring substrate 20 can be detected from the correlation between the resistance value and the temperature. A voltage is applied to temperature sensing element 60 via third metal layer 33 and fourth metal layer 34. According to the present embodiment, temperature sensing element 60 is disposed outside cap unit 50. With this configuration, it is possible to reduce the size of cap unit 50. As a result, it is possible to easily seal the gap between cap unit 50 and wiring substrate 20.

1-1-6. Connector

Connector 70 is a connecting component including terminals each of which is connected to a corresponding one of first metal layer 31 and second metal layer 32. Connector 70 connects wiring substrate 20 to external electric circuit (not illustrated). According to the present embodiment, connector 70 is a receptacle further including terminals each of which is connected to a corresponding one of third metal layer 33 and fourth metal layer 34, as illustrated in FIG. 3B, etc. Pad electrodes 31*q*, 32*q*, 33*q*, and 34*q* each comprising protection film 35 are formed on first metal layer 31, second metal layer 32, third metal layer 33, and fourth metal layer 34, respectively, at end portions on the side that is away from a portion where semiconductor light-emitting element 41 is disposed, and are connected to connector 70. Connector 70 is mounted above the surface of wiring substrate 20 by means of bonding material (not illustrated) such as SnAgCu cream solder or the like, and connected to pad electrodes 31*q*, 32*q*, 33*q*, and 34*q*.

1-2. Functions and Advantageous Effects

Figure 6A:
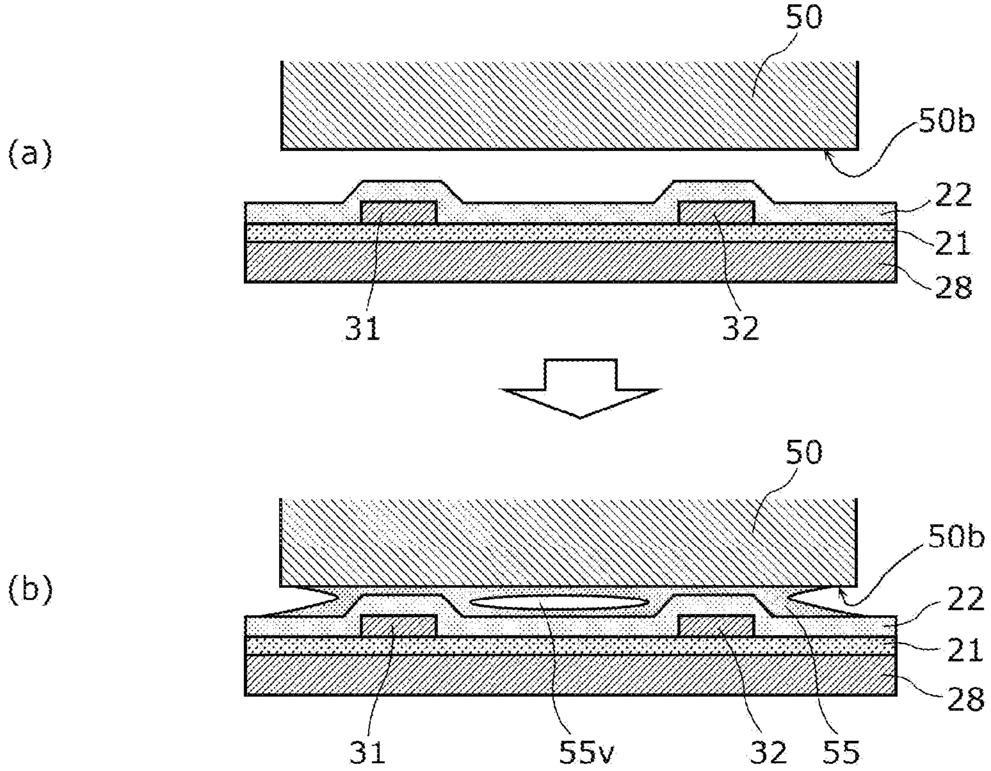
FIG. 6A is a cross-sectional view schematically illustrating the state of bonding between a wiring substrate and a cap unit according to a comparison example.
Figure 6B:
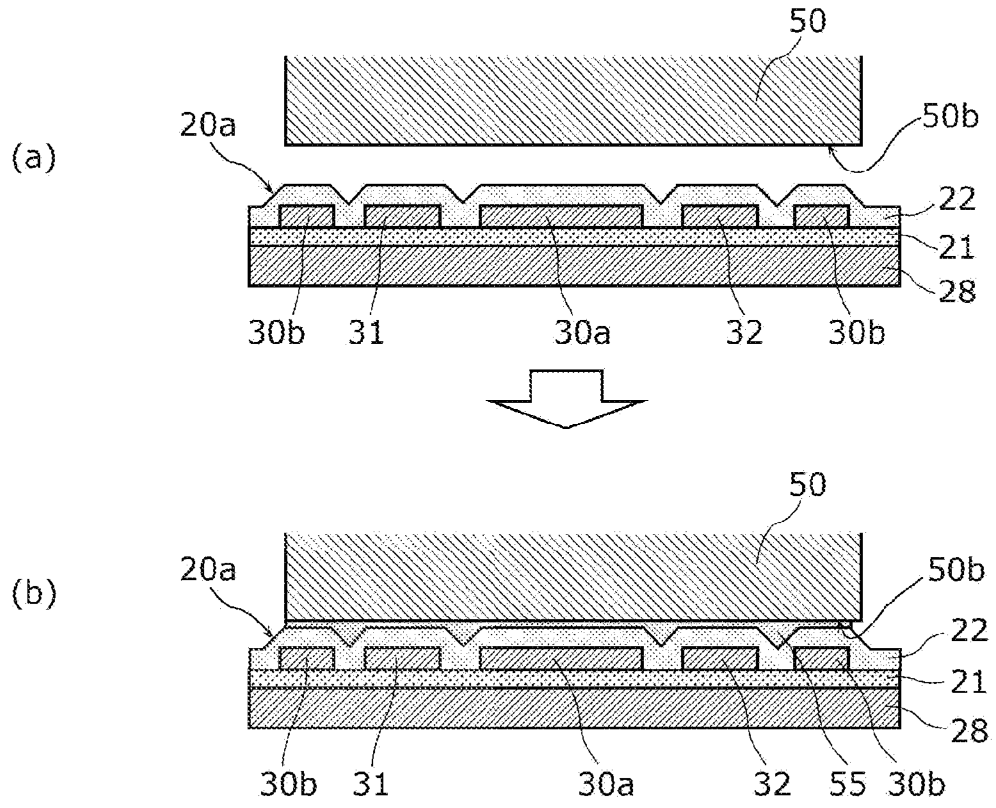
FIG. 6B is a cross-sectional view schematically illustrating the state of bonding between a wiring substrate and the cap unit according to Embodiment 1.

Next, the functions and advantageous effects of semiconductor light-emitting device 10 according to the present embodiment will be described with reference to the above-described FIG. 4 and FIG. 5 to FIG. 6B. FIG. 5 is a top view schematically illustrating the positional relationship between (i) bonding surface 50*b* of cap unit 50 and (ii) semiconductor light-emitting element 41, each of the metal layers, and each of the spacer layers of semiconductor light-emitting device 10 according to the present embodiment. FIG. 5 illustrates the configuration of semiconductor light-emitting element 41 and the surroundings of semiconductor light-emitting device 10 in a state in which cap unit 50 and second insulating layer 22 are removed. In addition, in FIG. 5, the position of the end edge of bonding surface 50*b* of cap unit 50 is indicated by the dashed lines. FIG. 6A and FIG. 6B are cross-sectional views schematically illustrating the bonding states between the respective wiring substrates and cap unit 50 according to a comparison example and the present embodiment. FIG. 6B illustrates wiring substrate 20, etc. at the cross-section surface of line VI-VI of FIG. 5. FIG. 6A illustrates a cross-section of a wiring substrate and cap unit 50 of the comparison example at the same position as FIG. 6B. Cross-sectional view (a) of each of FIG. 6A and FIG. 6B indicates the cross-sectional view before cap unit 50 and the wiring substrates are bonded, and cross-sectional view (b) of each of FIG. 6A and FIG. 6B indicates the cross-sectional view after they are bonded.

As illustrated in FIG. 5, first pad electrode 31*p*, second pad electrode 32*p*, first metal layer 31, and second metal layer 32 extend in the optical axis direction of semiconductor light-emitting element 41 (i.e., the direction in which the optical waveguide extends, or stated further differently, the direction of resonance). First pad electrode 31*p* and first metal layer 31 are arranged in the optical axis direction and connected to each other. Second pad electrode 32*p* and second metal layer 32 are arranged in the optical axis direction and connected to each other. First pad electrode 31*p* and second pad electrode 32*p* are arranged in a lateral direction (i.e., the vertical direction of FIG. 5; that is, the direction perpendicular to the optical axis direction and parallel to the main surface of wiring substrate 20), and semiconductor light-emitting element 41 (and opening 21*a*) is disposed between first pad electrode 31*p* and second pad electrode 32*p*. In addition, first metal layer 31 and second metal layer 32 are arranged in the lateral direction, and semiconductor light-emitting element 41 (and opening 21*a*) is disposed between first metal layer 31 and second metal layer 32.

First metal layer 31 and second metal layer 32 extend from the inside of cap unit 50 toward the rearward of semiconductor light-emitting element 41 (i.e., in the direction opposite to the direction of propagation of emitted light L1) to the outside of cap unit 50. Accordingly, bonding surface 50*b* of cap unit 50 which is bonded to wiring substrate 20 intersects first metal layer 31 and second metal layer 32 in the top view of wiring substrate 20. Hereinafter, the side toward which emitted light L1 propagates with respect to semiconductor light-emitting element 41 is also referred to as forward, and the opposite direction of forward is also referred to as rearward. It should be noted that the portion of first metal layer 31 where first pad electrode 31*p* and pad electrode 31*q* are not provided is covered by second insulating layer 22. The portion of second metal layer 32 where second pad electrode 32*p* and pad electrode 32*q* are not provided is covered by second insulating layer 22.

In addition, as illustrated in FIG. 4 and FIG. 5, spacer layers 30*a* and 30*b* are disposed between bonding surface 50*b* and first insulating layer 21. Spacer layer 30*a* is disposed at a position rearward from rear end surface 41R of semiconductor light-emitting element 41 on the side opposite to emission surface 41F including light-emitting point 41*e* in the optical axis direction. Spacer layer 30*a* extends in the lateral direction between first metal layer 31 and second metal layer 32. Spacer layer 30*b* is composed of five portions.

The first portion of spacer layer 30*b* is disposed at a position rearward from rear end surface 41R in the optical axis direction. The first portion of spacer layer 30*b* is disposed further from semiconductor light-emitting element 41 than first metal layer 31 is in the lateral direction. In other words, first metal layer 31 is disposed between the first portion of spacer layer 30*b* and semiconductor light-emitting element 41 in the lateral direction. In addition, first metal layer 31 is disposed between the first portion of spacer layer 30*b* and spacer layer 30*a*. The first portion of spacer layer 30*b* extends in the lateral direction.

The second portion of spacer layer 30*b* is disposed further from semiconductor light-emitting element 41 than first pad electrode 31*p* and first metal layer 31 are in the lateral direction. In other words, first pad electrode 31*p* and first metal layer 31 are disposed between the second portion of spacer layer 30*b* and semiconductor light-emitting element 41 in the lateral direction. The second portion of spacer layer 30*b* is connected to the first portion and extends in the optical axis direction.

The third portion of spacer layer 30*b* is disposed at a position forward from emission surface 41F. The third portion of spacer layer 30*b* is connected to the second portion and extends in the lateral direction.

The fourth portion of spacer layer 30*b* is disposed further from semiconductor light-emitting element 41 than second pad electrode 32*p* and second metal layer 32 are in the lateral direction. In other words, second pad electrode 32*p* and second metal layer 32 are disposed between the fourth portion of spacer layer 30*b* and semiconductor light-emitting element 41 in the lateral direction. The fourth portion of spacer layer 30*b* is connected to the third portion and extends in the optical axis direction.

The fifth portion of spacer layer 30*b* is disposed at a position rearward from rear end surface 41R in the optical axis direction. The fifth portion of spacer layer 30*b* is disposed further from semiconductor light-emitting element 41 than second metal layer 32 is in the lateral direction. In other words, second metal layer 32 is disposed between the fifth portion of spacer layer 30*b* and semiconductor light-emitting element 41 in the lateral direction. In addition, first metal layer 31 is disposed between the fifth portion of spacer layer 30*b* and spacer layer 30*a*. The fifth portion of spacer layer 30*b* is connected to the fourth portion and extends in the lateral direction.

The advantageous effects resulting from this configuration will be described with reference to FIG. 6A and FIG. 6B. The wiring substrate of the comparison example illustrated in FIG. 6A is a wiring substrate resulting from removing spacer layers 30*a* and 30*b* from wiring substrate 20 according to the present embodiment.

First metal layer 31 and second metal layer 32 according to the comparison example and the present embodiment have a large cross-sectional area such that a large amount of current can be supplied to semiconductor light-emitting element 41. For this reason, the thickness of first metal layer 31 and second metal layer 32 is approximately greater than or equal to 0.02 mm and less than or equal to 0.15 mm. Second insulating layer 22 above each of the metal layers as described above is formed by applying and curing a liquid insulating material on first metal layer 31 and second metal layer 32, and has a thickness approximately greater than or equal to 0.02 mm and less than or equal to 0.1 mm. Accordingly, the upper surface of second insulating layer 22 has an uneven shape along the upper surface of first insulating layer 21 and each of the metal layers, as illustrated in cross-sectional view (a) of FIG. 6A. In other words, on the upper surface of the wiring substrate, in the region between first metal layer 31 and second metal layer 32, a recess of approximately the same depth as the thickness of first metal layer 31 and second metal layer 32 is formed.

When a wiring substrate of the comparison example in which a spacer is not disposed as illustrated in FIG. 6A is used, a large gap is formed between the recess of the upper surface of the wiring substrate and cap unit 50. In view of the above, in order to fill the gap between the wiring substrate and the cap unit with a bonding material, a method is conceivable in which the bonding material is applied to the wiring substrate to be in a predetermined thickness, and the bonding material is pressed and crushed by the cap unit to fill the gap. In this case, a large amount of bonding material is used to form in advance a bonding material layer that is sufficiently thicker than the height of the unevenness on the surface of the wiring substrate, along the position of bonding surface 50*b*. Accordingly, when the bonding material layer is pressed and crushed, an unnecessary bonding material can protrude from the bonding surface between the wiring substrate and the cap unit, and spread over the wiring substrate toward opening 21*a* and connector 70. This causes the functions of the functional components disposed inside and outside the cap unit to be changed. In particular, when the bonding material spreads toward through-holes 28*a* and 28*b* and positioning holes 29*a* and 29*b*, the shapes of the holes may change in some cases. In addition, when the bonding material spreads from the bonding surface facing light-emitting point 41*e* toward semiconductor light-emitting element 41, there is a possibility that the properties of emitted light L1 change significantly. When the distance between the bonding surface and the functional component is increased so as to reduce the effect of the bonding material that protrudes, it becomes difficult to reduce the size of the semiconductor light-emitting device. When wiring substrate 20 and cap unit 50 are to be bonded with a small amount of bonding material, gap 55*v* where no bonding material 55 is present is formed between the upper surface of the wiring substrate and bonding surface 50*b* of cap unit 50, as illustrated in cross-sectional view (b) of FIG. 6A. As such, when the wiring substrate of the comparison example is used, it is not possible to seal the gap between the upper surface of the wiring substrate and bonding surface 50*b* of cap unit 50.

On the other hand, with wiring substrate 20 according to the present embodiment, as illustrated in cross-sectional view (a) of FIG. 6B, spacer layers 30*a* and 30*b* are disposed between bonding surface 50*b* and first insulating layer 21, at positions different from the positions at which first metal layer 31 and second metal layer 32 are disposed. Since such spacer layers 30*a* and 30*b* are disposed between first metal layer 31 and second metal layer 32, etc., it is possible to reduce width and depth of the recess, in the direction parallel to the main surface of metal substrate 28, formed in upper surface 20*a* of wiring substrate 20 between first metal layer 31 and second metal layer 32. As a result, as illustrated in cross-sectional view (b) of FIG. 6B, it is possible to fill the recess in upper surface 20*a* of wiring substrate 20 with a small amount of bonding material 55. For this reason, it is possible to seal the gap between upper surface 20*a* of wiring substrate 20 and bonding surface 50*b* of cap unit 50 with a small amount of bonding material. It thus is possible to inhibit foreign matter, etc. from entering cap unit 50 and inhibit the bonding material from affecting the functional components located in proximity to the bonding surface. In other words, semiconductor light-emitting device 10 with high reliability can be implemented. In addition, since first metal layer 31 and second metal layer 32 each having a large cross-sectional area are used, a large amount of current can be applied to semiconductor light-emitting device 10 to achieve an increase in optical output.

In addition, according to the present embodiment, as illustrated in FIG. 5, spacer layers 30*a* and 30*b* are disposed along a portion of bonding surface 50*b* between the portion of bonding surface 50*b* facing first metal layer 31 and the portion of bonding surface 50*b* facing second metal layer 32. With this configuration, it is possible to increase the portion where any of the metal layers or the spacer layers are disposed between bonding surface 50*b* and wiring substrate 20. As a result, it is possible to reduce the possibility of formation of a gap between bonding surface 50*b* and wiring substrate 20. In addition, spacer layer 30*a* has a linear shape in a top view of wiring substrate 20, and is disposed along a portion of bonding surface 50*b* having a linear shape between the portion of bonding surface 50*b* above first metal layer 31 and the portion of bonding surface 50*b* above second metal layer 32. Spacer layer 30*b* has a C-shape in the top view of wiring substrate 20, and is disposed along a portion of bonding surface 50*b* having a C-shape between the portion of bonding surface 50*b* above first metal layer 31 and the portion of bonding surface 50*b* above second metal layer 32. With this configuration, it is possible to fill most of the space between bonding surface 50*b* and metal substrate 28 where first metal layer 31 and second metal layer 32 are not disposed, by spacer layers 30*a* and 30*b*. As a result, it is possible to further reduce the possibility of formation of a gap between bonding surface 50*b* and wiring substrate 20.

According to the present embodiment, the thicknesses of spacer layers 30*a* and 30*b* are equal to the thicknesses of first metal layer 31 and second metal layer 32. In addition, first metal layer 31, second metal layer 32, and spacer layers 30*a* and 30*b* are covered by second insulating layer 22 with the same thickness. With this configuration, it is possible to further flatten upper surface 20*a* of wiring substrate 20. As a result, it is possible to further reduce the possibility of formation of a gap between bonding surface 50*b* and wiring substrate 20. Furthermore, by covering each of the metal layers and each of the spacer layers with second insulating layer 22, it is possible to reduce the possibility of disconnection of each of the metal layers due to contact with an external object.

In addition, the distance (i.e., gap) between first metal layer 31 and each of spacer layers 30*a* and 30*b* is smaller than the width of first metal layer 31 (i.e., the dimension of first metal layer 31 in the direction perpendicular to the extending direction and thickness direction). In addition, the distance between second metal layer 32 and each of spacer layers 30*a* and 30*b* is smaller than the width of second metal layer 32. With this configuration, it is possible to further reduce the dimension of the recess formed in upper surface 20*a* of wiring substrate 20. In addition, the distance between spacer layer 30*a* and each of first metal layer 31 and second metal layer 32 may be made smaller than the width of spacer layer 30*a*. Moreover, the distance between spacer layer 30*b* and each of first metal layer 31 and second metal layer 32 may be made smaller than the width of spacer layer 30*b*. With this configuration, it is possible to further reduce the dimensions of the recess formed in upper surface 20*a* of wiring substrate 20. As a result, it is possible to further reduce the possibility of formation of a gap between bonding surface 50*b* and wiring substrate 20. It should be noted that, the distance between first metal layer 31 and each of spacer layers 30*a* and 30*b* may be greater than the width of first metal layer 31. In addition, the distance between second metal layer 32 and each of spacer layers 30*a* and 30*b* may be greater than the width of second metal layer 32. With this configuration, when spacer layers 30*a* and 30*b* comprise metal, it is possible to inhibit short circuit between first metal layer 31 and second metal layer.

Figure 7:
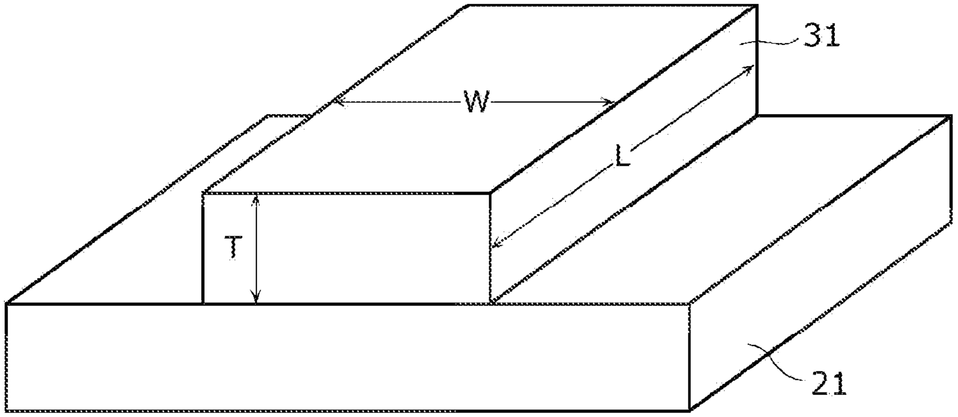
FIG. 7 is a schematic view illustrating each dimension of a first metal layer according to Embodiment 1.
Figure 8:
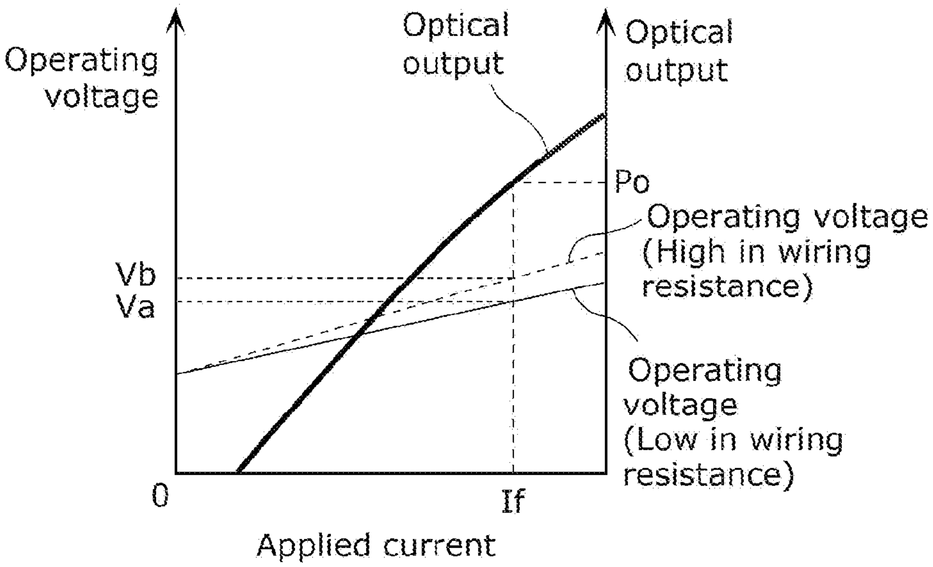
FIG. 8 is a graph indicating the relationship between the applied current, operating voltage, and optical output of the semiconductor light-emitting device according to Embodiment 1.

Next, a design example of each of the metal layers will be described with reference to FIG. 7 to FIG. 9. FIG. 7 is a schematic view illustrating each dimension of first metal layer 31 according to the present embodiment. FIG. 8 is a graph indicating the relationship between the applied current, operating voltage, and optical output of semiconductor light-emitting device 10 according to the present embodiment. FIG. 9 is a table indicating the design examples of the metal layer.

FIG. 7 illustrates a schematic view of first metal layer 31 as one example of each of the metal layers. As illustrated in FIG. 7, W denotes the width of the cross-section surface perpendicular to the extending direction of the metal layer, T denotes the thickness, and L denotes the length in the extending direction. In FIG. 7, first insulating layer 21 above which first metal layer 31 is disposed is also indicated. It should be noted that the dimensions of the other metal layers other than first metal layer 31 are defined in the same manner as first metal layer 31.

Electrical wiring comprising a metal layer has a slight (electrical) resistance. However, when power is supplied to semiconductor light-emitting element 41 that is high in optical output, even a slight resistance of the electrical wiring cannot be ignored because the amount of current that is supplied is large. For example, a current approximately greater than or equal to 1 ampere and less than or equal to 50 amperes, and a voltage approximately greater than or equal to 2 volts and less than or equal to 6 volts are applied to semiconductor light-emitting element 41 with a high optical output approximately greater than or equal to 1 watt and less than or equal to 100 watts. For example, when semiconductor light-emitting element 41 with an applied current of 2 amperes and an operating voltage of 2 volts is used, the voltage drop in the electrical wiring is 0.2 V, even when the wiring resistance is 0.1Ω. In other words, the operating voltage increases by 0.2V. For this reason, wiring resistance cannot be ignored as a factor that increases the operating voltage of semiconductor light-emitting device 10.

As illustrated in FIG. 8, for applied current If, the operating voltage is Va when the resistance of the electrical wiring is low (see the thin solid line in FIG. 8), whereas when the resistance of the electrical wiring is high, the operating voltage is Vb which is higher than Va (see the dashed lines in FIG. 8). When the resistance of the electrical wiring is high, the amount of heat generated in the electrical wiring is greater than in the case where the resistance is low. The decrease in the optical output of semiconductor light-emitting element 41 due to the increase in the amount of heat generated may be prevented by discharging heat by a heat sink or the like. However, the supplied power-to-optical conversion efficiency of semiconductor light-emitting device 10, namely, Wall-Plug-Efficiency, is Po/(Va·If) when the resistance of the electrical wiring is low, while it decreases to Po/(Vb·If) when the resistance of the electrical wiring is high. In particular, in a light source device or the like that uses a plurality of semiconductor light-emitting devices 10, the effect of the decrease in conversion efficiency on power consumption becomes more noticeable.

The following describes in detail a method of reducing the resistance of electric wiring that comprise a metal layer as described above.

According to the conventional techniques, ceramic and a metal layer are integrally sintered to form electrical wiring, and thus the metal layer is formed using conductive paste that comprises, as a main component, tungsten which is a material suitable for integrated sintering. However, tungsten has a relatively large volume resistivity of approximately $5.7\times10^{-8}$ Ω·m, which is likely to be a factor of an increase in wiring resistance.

According to the present embodiment, the metal layer comprises copper which has a relatively low volume resistivity of approximately $1.8\times10^{-8}$ Ω·m, or a material including copper as the main component.

In addition, according to the conventional techniques, the metal layer is formed inside the ceramic, and thus it is necessary to increase the adhesion between the metal layer and the ceramic. As a result, it is necessary to reduce thickness T of the metal layer to be smaller than, for example, 50 μm. In addition, thickness T of the metal layer may be smaller than 20 μm, for example. With this configuration, it is possible to reduce the formation of unevenness on the surface of the ceramic layer. In such a case, a restriction is added to the design conditions of the metal layer to reduce the wiring resistance. For example, when tungsten is used as the material of the metal layer, as illustrated in FIG. 9, thickness T and width W of the metal layer are small in design example 1, and thus the wiring resistance becomes large. For this reason, the operating voltage increases by 0.228 V due to the wiring resistance. Therefore, when the amount of applied current is large, it is necessary to increase thickness T and width W as in design example 2.

According to the present embodiment, as indicated in design example 4 of FIG. 9, the dimensions of the metal layer are approximately the same as those of design example 2 of the conventional technique, and the material is changed to copper from tungsten of design example 2. With this configuration, it is possible to reduce the wiring resistance to approximately one third of the wiring resistance of design example 2. As a result, it is possible to reduce the voltage increase due to wiring resistance to less than or equal to 1% of the operating voltage.

It should be noted that, by using copper as the material of the metal layer, as indicated in design example 3, it is possible to reduce the wiring resistance to approximately one third of the wiring resistance of design example 1, even with the same thickness T and width W as those of design example 1.

In addition, when the amount of applied current is larger as indicated in design example 5 and design example 6 of FIG. 9, for example, it is possible to inhibit an increase in operating voltage due to wiring resistance, by increasing at least one of thickness T or width W.

As indicated in design examples 4 to 6 of FIG. 9, thickness T of the metal layers comprising first metal layer 31 and second metal layer 32 may be greater than or equal to 0.05 mm. With this configuration, it is possible to reduce the resistance in first metal layer 31 and second metal layer 32. Accordingly, a protrusion having a height higher than or equal to 0.05 mm is formed above upper surface 20*a* of wiring substrate 20. In addition, when each of the metal layers and first insulating layer 21 are covered using resin or the like such as a resist as second insulating layer 22, it is also difficult to flatten upper surface 20*a* of wiring substrate 20 because second insulating layer 22 has a thickness approximately greater than or equal to 0.02 mm and less than or equal to 0.1 mm. In addition, the width of each of the metal layers may be greater than or equal to 1 mm. This configuration allows a reduction in the wiring resistance of each of the metal layers. In addition, in order to reduce the wiring resistance, the length of each of the metal layers need to be as short as possible. For this reason, first metal layer 31 and second metal layer 32 connect first pad electrode 31*p* and second pad electrode 32*p*, respectively, to connector 70 in the shortest distance, for example, in a straight line. For this reason, the gap between first metal layer 31 and second metal layer 32 is approximately greater than or equal to 1 mm, for example. In this case, even when cap unit 50 and wiring substrate 20 are bonded with bonding material 55, a gap having a space of, for example, approximately 0.01 mm or more in the thickness direction and approximately 0.1 mm or more in the width direction is created between cap unit 50 and wiring substrate 20. For this reason, the gap between cap unit 50 and wiring substrate 20 cannot be sealed.

According to the present embodiment, with spacer layers 30*a* and 30*b*, it is possible to narrow the width of the recess between each of the metal layers and a corresponding one of the spacer layers to be, for example, less than or equal to 0.3 mm. With this configuration, the gap between cap unit 50 and wiring substrate 20 can be filled with bonding material 55. As a result, it is possible to seal the gap between cap unit 50 and wiring substrate 20.

In addition, with wiring substrate 20 according to the present embodiment, it is not necessary to provide wiring in the substrate, and thus the configuration is simplified.

It should be noted that although the same material as each of the metal layers has been used as the material that each of the spacer layers comprises according to the present embodiment, the material that each of the spacer layers can comprise is not limited to this. For example, in the process illustrated in FIG. 10B, after forming only each of the metal layers without forming each of the spacer layers, a resin film such as a polyimide film having substantially the same thickness as the thickness of each of the metal layers may be formed and used as a spacer layer, for example. With this configuration, it is possible to inhibit each of the metal layers from short-circuiting with the other metal layers through the spacer layer.

1-3. Manufacturing Method

Next, a method of manufacturing semiconductor light-emitting device 10 according to the present embodiment will be described. First, a manufacturing method of wiring substrate 20 will be described with reference to FIG. 10A to FIG. 10G. FIG. 10A to FIG. 10G are cross-sectional views schematically illustrating the respective processes of the manufacturing method of wiring substrate 20 according to the present embodiment.

Figure 10A:
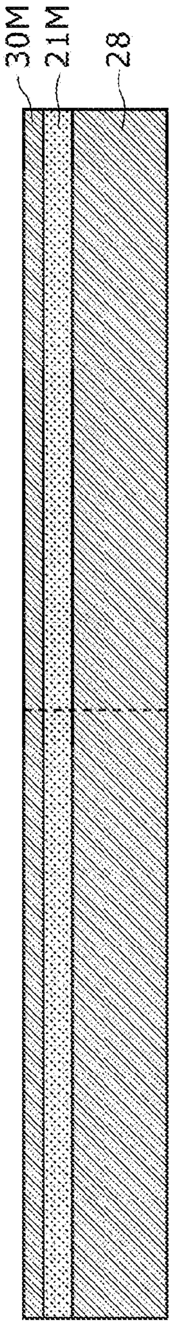
FIG. 10A is a cross-sectional view schematically illustrating the first process of a manufacturing method of the wiring substrate according to Embodiment 1.

First, as metal substrate 28, a flat plate of oxygen-free copper having a thickness of 2 mm, for example, is prepared as illustrated in FIG. 10A. Then, above metal substrate 28, insulating substrate 21M comprising, for example, epoxy glass prepreg is disposed as a material to form first insulating layer 21. Next, metal foil 30M comprising a copper foil having a thickness of 0.08 mm, for example, is disposed above insulating substrate 21M as a material for forming each of the metal layers and each of the spacer layers. Then, metal substrate 28, insulating substrate 21M, and metal foil 30M are overlapped, pressurized, and heated to form an integral substrate as illustrated in FIG. 10A.

Figure 10B:
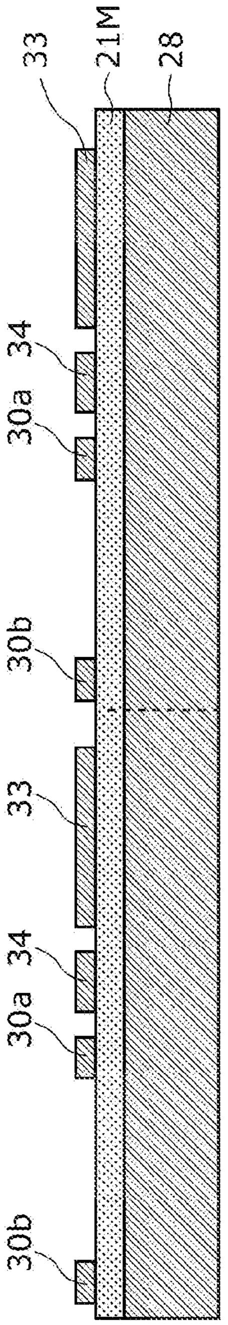
FIG. 10B is a cross-sectional view schematically illustrating the second process of the manufacturing method of the wiring substrate according to Embodiment 1.
Figure 10C:
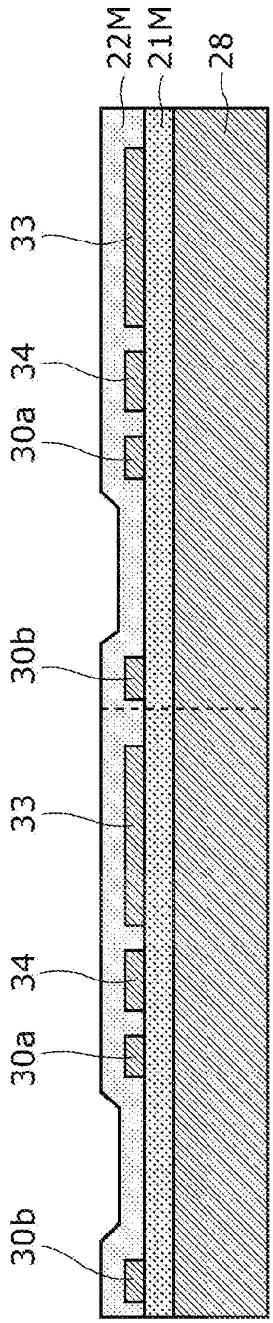
FIG. 10C is a cross-sectional view schematically illustrating the third process of the manufacturing method of the wiring substrate according to Embodiment 1.

Then, as illustrated in FIG. 10B, metal foil 30M is patterned by etching to form first metal layer 31, second metal layer 32, and spacer layers 30*a* and 30*b*. It should be noted that, in the cross section illustrated in FIG. 10B, first metal layer 31 and second metal layer 32 are not illustrated, and third metal layer 33 and fourth metal layer 34 are illustrated. As described above, third metal layer 33 and fourth metal layer 34 may be formed from metal foil 30M in this process Then, as illustrated in FIG. 10C, resist 22M is formed above insulating substrate 21M, each of the metal layers, and each of the spacer layers.

Figure 10D:
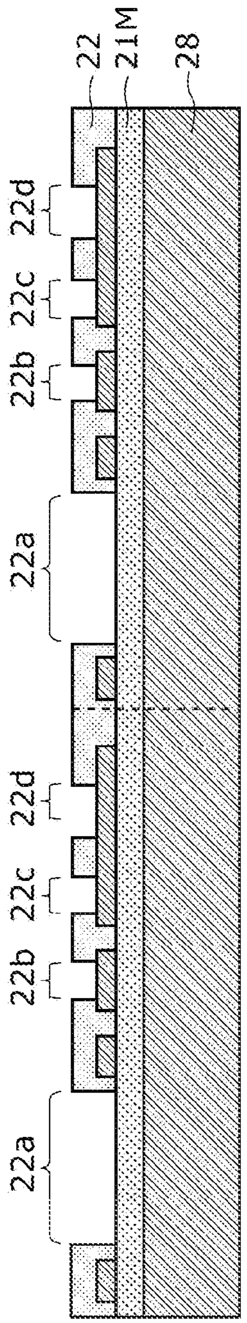
FIG. 10D is a cross-sectional view schematically illustrating the fourth process of the manufacturing method of the wiring substrate according to Embodiment 1.

Then, as illustrated in FIG. 10D, second insulating layer 22 is formed by patterning resist 22M by a photographic method. In second insulating layer 22, opening 21*a* of first insulating layer 21, and openings 22*a* to 22*d* for forming each of the pad electrodes are formed.

Figure 10E:
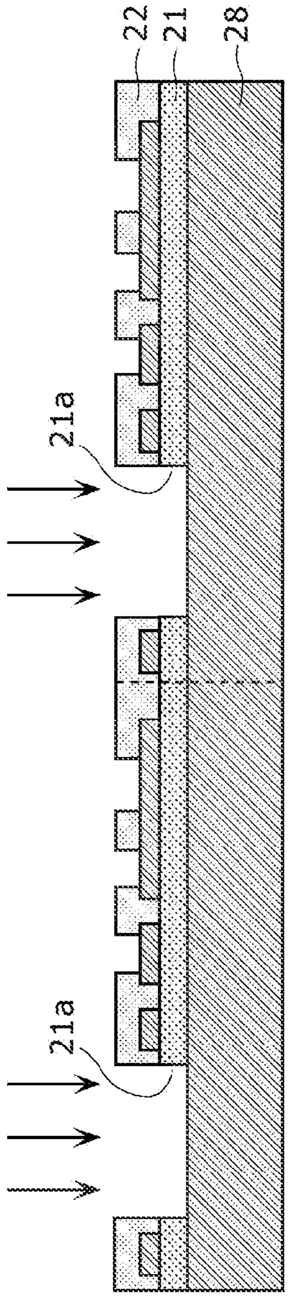
FIG. 10E is a cross-sectional view schematically illustrating the fifth process of the manufacturing method of the wiring substrate according to Embodiment 1.

Then, as illustrated in FIG. 10E, first insulating layer 21 having opening 21*a* is formed by removing the portion of insulating substrate 21M that is exposed from opening 22*a*, by means of laser trimming.

Figure 10F:
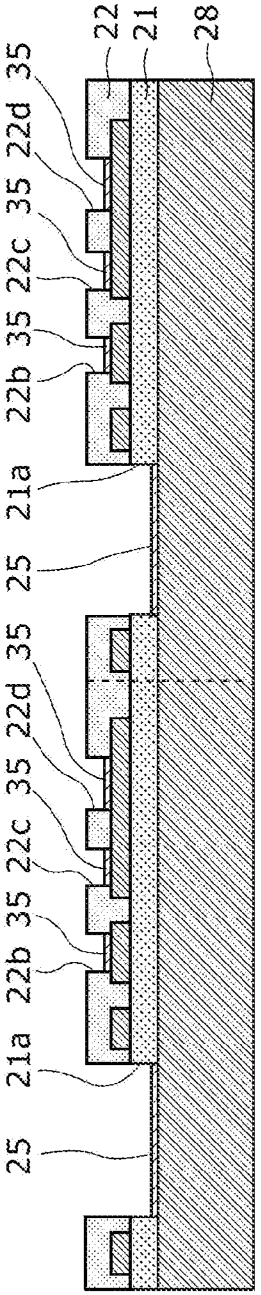
FIG. 10F is a cross-sectional view schematically illustrating the sixth process of the manufacturing method of the wiring substrate according to Embodiment 1.

Then, as illustrated in FIG. 10F, protection film 25 such as Au is formed on each metal surface exposed from opening 21*a* and openings 22*b* to 22*d*, by means of an electroless plating method.

Figure 10G:
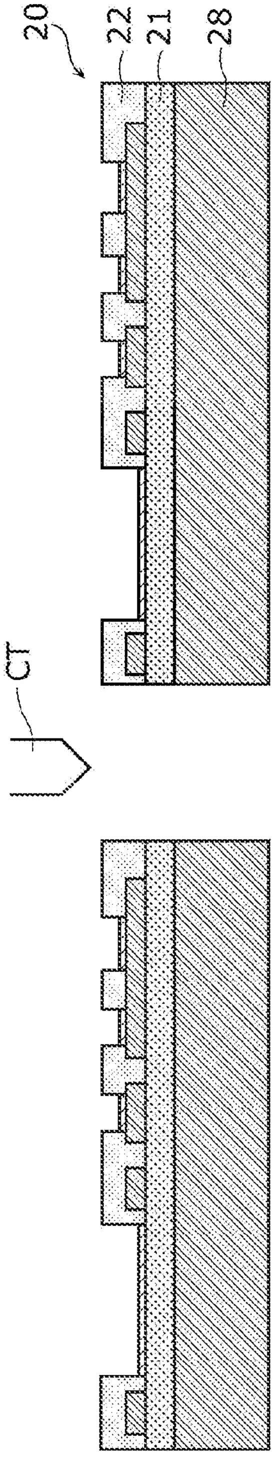
FIG. 10G is a cross-sectional view schematically illustrating the seventh process of the manufacturing method of the wiring substrate according to Embodiment 1.

Then, as illustrated in FIG. 10G, wiring substrate 20 is formed by singulating metal substrate 28 above which first insulating layer 21, etc. are formed, using cutter CT or the like. At this time, it is possible to form slanted cut surface 28*c* of an arbitrary shape on wiring substrate 20, by adjusting the blade shape of cutter CT. For example, it is possible to easily form slanted cut surface 28*c* by using a rotating blade having a tapered blade.

Figure 11:
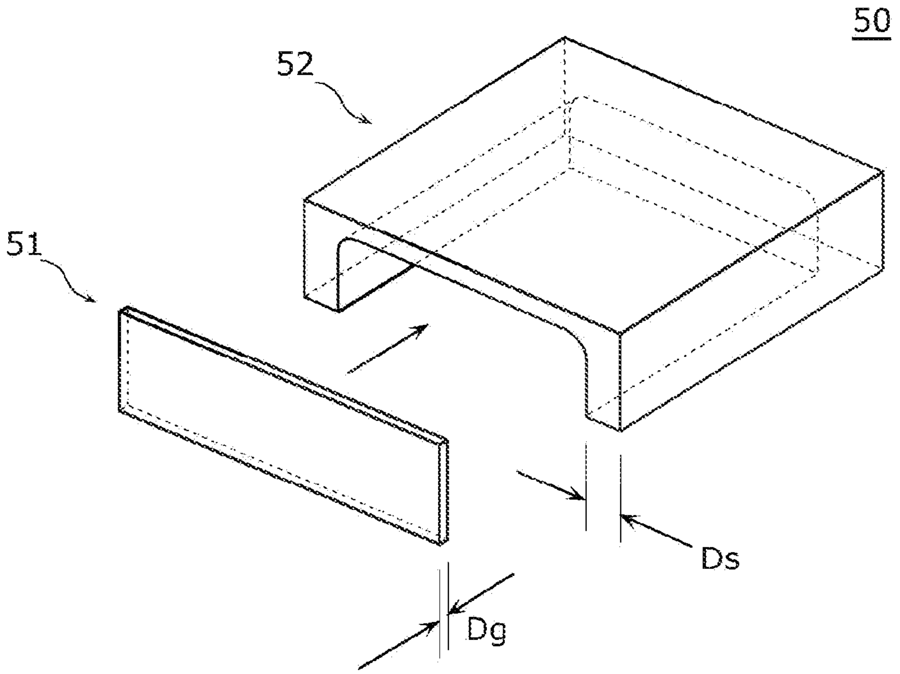
FIG. 11 is a perspective view schematically illustrating the manufacturing method of the cap unit according to Embodiment 1.

Next, the manufacturing method of cap unit 50 will be described with reference to FIG. 11. FIG. 11 is a perspective view schematically illustrating the manufacturing method of cap unit 50 according to the present embodiment. As illustrated in FIG. 11, cap unit 50 includes side wall 51 that is a light-transmissive window and holder 52. Side wall 51 is, for example, a light-transmissive window including: inorganic light-transmissive plate 51*a* comprising a thin glass substrate having a rectangular shape and thickness Dg greater than or equal to 0.01 mm and less than or equal to 0.2 mm; and antireflection films 51*b* and 51*c* comprising dielectric multilayer films such as $SiO_2$, $Ta_2O_5$, and $TiO_2$ and disposed on both sides of inorganic light-transmissive plate 51*a*. Holder 52 is a box-shaped component lacking one side wall, and includes three side walls 52*a*, 52*b*, and 52*c* connected to three sides of the peripheral edge of top plate 52*d* that is transparent and has a rectangular shape. Holder 52 is manufactured, for example, by forming a recess in a glass block having a rectangular parallelepiped shape by means of sandblasting, etc., and dividing it.

Side wall 51 and holder 52 are bonded by optical contact or laser bonding to form cap unit 50 having a box shape.

Thickness Ds of each of the side walls of holder 52 is, for example, approximately greater than or equal to 0.3 mm and less than or equal to 2 mm, which is greater than the thickness of side wall 51. For this reason, even when side wall 51 that is thinner than side walls 52*a*, 52*b*, and 52*c* is used, holder 52 that is structurally strong with side walls 52*a*, 52*b*, and 52*c* which are relatively thick holds side wall 51, and thus it is possible to inhibit side wall 51 from being damaged. In addition, side wall 51 and holder 52 comprise the same material, and thus it is possible to inhibit damage due to expansion and contraction caused by temperature.

Figure 12A:
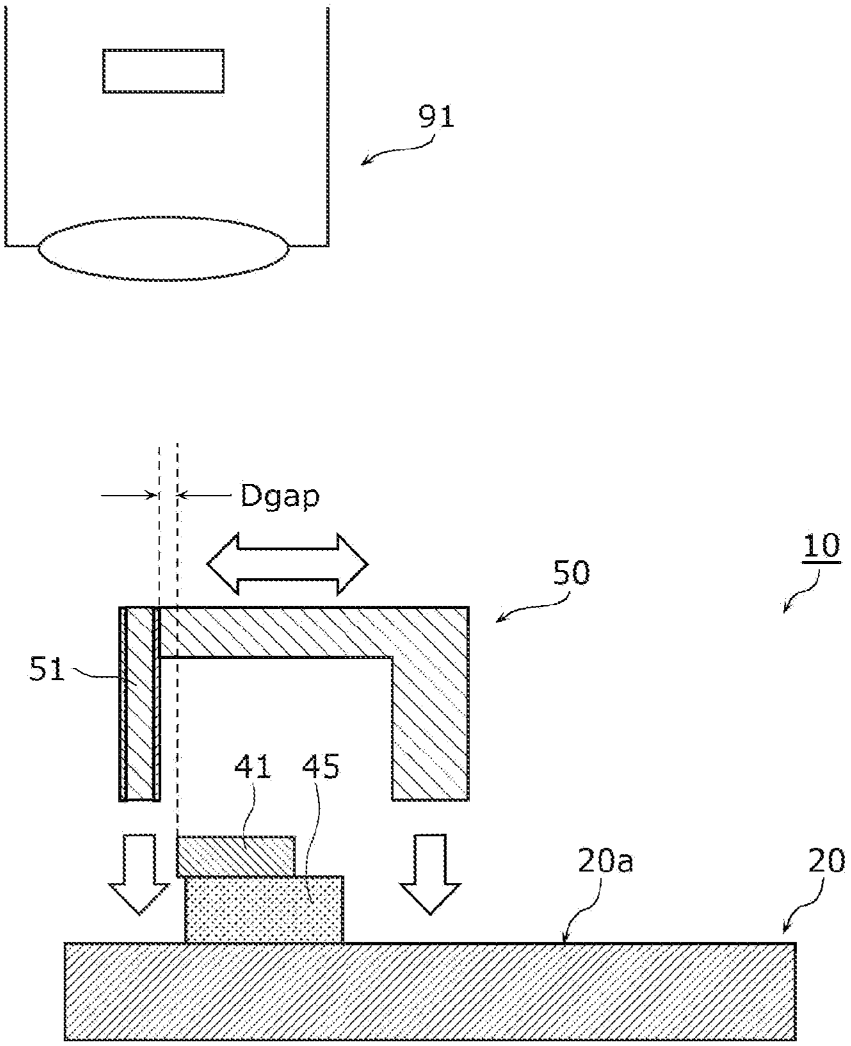
FIG. 12A is a cross-sectional view schematically illustrating the method of attaching the cap unit to the wiring substrate according to Embodiment 1.
Figure 12B:
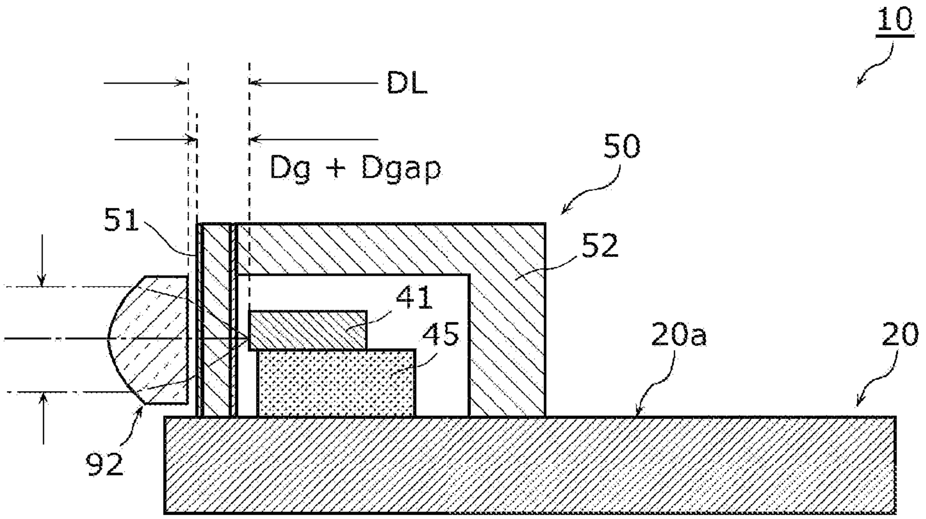
FIG. 12B is a cross-sectional view schematically illustrating a light source device using the semiconductor light-emitting device according to Embodiment 1.

Next, the method of attaching wiring substrate 20 to cap unit 50 according to the present embodiment will be described with reference to FIG. 12A and FIG. 12B. FIG. 12A is a cross-sectional view schematically illustrating the method of attaching cap unit 50 to wiring substrate 20 according to the present embodiment. In wiring substrate 20 manufactured according to the above-described manufacturing method, semiconductor light-emitting element 41 and submount 45 have been mounted and a metal wire which is not illustrated has been attached in advance, before cap unit 50 is attached. FIG. 12A illustrates a cross-section surface perpendicular to wiring substrate 20 through the optical axis of semiconductor light-emitting element 41. FIG. 12B is a cross-sectional view schematically illustrating a light source device using semiconductor light-emitting device 10 according to the present embodiment.

According to the present embodiment, top plate 52*d* of cap unit 50 is transparent, and thus it is possible to adjust the position of cap unit 50 with high precision without contact between side wall 51 which is a light-transmissive window and the emission surface of semiconductor light-emitting element 41, as illustrated in FIG. 12A. For example, as illustrated in FIG. 12A, the position of cap unit 50 may be adjusted while observing a magnified image of cap unit 50 and semiconductor light-emitting element 41 from above cap unit 50, using image observation system 91. This makes it possible to adjust the position of cap unit 50 such that the distance between side wall 51 and the emission surface of semiconductor light-emitting element 41 is less than the thickness of side wall 51.

In addition, it is possible to reduce the distance between semiconductor light-emitting element 41 and the outside of cap unit 50, by using thin side wall 51.

In addition, wiring substrate 20 includes a spacer, and wiring substrate 20 and side wall 51 of cap unit 50 are bonded above the spacer. With this configuration, a small amount of bonding material is sufficient to bond the gap between wiring substrate 20 and side wall 51, and thus it is possible to inhibit an excess bonding material from reaching the vicinity of semiconductor light-emitting element 41 that is located in close proximity and changing the properties of emitted light L1.

By reducing the distance between semiconductor light-emitting element 41 and the outside of cap unit 50, for example, as illustrated in FIG. 12B, in a light source device including semiconductor light-emitting device 10 and lens optical element 92 that is a fast axis collimator lens, it is possible to reduce distance DL between the emission surface of semiconductor light-emitting element 41 and lens optical element 92. With this configuration, it is possible to reduce the beam width in the fast axis direction of the laser light (emitted light L1) emitted from semiconductor light-emitting device 10.

At this time, the distance resulting from adding thickness Dg of side wall 51 and gap Dgap between side wall 51 and the emission surface should be short. By making gap Dgap smaller than thickness Dg of side wall 51, it is possible to bring lens optical element 92 close to the emission surface of semiconductor light-emitting element 41 while maintaining the strength of side wall 51.

According to the above-described configuration, semiconductor light-emitting device 10 according to the present embodiment is capable of causing semiconductor light-emitting element 41 to emit emitted light L1 with a large optical output, by applying a large amount of current to semiconductor light-emitting element 41 with a small wiring resistance. In addition, semiconductor light-emitting element 41 above wiring substrate 20 is sealed by cap unit 50, and thus it is possible to improve the reliability of semiconductor light-emitting element 41. Furthermore, the distance between light-emitting point 41*e* of semiconductor light-emitting element 41 and the outside of cap unit 50 is reduced. Accordingly, it is possible to more freely design external optical elements such as lens optical elements which are disposed outside 10 and are optically coupled to light-emitting point 41*e*. In addition, as illustrated in FIG. 4, slanted cut surface 28*c* is formed on the end portion on the upper surface 20*a* side of metal substrate 28 of the wiring substrate. With this configuration, it is possible to inhibit a portion of emitted light L1 from being blocked outside the semiconductor light-emitting device, and also to more freely place the external optical elements. In addition, the Joule heat generated in semiconductor light-emitting element 41 is spread in metal substrate 28 and dissipated from heat-dissipating surface 20*b* to an external heat sink. At this time, since semiconductor light-emitting element 41 is mounted above metal substrate 28 without involving first insulating layer 21 and second insulating layer 22, the Joule heat is efficiently transferred to metal substrate 28. Furthermore, metal substrate 28 has a larger area on the lower surface than on the upper surface due to slanted cut surface 28*c* formed in the end portion. For this reason, the Joule heat that has been generated is transferred from submount 45 to metal substrate 28 as heat flow TP1 and TP5 illustrated in FIG. 4, and then spread in a direction parallel to the upper surface of metal substrate 28 and efficiently dissipated to the outside. As a result, it is possible to cause emitted light L1 which is high in optical output to be emitted from semiconductor light-emitting element 41.

Variation 1

Next, a semiconductor light-emitting device according to Variation 1 of the present embodiment will be described. The semiconductor light-emitting device according to the present variation differs from semiconductor light-emitting device 10 according to Embodiment 1 in the configuration of the spacer layer, and matches in the other configurations. The following describes the semiconductor light-emitting device according to the present variation with a focus on the difference from semiconductor light-emitting device 10 according to Embodiment 1, with reference to FIG. 13A.

Figure 13A:
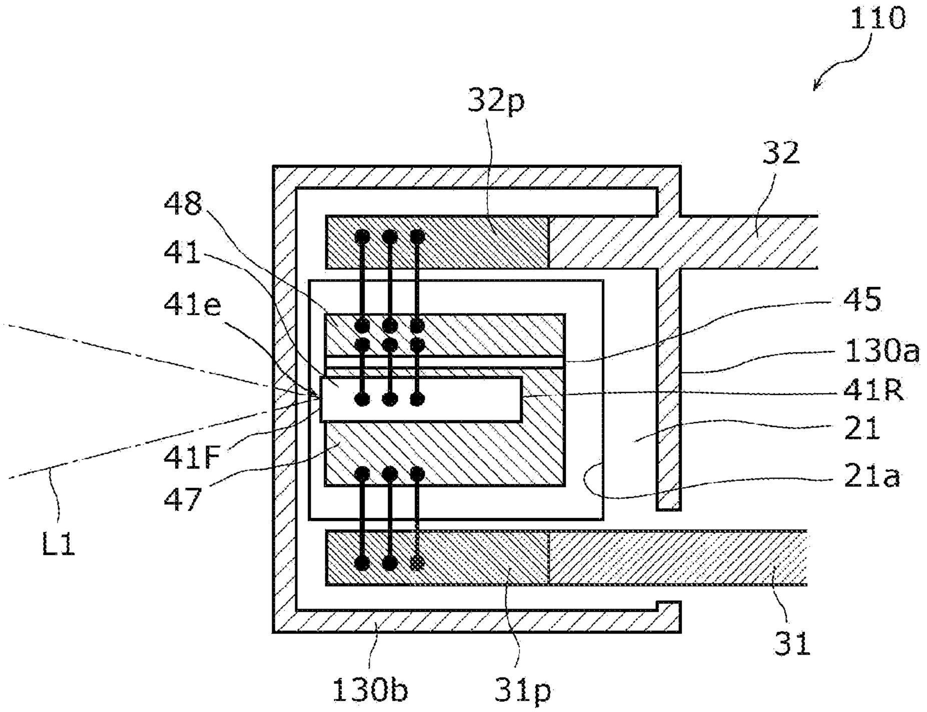
FIG. 13A is a top view schematically illustrating the configuration of each of the spacer layers of the semiconductor light-emitting device according to Variation 1 of Embodiment 1.

FIG. 13A is a top view schematically illustrating the configuration of spacer layers 130*a* and 130*b* of semiconductor light-emitting device 110 according to the present variation. FIG. 13A illustrates the configuration of semiconductor light-emitting element 41 and the surroundings of semiconductor light-emitting device 110 in a state in which cap unit 50 and second insulating layer 22 are removed. As illustrated in FIG. 13A, spacer layers 130*a* and 130*b* according to the present variation comprise the material that second metal layer 32 comprises, and are electrically connected to second metal layer 32. More specifically, spacer layers 130*a* and 130*b* and second metal layer 32 have the same thickness, and the top surfaces of each of the spacer layers and second metal layer 32 are flat and connected. In other words, the upper surfaces of each of the spacer layers and second metal layer 32 are connected in a state in which they are flush with each other. The boundary between second metal layer 32 and each of the spacer layers may be set as appropriate. According to the present embodiment, second metal layer 32 is defined as a rectangular-shaped portion extending in the optical axis direction. Spacer layer 130*a* is disposed in a region located rearward from rear end surface 41R of semiconductor light-emitting element 41 on the side opposite to emission surface 41F including light-emitting point 41*e*. Spacer layer 130*a* extends in the lateral direction between first metal layer 31 and second metal layer 32. According to the present variation, spacer layer 130*a* is connected to an end edge of second metal layer 32 on the side closer to first metal layer 31. In other words, spacer layer 130*a* protrudes from second metal layer 32 in a direction toward first metal layer 31. Spacer layer 130*b* is composed of five portions.

The first portion of spacer layer 130*b* is disposed at a position rearward from rear end surface 41R. The first portion of spacer layer 130*b* is disposed further from semiconductor light-emitting element 41 than first metal layer 31 is in the lateral direction. In other words, first metal layer 31 is disposed between the first portion of spacer layer 130*b* and semiconductor light-emitting element 41. In addition, first metal layer 31 is disposed between the first portion of spacer layer 130*b* and spacer layer 130*a*. The first portion of spacer layer 130*b* extends in the lateral direction.

The second portion of spacer layer 130*b* is disposed further from semiconductor light-emitting element 41 than first pad electrode 31*p* and first metal layer 31 are in the lateral direction. In other words, first pad electrode 31*p* and first metal layer 31 are disposed between the second portion of spacer layer 130*b* and semiconductor light-emitting element 41 in the lateral direction. The second portion of spacer layer 130*b* is connected to the first portion and extends in the optical axis direction.

The third portion of spacer layer 130*b* is disposed at a position forward from emission surface 41F. The third portion of spacer layer 130*b* is connected to the second portion and extends in the lateral direction.

The fourth portion of spacer layer 130*b* is disposed further from semiconductor light-emitting element 41 than second pad electrode 32*p* and second metal layer 32 are in the lateral direction. In other words, second pad electrode 32*p* and second metal layer 32 are disposed between the fourth portion of spacer layer 130*b* and semiconductor light-emitting element 41 in the lateral direction. The fourth portion of spacer layer 130*b* is connected to the third portion and extends in the optical axis direction.

The fifth portion of spacer layer 130*b* is disposed at a position rearward from rear end surface 41R in the optical axis direction. The fifth portion of spacer layer 130*b* is disposed further from semiconductor light-emitting element 41 than second metal layer 32 is in the lateral direction. In other words, second metal layer 32 is disposed between the fifth portion of spacer layer 130*b* and semiconductor light-emitting element 41 in the lateral direction. In addition, second metal layer 32 is disposed between the fifth portion of spacer layer 130*b* and spacer layer 130*a*. The fifth portion of spacer layer 130*b* is connected to the fourth portion and extends in the lateral direction.

Such spacer layers 130*a* and 130*b* can be formed at the same time as second metal layer 32 in the process of forming each of the metal layers in the same manner as each of the spacer layers according to Embodiment 1. It should be noted that, also in the case where each of the spacer layers is in contact with second metal layer 32 as in the present variation, each of the spacer layers is disposed at a position different from the position at which second metal layer 32 is disposed.

With spacer layers 130*a* and 130*b* according to the present variation, the gap between second metal layer 32 and each of the spacer layers is zero, and thus a recess is not formed, above the upper surface of the wiring substrate, at the position corresponding to the gap between second metal layer 32 and each of the spacer layers. As a result, it is possible to reduce the formation of a gap between bonding surface 50*b* of cap unit 50 and the upper surface of the wiring substrate. In other words, it is possible to more securely seal bonding surface 50*b* of cap unit 50 and the upper surface of the wiring substrate.

Although each of the spacer layers has been connected to second metal layer 32 in the present variation, each of the spacer layers may be connected to first metal layer 31. In this case, spacer layers 130*a* and 130*b* may comprise the material that first metal layer 31 comprises. In other words, spacer layers 130*a* and 130*b* may comprise the material that one of first metal layer 31 or second metal layer 32 comprises, and be electrically connected to the one of first metal layer 31 or second metal layer 32.

Variation 2

Next, a semiconductor light-emitting device according to Variation 2 of the present embodiment will be described. The semiconductor light-emitting device according to the present variation differs from semiconductor light-emitting device 10 according to Embodiment 1 in the configuration of the spacer layer, and matches in the other configurations. The following describes the semiconductor light-emitting device according to the present variation with a focus on the difference from semiconductor light-emitting device 10 according to Embodiment 1, with reference to FIG. 13B.

Figure 13B:
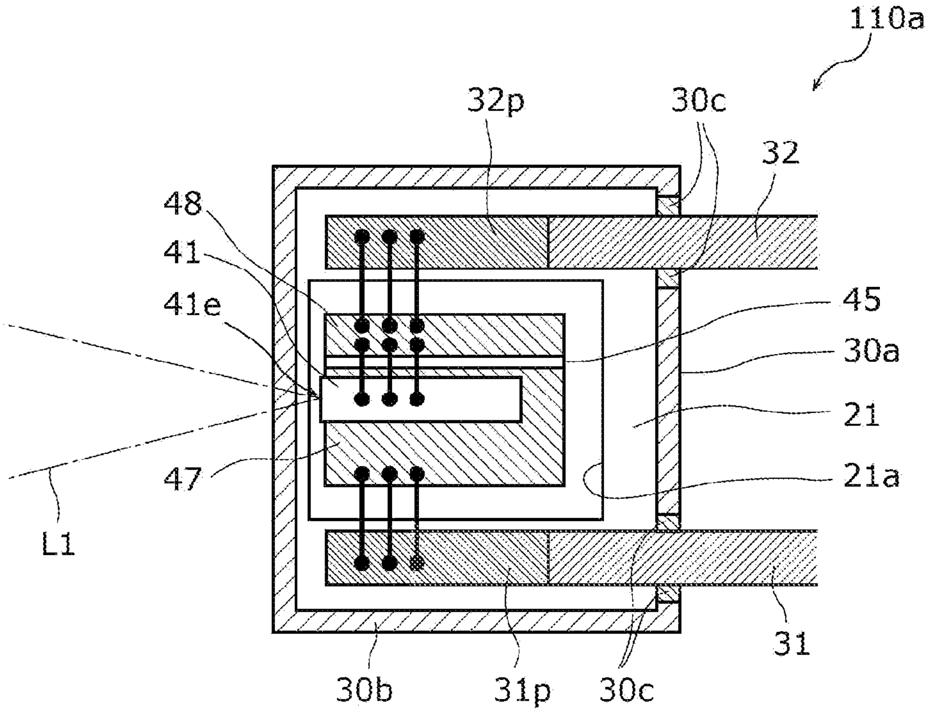
FIG. 13B is a top view schematically illustrating the configuration of each of the spacer layers of the semiconductor light-emitting device according to Variation 2 of Embodiment 1.

FIG. 13B is a top view schematically illustrating the configuration of spacer layers 30*a*, 30*b*, and 30*c* of semiconductor light-emitting device 110*a* according to the present variation. FIG. 13B illustrates the configuration of semiconductor light-emitting element 41 and the surroundings of semiconductor light-emitting device 110*a* in a state in which cap unit 50 and second insulating layer 22 are removed. As illustrated in FIG. 13B, semiconductor light-emitting device 110*a* according to the present variation includes four spacer layers 30*c* in addition to spacer layers 30*a* and 30*b* equivalent to those according to Embodiment 1. Spacer layers 30*c* are insulating films disposed between the respective metal layers and spacer layers 30*a* and 30*b*. For example, an inorganic material such as resin, low-melting-point glass, etc. can be used as the material which spacer layers 30*c* comprise. It should be noted that, when spacer layers 30*a* and 30*b* comprise an insulating material, spacer layers 30*c* may comprise a metal material.

With the wiring substrate according to the present variation, the gap between each of the metal layers and spacer layers 30*a* and 30*b* can be filled with spacer layers 30*c*, and thus it is possible to reduce the dimensions of the recess formed in the upper surface of the wiring substrate compared to wiring substrate 20 according to Embodiment 1. As a result, it is possible to reduce the formation of a gap between bonding surface 50*b* of cap unit 50 and the upper surface of the wiring substrate. In other words, it is possible to more securely seal bonding surface 50*b* of cap unit 50 and the upper surface of the wiring substrate.

In addition, the thickness of each of spacer layer 30*c* may be the same as each of the metal layers and spacer layers 30*a* and 30*b*. With this configuration, it is possible to further reduce the dimensions of the recess formed in the upper surface of the wiring substrate.

Variation 3

Next, a semiconductor light-emitting device according to Variation 3 of the present embodiment will be described. The semiconductor light-emitting device according to the present variation matches semiconductor light-emitting device 10 according to Embodiment 1 in points other than that a shielding component disposed between temperature sensing element 60 and semiconductor light-emitting element 41 is included. The following describes the semiconductor light-emitting device according to the present variation with a focus on the difference from semiconductor light-emitting device 10 according to Embodiment 1, with reference to FIG. 14A and FIG. 14B.

Figure 14A:
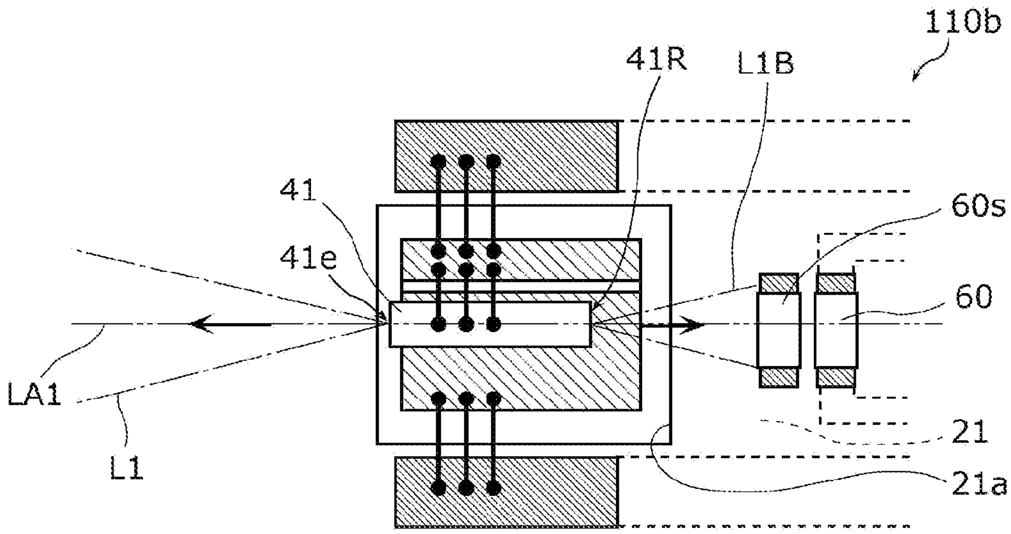
FIG. 14A is a top view schematically illustrating the positional relationship of a semiconductor light-emitting element, a temperature sensing element, and a shielding component of a semiconductor light-emitting device according to Variation 3 of Embodiment 1.
Figure 14B:
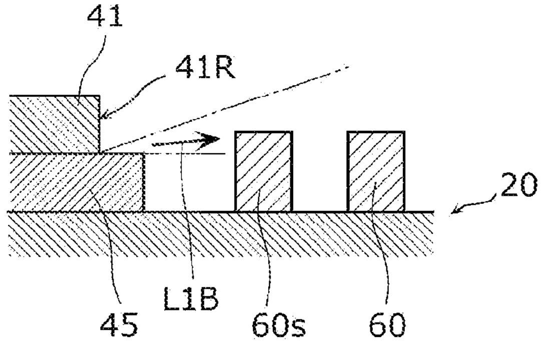
FIG. 14B is a cross-sectional view schematically illustrating the positional relationship of the semiconductor light-emitting element, the temperature sensing element, and the shielding component of the semiconductor light-emitting device according to Variation 3 of Embodiment 1.

FIG. 14A and FIG. 14B are a top view and a cross-sectional view, respectively, each schematically illustrating the positional relationship of semiconductor light-emitting element 41, temperature sensing element 60, and shielding component 60*s* of semiconductor light-emitting device 110*b* according to the present variation. FIG. 14B is a cross-sectional view of semiconductor light-emitting element 41 of FIG. 14A at optical axis LA1. As illustrated in FIG. 14A and FIG. 14B, semiconductor light-emitting device 110*b* according to the present variation includes shielding component 60*s* disposed between temperature sensing element 60 and semiconductor light-emitting element 41.

As illustrated in FIG. 14B, semiconductor light-emitting element 41 emits emitted light L1B also from rear end surface 41R that is an end surface on the opposite side from the emission surface at which light-emitting point 41*e* is located. The intensity of emitted light L1B is much smaller than the intensity of emitted light L1. However, when semiconductor light-emitting element 41 is a high optical output element, the intensity of emitted light LIB also relatively increases. For this reason, when temperature sensing element 60 is irradiated with emitted light LIB, the temperature of temperature sensing element 60 increases, making it impossible to accurately sense the temperature of wiring substrate 20. According to the present variation, shielding component 60*s* is disposed between temperature sensing element 60 and rear end surface 41R of semiconductor light-emitting element 41. In other words, semiconductor light-emitting element 41, shielding component 60*s*, and temperature sensing element 60 are arranged on optical axis LA1 in stated order. With this configuration, it is possible to shield emitted light L1B by shielding component 60*s*. In addition, shielding component 60*s* is not particularly limited as long as it can shield emitted light LIB, and for example, may be the same element as temperature sensing element 60. When such an element is used as shielding component 60*s*, no wiring is connected to the element. By disposing an element of the same dimensions as temperature sensing element 60 between temperature sensing element 60 and semiconductor light-emitting element 41, it is possible to reliably inhibit temperature sensing element 60 from being irradiated with emitted light LIB. In addition, the dimensions of shielding component 60*s* may be larger than the dimensions of temperature sensing element 60. With this configuration, it is possible to more reliably inhibit emitted light LIB from being incident on temperature sensing element 60. It should be noted that shielding component 60*s* may be disposed outside cap unit 50 or inside cap unit 50.

Embodiment 2

Next, a semiconductor light-emitting device according to Embodiment 2 will be described. The semiconductor light-emitting device according to the present embodiment differs from semiconductor light-emitting device 10 according to Embodiment 1 mainly in the configurations of the first metal layer and the second metal layer. The following describes the semiconductor light-emitting device according to the present embodiment focusing on the differences from semiconductor light-emitting device 10 according to Embodiment 1.

2-1. Overall Configuration

Figure 15:
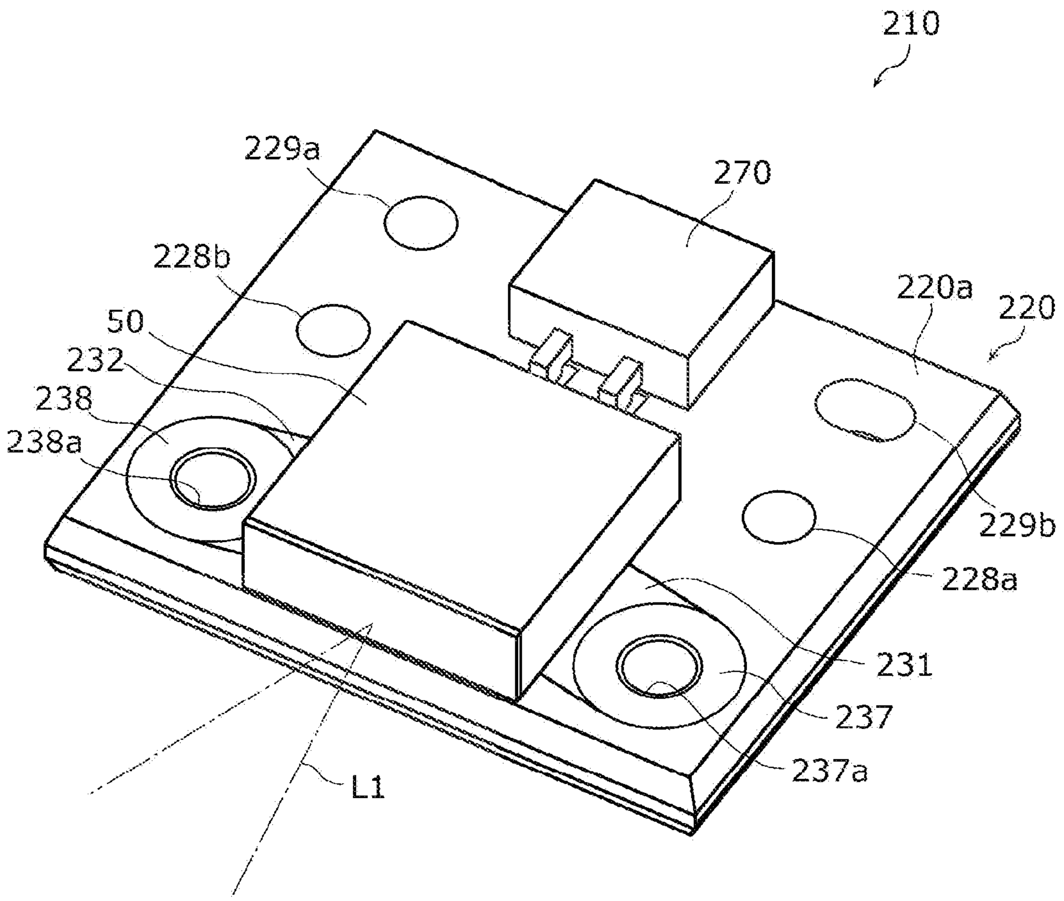
FIG. 15 is a perspective view schematically illustrating the overall configuration of a semiconductor light-emitting device according to Embodiment 2.
Figure 16:
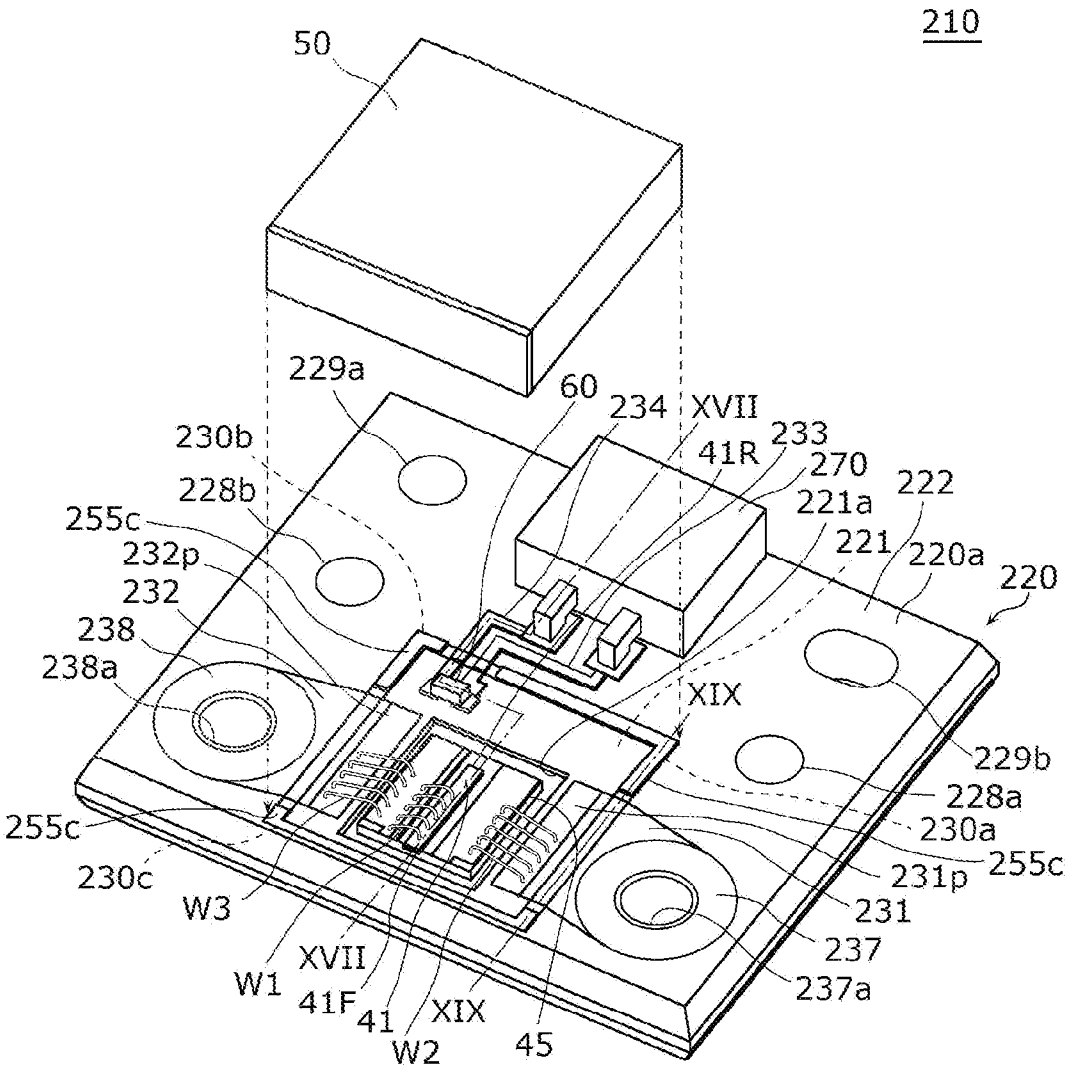
FIG. 16 is a perspective view schematically illustrating the overall configuration of the semiconductor light-emitting device according to Embodiment 2.
Figure 17:
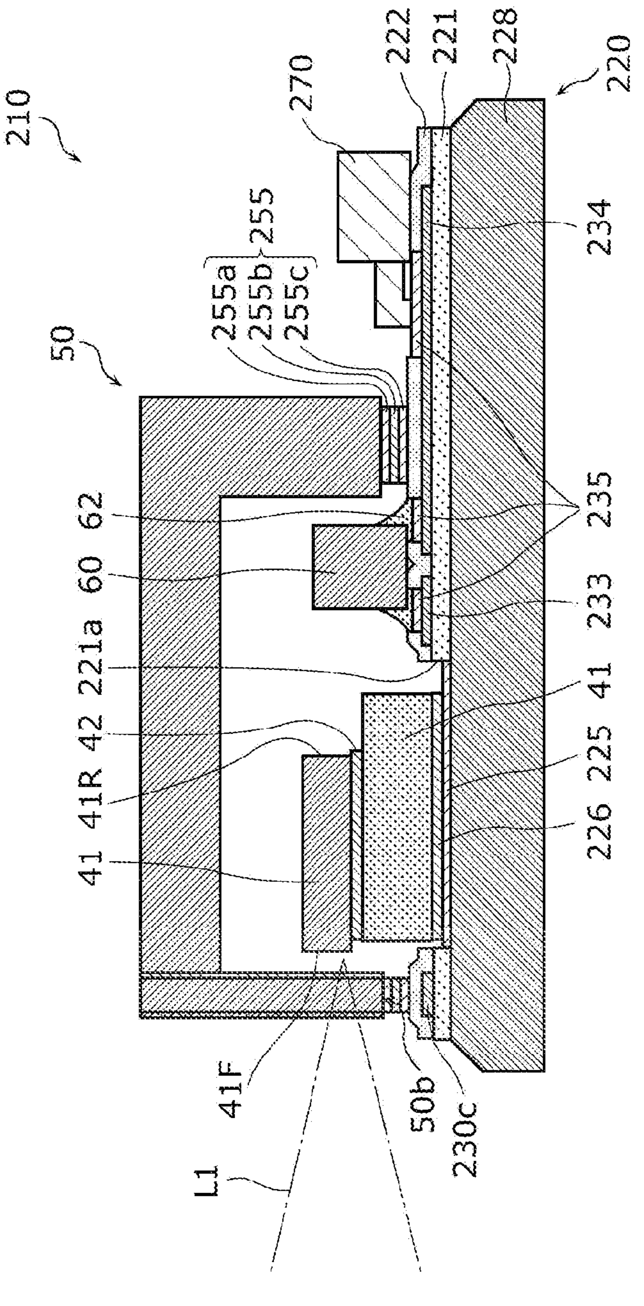
FIG. 17 is a cross-sectional view schematically illustrating the overall configuration of the semiconductor light-emitting device according to Embodiment 2.

First, the overall configuration of the semiconductor light-emitting device according to the present embodiment will be described with reference to FIG. 15 to FIG. 17. FIG. 15 and FIG. 16 are a perspective view and an exploded perspective view, respectively, each of which schematically illustrates the overall configuration of semiconductor light-emitting device 210 according to the present embodiment. FIG. 17 is cross-sectional view schematically illustrating the overall configuration of semiconductor light-emitting device 210 according to the present embodiment. FIG. 17 illustrates a cross-section surface that is taken along line XVII-XVII of FIG. 16, and is perpendicular to upper surface 220*a* of wiring substrate 220.

As illustrated in FIG. 15 to FIG. 17, semiconductor light-emitting device 210 according to the present embodiment includes wiring substrate 220, cap unit 50, and connector 270. In addition, as illustrated in FIG. 16 and FIG. 17, semiconductor light-emitting device 210 further includes semiconductor light-emitting element 41, submount 45, and temperature sensing element 60. In addition, as illustrated in FIG. 17, semiconductor light-emitting device 210 further includes bonding materials 226, 42, and 62, and bonding layer 255. The following describes each of the structural components of semiconductor light-emitting device 210.

Wiring substrate 220 according to the present embodiment includes metal substrate 228, first insulating layer 221, second insulating layer 222, third metal layer 233, fourth metal layer 234, and protection film 225, as illustrated in FIG. 17. In addition, as illustrated in FIG. 16, wiring substrate 220 further includes first metal layer 231, second metal layer 232, spacer layers 230*a*, 230*b*, and 230*c*, first pad electrode 231*p*, second pad electrode 232*p*, first extraction electrode 237, and second extraction electrode 238.

According to the present embodiment, in the same manner as Embodiment 1, through-holes 228*a* and 228*b* and positioning holes 229*a* and 229*b* are provided in wiring substrate 220. Through-holes 228*a* and 228*b* and positioning holes 229*a* and 229*b* according to the present embodiment differ from through-holes 28*a* and 28*b* and positioning holes 29*a* and 29*b* according to Embodiment 1 in their arrangement in wiring substrate 220. According to the present embodiment, positioning holes 229*a* and 229*b* are located in proximity to the rear end portion of wiring substrate 220. Here, the rear end portion of wiring substrate 220 is an end portion out of the two end portions of wiring substrate 220 in the direction of propagation of emitted light L1, which is farther from light-emitting point 41*e*. Through-holes 228*a* and 228*b* are located in proximity to the center of wiring substrate 220 in the propagation direction of emitted light L1.

Metal substrate 228 differs from metal substrate 28 according to Embodiment 1 in their arrangement and a total number of the holes provided, and matches in the other points.

First insulating layer 221 is an insulating layer having a configuration equivalent to the configuration of first insulating layer 21 according to Embodiment 1, and opening 221*a* is formed therein.

First metal layer 231, second metal layer 232, third metal layer 233, and fourth metal layer 234 are metal layers spaced apart from each other above first insulation layer 221. According to the present embodiment, first metal layer 231 extends from first pad electrode 231*p* in the direction perpendicular to the propagation direction of emitted light L1 and parallel to the main surface of metal substrate 228, as illustrated in FIG. 16, and is connected to first extraction electrode 237. Specifically, first metal layer 231 extends from the gap between first pad electrode 231*p* and first insulating layer 221 to the gap between first extraction electrode 237 and first insulating layer 221. Second metal layer 232 extends from second pad electrode 232*p* in the direction perpendicular to the propagation direction of emitted light L1 and parallel to the main surface of metal substrate 228, and is connected to second extraction electrode 238, as illustrated in FIG. 16. Specifically, second metal layer 232 extends from the gap between second pad electrode 232*p* and first insulating layer 221 to the gap between second extraction electrode 238 and first insulating layer 221. Second metal layer 232 extends in the direction opposite to the direction in which first metal layer 231 extends. As described above, according to the present embodiment, first metal layer 231 and second metal layer 232 are not connected to connector 270. Current is supplied to semiconductor light-emitting element 41 via first extraction electrode 237 and second extraction electrode 238, without involving connector 270. First metal layer 231 and second metal layer 232 have the configuration as illustrated in design example 6 in FIG. 9. In other words, first metal layer 231 and second metal layer and 232 are copper films each having thickness T of 0.070 mm, width W of 7.0 mm, and length L of 5 mm. This allows the resistance of first metal layer 231 and second metal layer 232 to be 0.0002Ω. As a result, even when a large amount of current of approximately 30 A is supplied to semiconductor light-emitting element 41, it is possible to suppress the increase in operating voltage due to the resistance of each of the metal layers to be approximately 0.006 V.

Third metal layer 233 and fourth metal layer 234 are wiring connected to temperature sensing element 60, in the same manner as third metal layer 33 and fourth metal layer 34 according to Embodiment 1. According to the present embodiment, as illustrated in FIG. 16 and FIG. 17, temperature sensing element 60 is disposed inside cap unit 50, and thus the arrangement of third metal layer 233 and fourth metal layer 234 in wiring substrate 220 is different from the arrangement of third metal layer 33 and fourth metal layer 34 according to Embodiment 1. According to the present embodiment, as illustrated in FIG. 16, third metal layer 233 and fourth metal layer 234 are disposed at positions rearward from rear end surface 41R located opposite to emission surface 41F of semiconductor light-emitting element 41 and extend in the optical axis direction. Bonding surface 50*b* of cap unit 50 which is bonded to wiring substrate 220 intersects third metal layer 233 and fourth metal layer 234 in the top view of wiring substrate 220.

First pad electrode 231*p* and second pad electrode 232*p* have configurations equivalent to the configurations of first pad electrode 31*p* and second pad electrode 32*p* according to Embodiment 1, respectively, as illustrated in FIG. 16.

Spacer layers 230*a*, 230*b*, and 230*c* are layers that are disposed at positions different from the positions at which first metal layer 231 and second metal layer 232 above first insulating layer 221, as illustrated in FIG. 16. Spacer layers 230*a*, 230*b*, and 230*c* are disposed between first insulating layer 221 and bonding surface 50*b* of cap unit 50 with wiring substrate 220, in the same manner as each of the spacer layers according to Embodiment 1. Each of the spacer layers forms a protrusion above first insulating layer 221 in the same manner as each of the metal layers.

Spacer layer 230*a* has an L-shape in the top view of wiring substrate 220 and is composed of two portions. The first portion of spacer layer 230*a* is disposed at a position rearward from rear end surface 41R in the optical axis direction. The first portion of spacer layer 230*a* is disposed between semiconductor light-emitting element 41 and first extraction electrode 237 in the lateral direction. The first portion of spacer layer 230*a* extends in the optical axis direction. The second portion of spacer layer 230*a* is disposed at a position rearward from rear end surface 41R of semiconductor light-emitting element 41 in the optical axis direction. The second portion of spacer layer 230*a* is connected to the first portion and extends in the lateral direction.

Spacer layer 230*b* has an L-shape in the top view of wiring substrate 220 and is composed of two portions. The first portion of spacer layer 230*b* is disposed at a position rearward from rear end surface 41R in the optical axis direction. In addition, the first portion of spacer layer 230*b* is disposed between semiconductor light-emitting element 41 and second extraction electrode 238 in the lateral direction. The first portion of spacer layer 230*b* extends in the optical axis direction. The second portion of spacer layer 230*b* is disposed at a position rearward from rear end surface 41R in the optical axis direction. The second position of spacer layer 230*b* is disposed between the first portion of spacer layer 230*b* and spacer layer 230*a*. The second portion of spacer layer 230*b* is connected to the first portion and extends in the lateral direction.

Spacer layer 230*c* is composed of three portions. The first portion of spacer layer 230*c* is disposed between semiconductor light-emitting element 41 and first extraction electrode 237 in the lateral direction. The first portion of spacer layer 230*c* is disposed at a position forward from first metal layer 231 in the optical axis direction. The first portion of spacer layer 230*c* extends in the optical axis direction. The second portion of spacer layer 230*c* is disposed at a position forward from emission surface 41F. The second portion of spacer layer 230*c* is connected to the first portion and extends in the lateral direction. The third portion of spacer layer 230*c* is disposed between semiconductor light-emitting element 41 and second extraction electrode 238 in the lateral direction. The third portion of spacer layer 230*c* is disposed at a position forward from second metal layer 232 in the optical axis direction. The third portion of spacer layer 230*c* is connected to the second portion and extends in the optical axis direction.

Second insulating layer 222 is an insulating layer disposed above first insulating layer 221 as illustrated in FIG. 17. Second insulating layer 222 covers at least a portion of first metal layer 231, second metal layer 232, third metal layer 233, fourth metal layer 234, and spacer layers 230*a*, 230*b*, and 230*c*, in the same manner as second insulating layer 22 according to Embodiment 1.

Protection film 225 is a metal film disposed, for example, at a position at which submount 45 is bonded in wiring substrate 220, as illustrated in FIG. 17. Protection film 225 is dispose in a region corresponding to opening 221*a* of first insulating layer 221 of metal substrate 228, in the same manner as protection film 25 according to Embodiment 1. Protection film 235 is disposed on, for example, a portion of the upper surface of first metal layer 231, second metal layer 232, third metal layer 233, and fourth metal layer 234, in the same manner as protection film 35 according to Embodiment 1. It should be noted that, according to the present embodiment, submount 45 is disposed inside opening 221*a* of first insulating layer 221, and mounted above metal substrate 228 via bonding material 226 and protection film 225. Bonding material 226 comprises, for example, AuSn solder or the like.

First extraction electrode 237 and second extraction electrode 238 are each an example of the extraction electrode, and are electrically connected to first metal layer 231 and second metal layer 232, respectively. According to the present embodiment, first extraction electrode 237 and second extraction electrode 238 are disposed above first metal layer 231 and second metal layer 232, respectively. First extraction electrode 237 and second extraction electrode 238 are disposed in proximity to first pad electrode 231*p* and second pad electrode 232*p*, respectively. With this configuration, the lengths of first metal layer 231 and second metal layer 232 can be reduced, and thus it is possible to reduce the resistance of first metal layer 231 and second metal layer 232.

First extraction electrode 237 and second extraction electrode 238 each have an annular shape, and include, in the center portion, electrode through-hole 237*a* and electrode through-hole 238*a*, respectively, which penetrate through wiring substrate 220. Through-holes 228*a* and 228*b* are holes for inserting a fixing component such as a screw when fixing wiring substrate 220 to closely adhere to a heat sink or the like. According to the present embodiment, electrode through-holes 237*a* and 238*a* are located on one side and the other side of wiring substrate 220, respectively, relative to the region in which semiconductor light-emitting element 41 is disposed. In other words, semiconductor light-emitting element 41 is disposed between electrode through-hole 237*a* and electrode through-hole 238*a*.

Bonding layer 255 is a component that bonds bonding surface 50*b* of cap unit 50 and upper surface 220*a* of wiring substrate 220. According to the present embodiment, bonding layer 255 includes first auxiliary bonding film 255*a*, bonding material 255*b*, and second auxiliary bonding film 255*c*. First auxiliary bonding film 255*a* and second auxiliary bonding film 255*c* are metal films disposed above bonding surface 50*b* and the upper surface of second insulating layer 222, respectively, and comprise Ni, Au, or the like. These auxiliary bonding films allow cap unit 50 and second insulating layer 222 to be easily bonded by bonding material 255*b*. Bonding material 255*b* is an alloy material that comprises AuSn solder, or the like.

Figure 18:
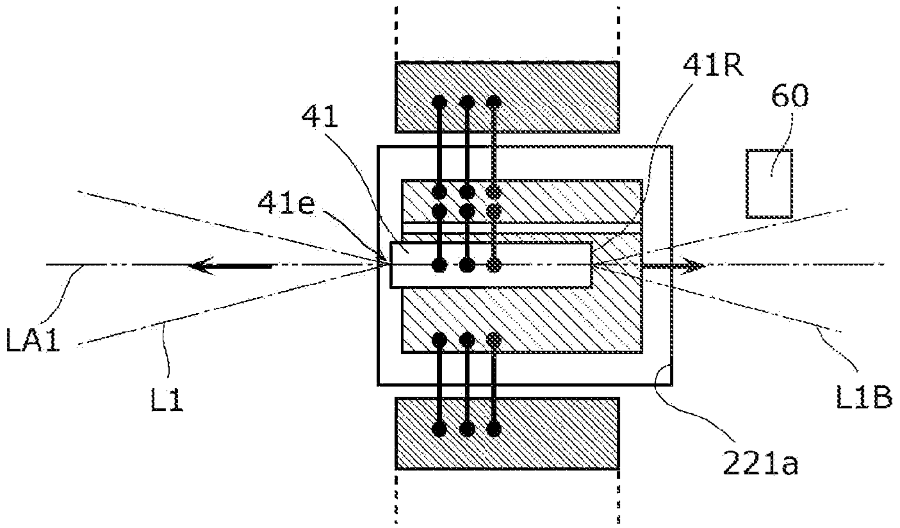
FIG. 18 is a top view illustrating the placement of a temperature sensing element according to Embodiment 2.

Temperature sensing element 60 is an element equivalent to temperature sensing element 60 according to Embodiment 1. According to the present embodiment, temperature sensing element 60 is covered by cap unit 50 as illustrated in FIG. 16 and FIG. 17. With this configuration, temperature sensing element 60 is not exposed to outside air, and thus the effect of outside air on temperature sensing is suppressed. As a result, it is possible to accurately sense a temperature. Hereinafter, the placement of temperature sensing element 60 according to the present embodiment will be described with reference to FIG. 18. FIG. 18 is a top view illustrating the placement of temperature sensing element 60 according to the present embodiment.

As illustrated in FIG. 18, temperature sensing element 60 according to the present embodiment is disposed at a position that does not intersect optical axis LA1 of semiconductor light-emitting element 41. With this configuration, it is possible to inhibit temperature sensing element 60 from being irradiated with emitted light L1B emitted from rear end surface 41R of semiconductor light-emitting element 41, without providing a shielding component. As a result, it is possible to accurately sense the temperature of wiring substrate 220 by temperature sensing element 60.

Connector 270 is a connecting component including terminals each of which is connected to a corresponding one of third metal layer 233 and fourth metal layer 234. According to the present embodiment, unlike connector 70 according to Embodiment 1, connector 270 does not have terminals that are connected to first metal layer 231 and second metal layer 232.

2-2. Advantageous Effects

Figure 19A:
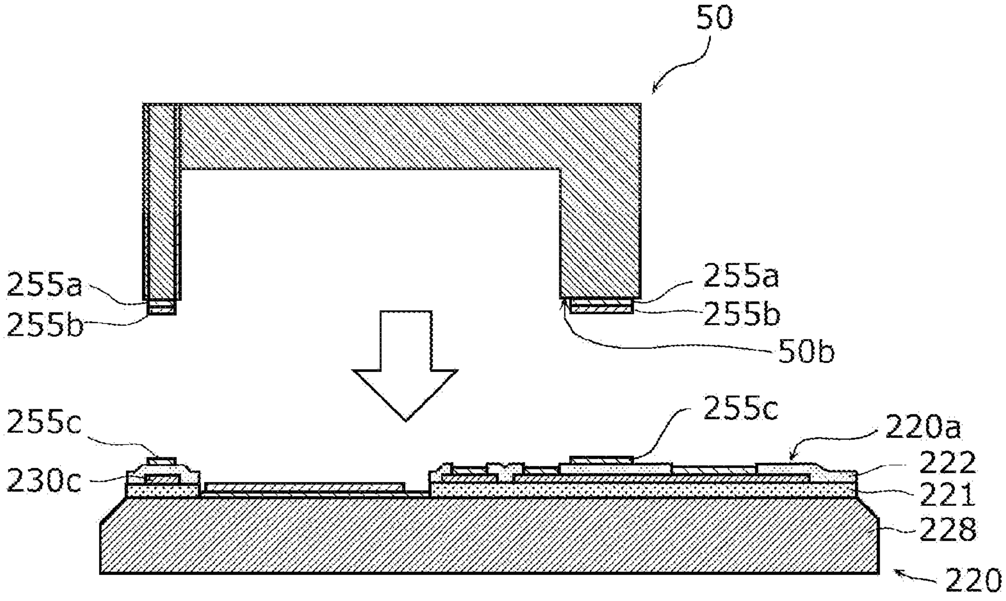
FIG. 19A is a first cross-sectional view schematically illustrating the method of bonding a cap unit to a wiring substrate of the semiconductor light-emitting device according to Embodiment 2.
Figure 19B:
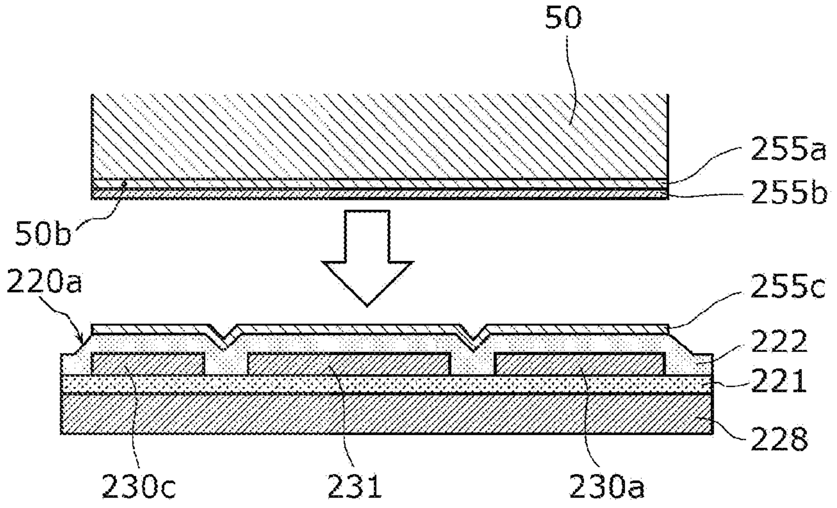
FIG. 19B is a second cross-sectional view schematically illustrating the method of bonding the cap unit to the wiring substrate of the semiconductor light-emitting device according to Embodiment 2.
Figure 19C:
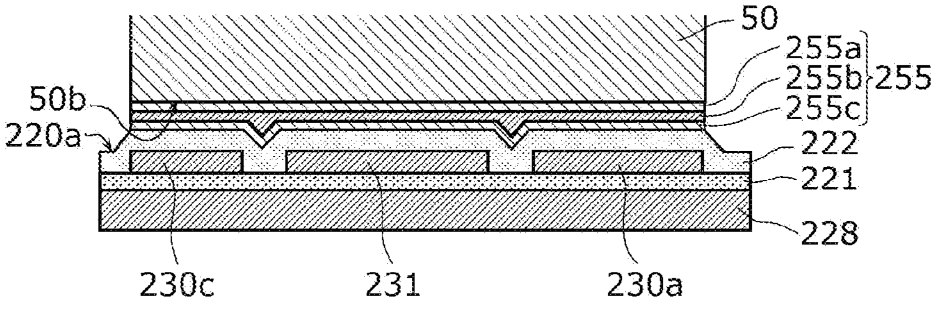
FIG. 19C is a third cross-sectional view schematically illustrating the method of bonding the cap unit to the wiring substrate of the semiconductor light-emitting device according to Embodiment 2.

Next, the advantageous effects of semiconductor light-emitting device 210 according to the present embodiment will be described with reference to FIG. 19A to FIG. 19C. FIG. 19A to FIG. 19C are each a schematic cross-sectional view which explains the method of bonding cap unit 50 to wiring substrate 220 of semiconductor light-emitting device 210 according to the present embodiment. The cross-section surface illustrated in FIG. 19A is equivalent to that illustrated in FIG. 17 other than that components other than wiring substrate 220 and cap unit 50 are omitted. In addition, FIG. 19B and FIG. 19C each illustrate semiconductor light-emitting device 210 in a cross-section that is taken along line XIX-XIX indicated in FIG. 16 and is perpendicular to upper surface 220*a* of wiring substrate 220. FIG. 19A and FIG. 19B each illustrate the state before cap unit 50 and wiring substrate 220 are bonded, and FIG. 19C illustrates the state after cap unit 50 and wiring substrate 220 are bonded.

First, as illustrated in FIG. 19A and FIG. 19B, first auxiliary bonding film 255*a* and bonding material 255*b* are formed above bonding surface 50*b* of cap unit 50 in stated order. Meanwhile, second auxiliary bonding film 255*c* is formed above upper surface 220*a* of wiring substrate 220 in the region facing bonding surface 50*b* of cap unit 50. As illustrated in FIG. 19B, in the same manner as Embodiment 1, it is possible to reduce the dimensions of the recess formed in upper surface 220*a* of wiring substrate 220 by each of the spacer layers, in the present embodiment as well.

Then, cap unit 50 is disposed above upper surface 220*a* of wiring substrate 220. Wiring substrate 220 is then heated to melt bonding material 255*b* between first auxiliary bonding film 255*a* and second auxiliary bonding film 255*c*. Then, bonding material 255*b* is solidified by cooling wiring substrate 220. In this manner, it is possible to bond first auxiliary bonding film 255*a* and second auxiliary bonding film 255*c* by bonding material 255*b*, as illustrated in FIG. 19C. At this time, as described above, the dimensions of the recess formed in upper surface 220*a* of wiring substrate 220 are reduced, and thus it is possible to fill the recess formed in upper surface 220*a* of wiring substrate 220 by bonding material 255*b*, as illustrated in FIG. 19C. As a result, it is possible to seal the gap between cap unit 50 and wiring substrate 220. It is therefore possible, in the same manner as Embodiment 1, to implement semiconductor light-emitting device 210 which is high in optical output and reliability in the present embodiment as well.

2-3. Light Source Device

Figure 20:
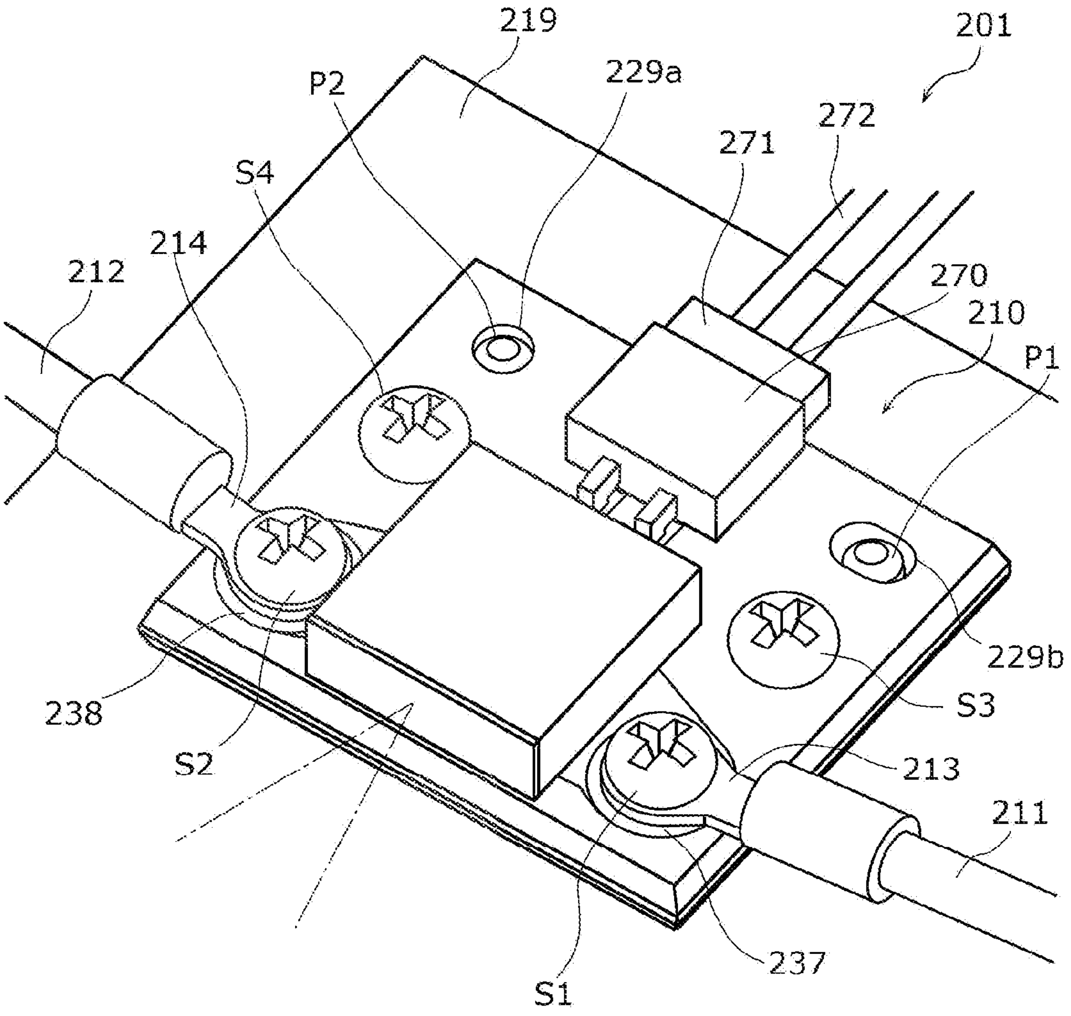
FIG. 20 is a perspective view illustrating the configuration of a light source device according to Embodiment 2.
Figure 21:
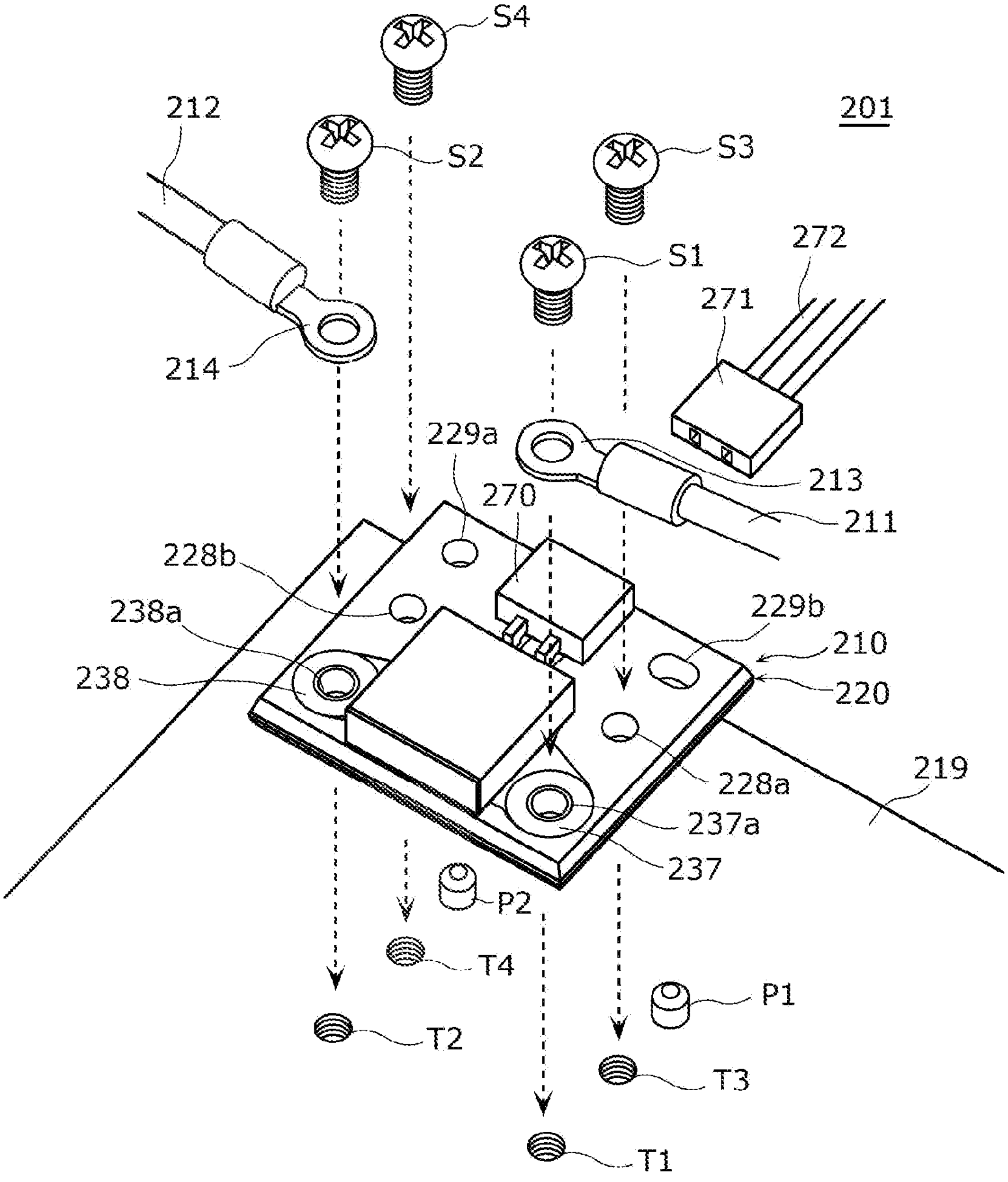
FIG. 21 is an exploded perspective view illustrating the configuration of the light source device according to Embodiment 2.

Next, a light source device in which semiconductor light-emitting device 210 according to the present embodiment is used will be described with reference to FIG. 20 and FIG. 21. FIG. 20 and FIG. 21 are a perspective view and an exploded perspective view, respectively, each of which schematically illustrates the configuration of light source device 201 according to the present embodiment.

As illustrated in FIG. 20 and FIG. 21, light source device 201 includes semiconductor light-emitting device 210, heat sink 219, terminal fixing screws S1 and S2, and fixing screws S3 and S4. According to the present embodiment, light source device 201 further includes cable 272 including connector 271, and cable 211 and cable 212 which include terminal 213 and terminal 214, respectively.

Heat sink 219 is a heat-dissipating component comprising a material that is high in thermal conductivity, such as metal. Heat sink 219 comprises, for example, iron, iron alloy, aluminum, aluminum alloy, copper, or the like. In addition, aluminum alloy having a surface on which alumite treatment has been applied, or copper having a surface on which Ni plating has been applied may also be used. In heat sink 219, positioning pins P1 and P2 and threaded holes T1 to T4 are formed, as illustrated in FIG. 21. Positioning pin P1 and positioning pin P2 are inserted to positioning hole 229*a* and positioning hole 229*b* of semiconductor light-emitting device 210, respectively.

Semiconductor light-emitting device 210 is fixed to closely adhere to heat sink 219, using terminal fixing screws S1 and S2, and fixing screws S3 and S4. More specifically, fixing screws S3 and S4 penetrate through through-holes 228*a* and 228*b*, respectively, in the wiring substrate and are fixed to threaded holes T3 and T4, respectively, in heat sink 219.

Terminal fixing screw S1 penetrates through a hole formed in terminal 213 and electrode through-hole 237*a* in wiring substrate 220, and is fixed to threaded hole T1 in heat sink 219. Terminal fixing screw S1 penetrates through electrode through-hole 237*a*, and terminal 213 is disposed between terminal fixing screw S1 and first extraction electrode 237. With this configuration, first extraction electrode 237 and terminal 213 are electrically connected.

Terminal fixing screw S2 is fixed to threaded hole T2 in heat sink 219 through a hole formed in terminal 214 and electrode through-hole 238*a* in wiring substrate 220. Terminal fixing screw S2 penetrates through electrode through-hole 238*a*, and terminal 214 is disposed between terminal fixing screw S2 and second extraction electrode 238. With this configuration, second extraction electrode 238 and terminal 214 are electrically connected.

As described above, it is possible to fix semiconductor light-emitting device 210 to heat sink 219. In this manner, since semiconductor light-emitting device 210 can be firmly fixed to heat sink 219, using terminal fixing screws S1 and S2, as well as fixing screws S3 and S4, heat generated by the semiconductor light-emitting element 41 of semiconductor light-emitting device 210 can be effectively dissipated from metal substrate 228 to heat sink 219.

In addition, according to the above-described configuration, it is possible to electrically connect terminal 213 and terminal 214 to first extraction electrode 237 and second extraction electrode 238, respectively. As a result, it is possible to supply a large amount of current to semiconductor light-emitting device 210 via cables 211 and 212.

It should be noted that fixing screws S3 and S4 comprise a metal material, for example. On the other hand, for terminal fixing screws S1 and S2, screws that comprise an insulating material such as plastic, ceramic, etc. or that are coated with insulation are used to inhibit short circuits between each of the terminals and metal substrate 228 and between each of the terminals and heat sink.

Connector 271 is connected to connector 270. With this configuration, it is possible to obtain a signal from temperature sensing element 60 via cable 272.

Variation 1

Figure 22A:
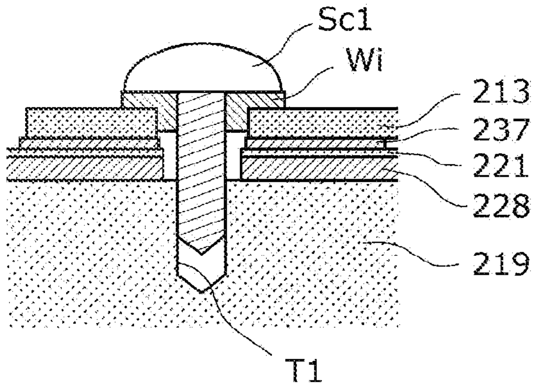
FIG. 22A is a cross-sectional view schematically illustrating the state in which a terminal fixing screw is fixed to a heat sink according to Variation 1 of Embodiment 2.
Figure 22B:
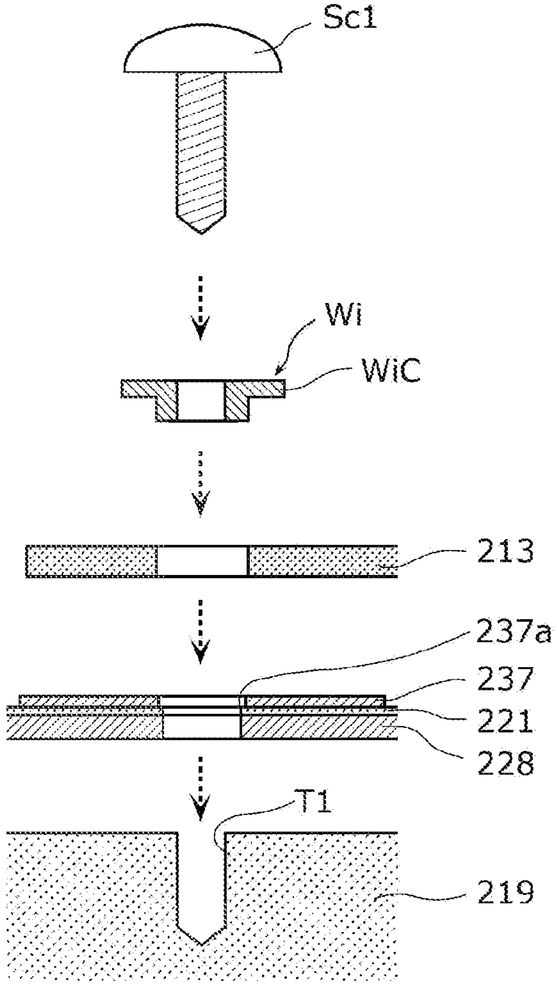
FIG. 22B is an exploded cross-sectional view illustrating the method of fixing the terminal fixing screw to the heat sink according to Variation 1 of Embodiment 2.

Next, Variation 1 of the light source device according to the present embodiment will be described. The light source device according to the present variation has a configuration in which a terminal fixing screw or the like for fixing more firmly semiconductor light-emitting device 210 to heat sink 219, etc. is included. Hereinafter, the configuration of the terminal fixing screw, etc. of the light source device according to the present variation will be described with reference to FIG. 22A and FIG. 22B. FIG. 22A is a cross-sectional view schematically illustrating the state in which terminal fixing screw Sc1 is fixed to heat sink 219 according to the present variation. FIG. 22B is an exploded cross-sectional view illustrating the method of fixing terminal fixing screw Sc1 to heat sink 219 according to the present variation.

According to the present variation, heat sink 219 includes a surface that is conductive, and comprises, for example, an aluminum alloy without surface treatment. According to the present variation, terminal 213 and wiring substrate 220 are fixed to threaded hole T1, etc. of heat sink 219, using terminal fixing screw Sc1 or the like that comprises iron, stainless steel, or other conductive material. In this case, washer Wi (i.e., a spacer) having a ring shape and comprising an insulating material is inserted between terminal fixing screw Sc1 and terminal 213, as illustrated in FIG. 22A and FIG. 22B. With this configuration, it is possible to inhibit short circuit between terminal 213 and heat sink 219 via terminal fixing screw Sc1. Moreover, according to the present variation, washer Wi is a flanged washer including flange WiC. By using a flanged washer, a portion of washer Wi can be placed inside the through-hole of terminal 213 or inside electrode through-hole 237*a* of the wiring substrate, and thus it is possible to reduce the possibility of short circuit between terminal fixing screw Sc1 and terminal 213 or between terminal fixing screw Sc1 and first extraction electrode 237 inside the hole. It is possible to fix terminal 214 and wiring substrate 220 to heat sink 219 that comprises a metal material, with the terminal fixing screw that comprises a metal material, while inhibiting short circuit between terminal 214 and heat sink 219 in the same manner as above.

With this configuration, it is possible to more firmly fix semiconductor light-emitting device 210 and heat sink 219, as well as closely adhere semiconductor light-emitting device 210 and heat sink 219. As a result, it is possible to efficiently dissipate heat from semiconductor light-emitting element 41 of semiconductor light-emitting device 210 to heat sink 219.

Embodiment 3

Figure 23:
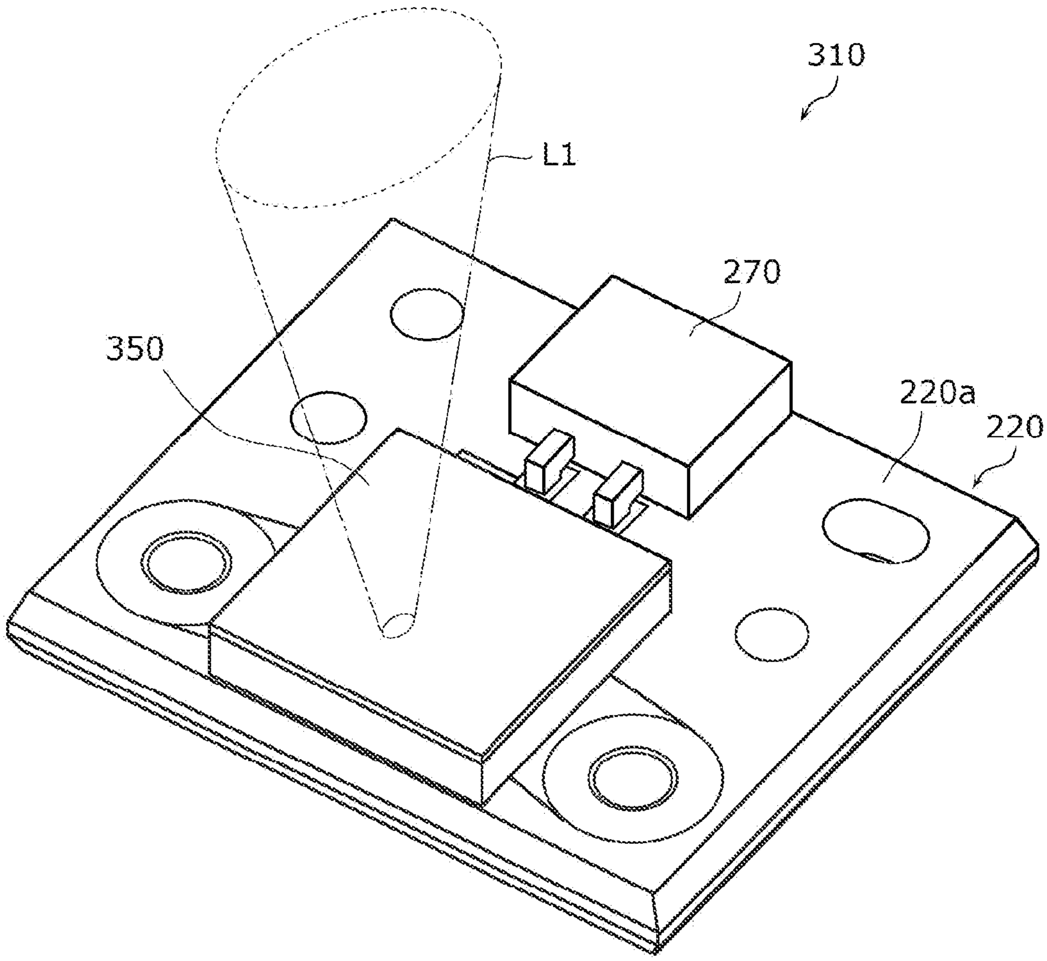
FIG. 23 is a perspective view schematically illustrating the overall configuration of a semiconductor light-emitting device according to Embodiment 3.
Figure 24:
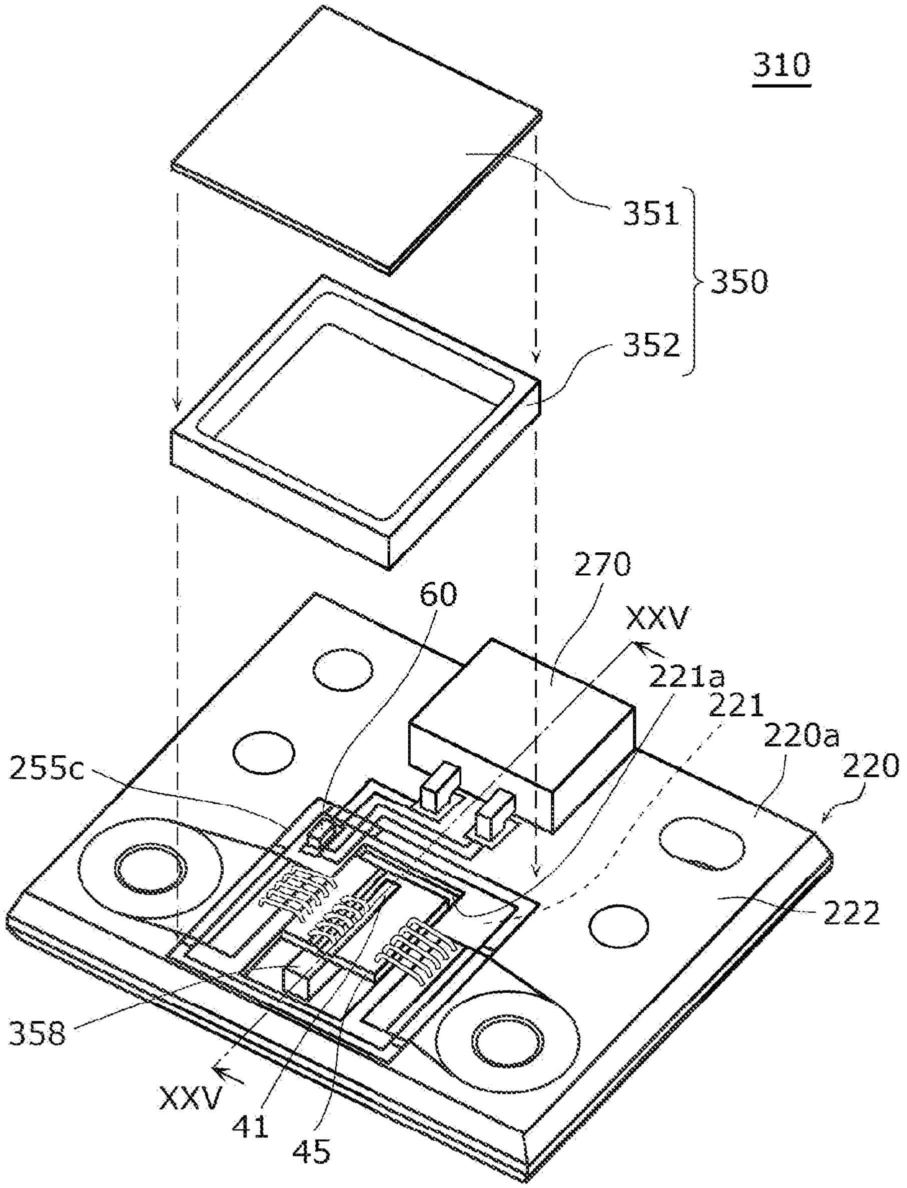
FIG. 24 is an exploded perspective view schematically illustrating the overall configuration of the semiconductor light-emitting device according to Embodiment 3.
Figure 25:
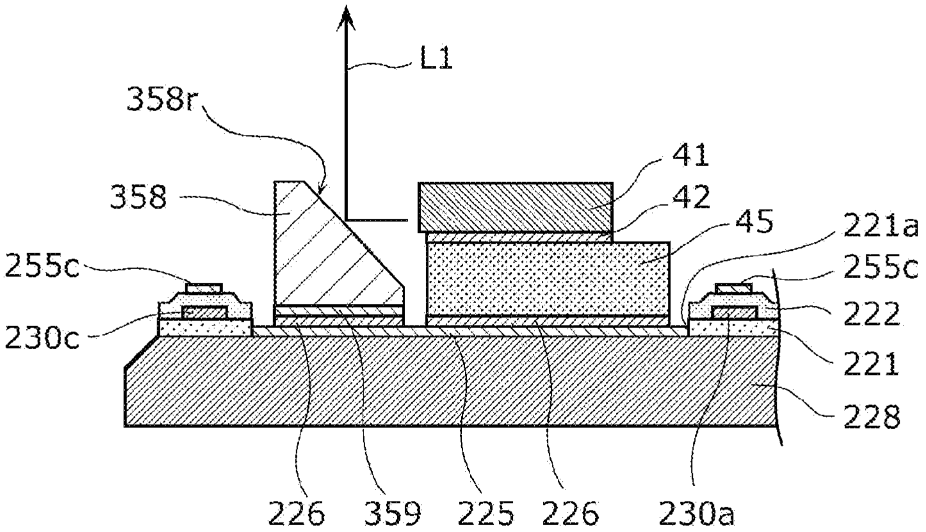
FIG. 25 is a cross-sectional view schematically illustrating the overall configuration of the semiconductor light-emitting device according to Embodiment 3.

Next, a semiconductor light-emitting device according to Embodiment 3 will be described. The semiconductor light-emitting device according to the present embodiment differs from semiconductor light-emitting device 210 according to Embodiment 2 mainly in the direction of extraction of emitted light. The following describes the semiconductor light-emitting device according to the present embodiment focusing on the differences from semiconductor light-emitting device 210 according to Embodiment 2, with reference to FIG. 23 to FIG. 25. FIG. 23, FIG. 24, and FIG. 25 are a perspective view, an exploded perspective view, and cross-sectional view, respectively, each of which schematically illustrates the overall configuration of semiconductor light-emitting device 310 according to the present embodiment. FIG. 25 illustrates a portion of the cross-section surface of semiconductor light-emitting device 310 taken along line XXV-XXV indicated in FIG. 24. In addition, in FIG. 25, semiconductor light-emitting device 310 in a state before cap unit 350 is bonded to wiring substrate 220 is indicated.

As illustrated in FIG. 23 and FIG. 24, semiconductor light-emitting device 310 according to the present embodiment includes wiring substrate 220, cap unit 350, and connector 270. As illustrated in FIG. 24, semiconductor light-emitting device 310 further includes semiconductor light-emitting element 41, submount 45, reflective optical element 358, and temperature sensing element 60. As illustrated in FIG. 23 and FIG. 25, semiconductor light-emitting device 310 according to the present embodiment emits emitted light L1, which has been emitted by semiconductor light-emitting element 41, in the direction perpendicular to upper surface 220*a* of wiring substrate 220. Specifically, as illustrated in FIG. 25, semiconductor light-emitting device 310 includes reflective optical element 358, and emitted light L1 from semiconductor light-emitting element 41 is reflected by reflective optical element 358 and propagates in the direction perpendicular to upper surface 220*a* of wiring substrate 220. More specifically, reflective surface 358*r* of reflective optical element 358 is disposed at a position facing the emission surface of semiconductor light-emitting element 41. Reflective surface 358*r* is slanted at 45 degrees with respect to the optical axis of semiconductor light-emitting element 41. With this configuration, emitted light L1 is reflected by reflective surface 358*r*, and propagates in the direction perpendicular to upper surface 220*a* of wiring substrate 220 and away from wiring substrate 220.

As illustrated in FIG. 25, reflective optical element 358 is bonded to protection film 225 of opening 221*a* via auxiliary bonding film 359 having a configuration equivalent to the configuration of first auxiliary bonding film 255*a* and bonding material 226.

As illustrated in FIG. 24, cap unit 350 according to the present embodiment includes top plate 351 that is transparent and has a rectangular shape, and holder 352. Top plate 351 is a light-transmissive window having a configuration equivalent to the configuration of side wall 51 of cap unit 50 according to Embodiment 2. In other words, top plate 351 is a light-transmissive window including an inorganic light-transmissive plate and an antireflection film disposed on the inorganic light-transmissive plate. With this configuration, emitted light L1 from semiconductor light-emitting element 41 passes through top plate 351 that is the light-transmissive window. Holder 352 is a frame-shaped component including four side walls connected to four sides at a peripheral edge of top plate 351.

According to the above-described configuration, it is possible to easily extract emitted light L1 from semiconductor light-emitting element 41 from the upper surface of cap unit 350 to the outside.

Cap unit 350 is, for example, formed by bonding top plate 351 to holder 352 having a frame shape, by optical contact or laser bonding. As a result, top plate 351 and the peripheral portion of holder 352 are closely adhere to each other. In addition, holder 352 includes a surface facing top plate 351 and the first auxiliary bonding film (not illustrated) is disposed on the surface.

Spacer layers are each disposed between first insulating layer 221 and the bonding surface of cap unit 350 with upper surface 220*a* of wiring substrate 220, in semiconductor light-emitting device 310 according to the present embodiment as well. Second auxiliary bonding film 255*c* is disposed above each of the spacer layers. As a result of bonding holder 352 and wiring substrate 220 by bonding adhesive, it is possible to seal the gap between cap unit 350 and wiring substrate 220. With this configuration, the advantageous effects equivalent to those of semiconductor light-emitting device 210 according to Embodiment 2 are yielded by semiconductor light-emitting device 310 according to the present embodiment as well.

It should be noted that, as the configuration between cap unit 350 and wiring substrate 220, the configuration equivalent to that of Embodiment 1 may be employed.

It should be noted that, although semiconductor light-emitting device 310 including a single semiconductor light-emitting element 41 has been described as an example in the above-described embodiment, semiconductor light-emitting device 310 may include a plurality of semiconductor light-emitting elements 41 (see FIG. 26 which will be described later). In this case, the reflective optical element may be disposed at a position facing the emission surface of each of the plurality of semiconductor light-emitting elements 41. The plurality of semiconductor light-emitting elements 41 may be arranged in an array or in a matrix.

In addition, although the reflective optical element including a reflective surface slanted at 45 degrees with respect to the optical axis has been disposed at a position facing the emission surface of semiconductor light-emitting element 41 according to the above-described embodiment, other optical element may be disposed. For example, a reflective optical element provided with a wavelength conversion member comprising a phosphor layer or the like disposed on a reflective mirror surface slanted at any angle greater than or equal to 10 degrees and less than or equal to 80 degrees with respect to the optical axis may be disposed. In this case, for example, a semiconductor laser element using a nitride semiconductor material with emitted light L1 having a peak wavelength in the wavelength range of approximately from greater than or equal to 380 nm to less than or equal to 490 nm may be used as semiconductor light-emitting element 41. With this configuration, a portion of emitted light L1 emitted from semiconductor light-emitting element 41 is wavelength-converted by the reflective optical element, thereby making it possible to emit light including the portion of emitted light L1 and the wavelength-converted light from top plate 351 of semiconductor light-emitting device 310. More specifically, emitted light L1 may be light having a wavelength in the blue region and the wavelength-converted light may be light having a wavelength in the yellow region. With this configuration, it is possible to implement a semiconductor light-emitting device which emits white light that is high in luminance and optical output from top plate 351, and is highly reliable.

In addition, as the reflective optical element, a diffractive optical element or diffuse optical element may be used. With this configuration, it is possible to emit emitted light L1 that has been emitted from semiconductor light-emitting element 41 from top plate 351 in a predetermined emission pattern in any direction by the reflective optical element. In this case, for example, by using emitted light L1 having a wavelength in the 900 nm band, it is possible to implement semiconductor light-emitting device 310 that emits infrared light that is high in optical output, and is highly reliable. Such semiconductor light-emitting device 310, for example, can be used for light detection and ranging (Lidar) device, etc.

Variation

Next, a semiconductor light-emitting device according to a variation of the present embodiment will be described. The semiconductor light-emitting device according to the present variation includes a plurality of semiconductor light-emitting elements. A reflective optical element is disposed at a position facing the emission surface of each of the plurality of semiconductor light-emitting elements 41. The plurality of semiconductor light-emitting elements 41 and reflective optical elements are arranged in a matrix. Hereinafter, the configuration of the semiconductor light-emitting device according to the present variation will be described with reference to FIG. 26.

Figure 26:
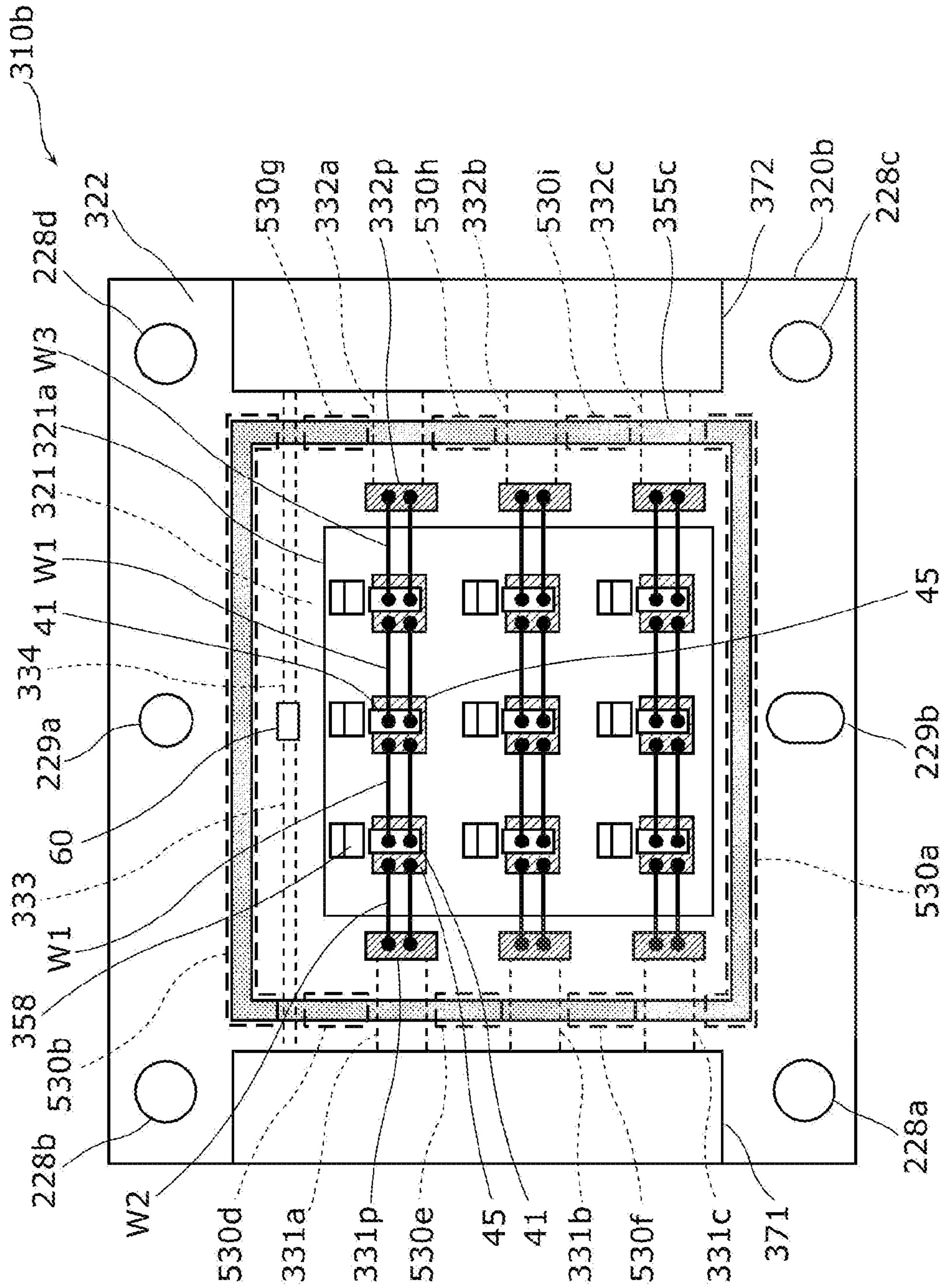
FIG. 26 is a top view schematically illustrating the overall configuration of the semiconductor light-emitting device according to a variation of Embodiment 3.

FIG. 26 is a top view schematically illustrating the overall configuration of semiconductor light-emitting device 310*b* according to the present variation. It should be noted that FIG. 26 illustrates the state before a cap unit is attached to wiring substrate 320*b*, for showing the inside of the cap unit. For this reason, second auxiliary bonding film 355*c* that is disposed along the bonding surface of the cap unit is illustrated. The plurality of semiconductor light-emitting elements 41 and reflective optical elements 358 are arranged in a matrix of three rows and three columns according to the present variation.

Semiconductor light-emitting device 310*b* according to the present variation includes wiring substrate 320*b*, a plurality of semiconductor light-emitting elements 41, a plurality of submounts 45, a cap unit (not illustrated in FIG. 26), temperature sensing element 60, and connectors 371 and 372.

Wiring substrate 320*b* includes a metal substrate (not illustrated in FIG. 26), first insulating layer 321, first metal layers 331*a* to 331*c*, second metal layers 332*a* to 332*c*, third metal layer 333, fourth metal layer 334, spacer layers 530*a* to 530*i*, a plurality of first pad electrode 331*p*, a plurality of second pad electrode 332*p*, and second insulating layer 322.

Positioning holes 229*a* and 229*b* and through-holes 228*a* to 228*d* are formed in wiring substrate 320*b*.

First insulating layer 321 is disposed above the metal substrate, and includes opening 321*a* formed therein.

First metal layers 331*a* to 331*c* are disposed above first insulating layer 321, and connected to first pad electrode 331*p* and connector 371. Second metal layers 332*a* to 332*c* are disposed above first insulating layer 321, and connected to second pad electrode 332*p* and connector 372.

Third metal layer 333 is disposed above first insulating layer 321, and connected to temperature sensing element 60 and connector 371. Fourth metal layer 334 is disposed above first insulating layer 321, and connected to temperature sensing element 60 and connector 372.

Second insulating layer 322 is disposed above first insulating layer 321, and covers at least a portion of each of the first metal layers, each of the second metal layers, and each of the spacer layers.

Spacer layers 530*a* to 530*i* are disposed between the bonding surface of the cap unit and first insulating layer 321, at positions different from the positions of each of the first metal layers and each of the second metal layers. Each of the spacer layers is disposed along the bonding surface of the cap unit in the present variation as well.

According to the present variation, semiconductor light-emitting element 41 is mounted above submount 45. The three semiconductor light-emitting elements, which are aligned in the same row (i.e., arranged in the horizontal direction of FIG. 26), are electrically connected in series by metal wire W1. First pad electrode 331*p* and second pad electrode 332*p* are disposed in the lateral direction of three semiconductor light-emitting elements 41 (horizontal direction of FIG. 26) arranged in the row direction. In other words, the plurality of semiconductor light-emitting elements 41 which are electrically connected in series are aligned between first pad electrode 331*p* and second pad electrode 332*p*. According to the present variation, three semiconductor light-emitting elements 41 are arranged in the row direction. Three first pad electrodes 331*p* and three second pad electrodes 332*p* are arranged respectively in the column direction so as to correspond to a plurality of semiconductor light-emitting element groups in three columns. First pad electrodes 331*p* are each connected to semiconductor light-emitting element 41 by metal wire W2. Second pad electrodes 332*p* are each connected to semiconductor light-emitting element 41 by metal wire W3. The plurality of first pad electrodes 331*p* are each connected to connector 371 provided above wiring substrate 320*b* at a facing position by a corresponding one of the plurality of first metal layers 331*a* to 331*c*. The plurality of second pad electrodes 332*p* are each connected to connector 372 provided above wiring substrate 320*b* at a facing position by a corresponding one of the plurality of second metal layers 332*a* to 332*c*.

According to the above-described configuration, it is possible to increase the optical output of the emitted light emitted from semiconductor light-emitting device 310*b* compared to the case where a single semiconductor light-emitting element 41 is used. In addition, although the heat generated in semiconductor light-emitting device 410 increases with increase in the optical output, it is possible, with semiconductor light-emitting device 310*b* according to the present variation, to efficiently discharge the heat using a heat sink or the like. As a result, it is possible to inhibit degradation of each of the semiconductor light-emitting elements. It is thus possible to implement semiconductor light-emitting device 310*b* which is high in optical output and is highly reliable. Such semiconductor light-emitting device 310*b* as described above can be used, for example, as a light source for a projector by using, as semiconductor light-emitting element 41, a semiconductor laser element that emits emitted light having a wavelength in the visible light region such as blue, green, and red.

Embodiment 4

Next, a semiconductor light-emitting device according to Embodiment 4 will be described. The semiconductor light-emitting device according to the present embodiment differs from semiconductor light-emitting device 10 according to Embodiment 1 in that, for example, a plurality of semiconductor light-emitting elements are included. The following describes the semiconductor light-emitting device according to the present embodiment focusing on the differences from semiconductor light-emitting device 10 according to Embodiment 1, with reference to FIG. 27.

Figure 27:
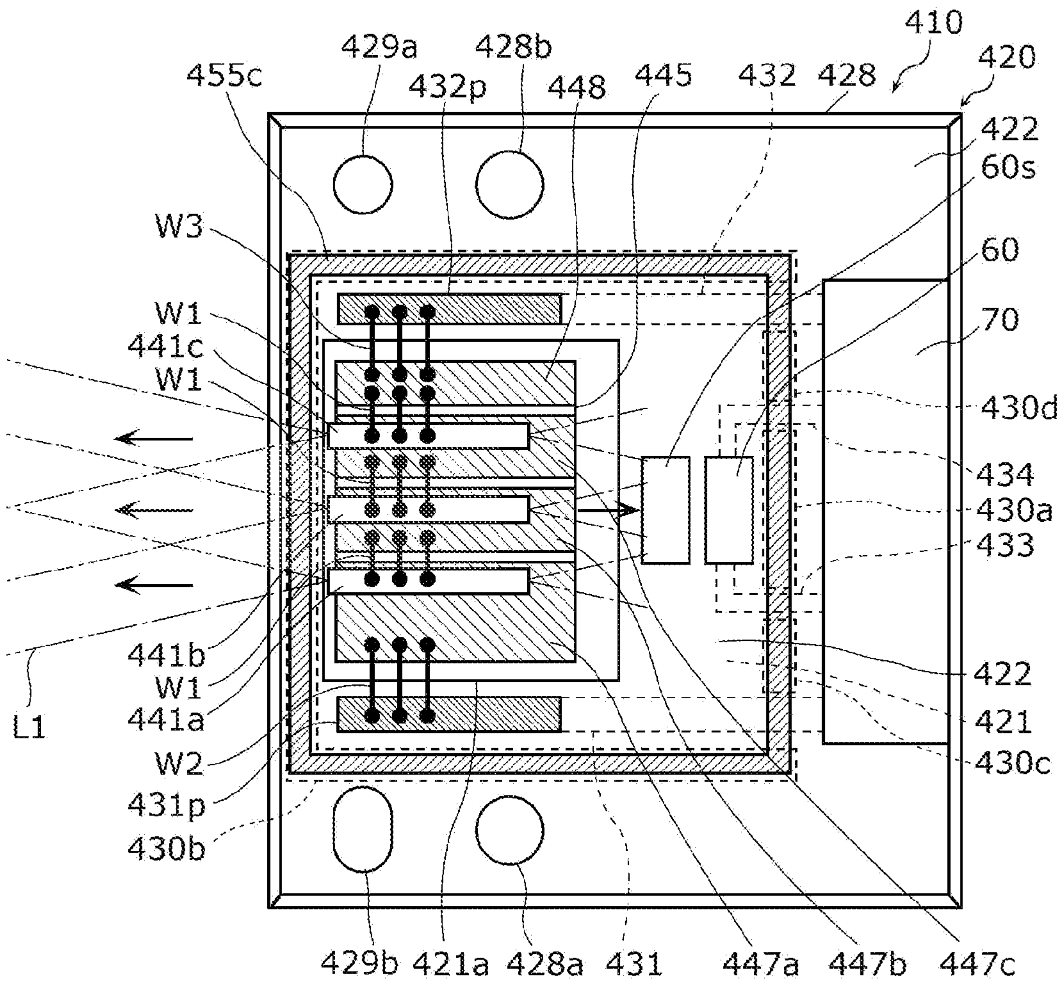
FIG. 27 is a top view schematically illustrating the overall configuration of a semiconductor light-emitting device according to Embodiment 4.

FIG. 27 is a top view schematically illustrating the overall configuration of semiconductor light-emitting device 410 according to the present embodiment. It should be noted that FIG. 27 illustrates the state before a cap unit is attached to wiring substrate 420, for showing the inside of cap unit 450. For this reason, second auxiliary bonding film 455*c* that is disposed along the bonding surface of the cap unit is illustrated.

Semiconductor light-emitting device 410 according to the present embodiment includes wiring substrate 420, cap unit 450, semiconductor light-emitting elements 441*a* to 441*c*, submount 445, temperature sensing element 60, shielding component 60*s*, and connector 70.

Cap unit 450, temperature sensing element 60, and connector 70 have configurations equivalent to the configurations of cap unit 50, temperature sensing element 60, and connector 70, according to Embodiment 1, respectively. It should be noted that cap unit 450 includes side wall 451 that is a light-transmissive window. In addition, shielding component 60*s* includes a configuration equivalent to the configuration of shielding component 60*s* according to Variation 3 of Embodiment 1. It should be noted that, according to the present embodiment, temperature sensing element 60 and shielding component 60*s* are disposed inside cap unit 450.

Wiring substrate 420 includes metal substrate 428, first insulating layer 421, second insulating layer 422, spacer layers 430*a*, 430*b*, 430*c*, and 430*d*, first metal layer 431, second metal layer 432, third metal layer 433, fourth metal layer 434, first pad electrode 431*p*, second pad electrode 432*p*, and a protection film (not illustrated in FIG. 27), in the same manner as wiring substrate 20 according to Embodiment 1. In FIG. 27, spacer layers 430*a*, 430*b*, 430*c*, and 430*d*, first metal layer 431, second metal layer 432, third metal layer 433, and fourth metal layer 434 are hidden under second insulation layer 422, and thus indicated as dashed lines.

According to the present embodiment, in the same manner as wiring substrate 20 according to Embodiment 1, through-holes 428*a* and 428*b* and positioning holes 429*a* and 429*b* are provided in wiring substrate 420.

Opening 421*a* is formed in first insulating layer 421 in the same manner as first insulating layer 21 according to Embodiment 1. A protection film comprising Ni, Au, or the like is formed in opening 421*a* to form a mounting surface for mounting each semiconductor light-emitting element. According to the present embodiment, semiconductor light-emitting elements 441*a* to 441*c* are disposed in the opening via submount 445.

First metal layer 431, second metal layer 432, third metal layer 433, fourth metal layer 434, first pad electrode 431*p*, and second pad electrode 432*p* have the same configurations as the configurations of first metal layer 431, second metal layer 432, third metal layer 433, fourth metal layer 434, first pad electrode 31*p*, and second pad electrode 32*p* according to Embodiment 1, respectively.

Spacer layers 430*a*, 430*b*, 430*c*, and 430*d* according to the present embodiment are disposed between first insulating layer of wiring substrate 420 and the bonding surface of cap unit 450 with wiring substrate 420, in the same manner as the spacer layers according to Embodiment 1. According to the present embodiment, the spacer layer is disposed at a position different from the position of each of the metal layers above first insulating layer. With this configuration, the advantageous effects equivalent to those of semiconductor light-emitting device 10 according to Embodiment 1 are yielded by semiconductor light-emitting device 410 according to the present embodiment as well.

Submount 445 includes an insulating block that is a rectangular parallelepiped block comprising an insulating material, first electrodes 447*a* to 447*c* and second electrode 448 each of which is a metal film disposed on the upper surface of the insulating block, and a metal film (not illustrated) disposed on the lower surface of the insulating block. First electrodes 447*a* to 447*c* and second electrode 448 are spaced apart from each other and electrically insulated. In addition, first electrodes 447*a* to 447*c* and second electrode 448 are electrically insulated from the metal film disposed on the lower surface of the insulating block. The metal films disposed on the lower surfaces of first electrodes 447*a* to 447*c*, second electrode 448, and the insulating block are metal films that comprise Ni, Cu, Pi, Au, or the like.

Each of semiconductor light-emitting elements 441*a* to 441*c* has a configuration equivalent to the configuration of semiconductor light-emitting element 41 according to Embodiment 1. According to the present embodiment, semiconductor light-emitting elements 441*a* to 441*c* are junction-down mounted to first electrodes 447*a* to 447*c*, respectively.

In addition, first pad electrode 431*p* and first electrode 447*a* are connected to each other via metal wire W2. The upper surface of semiconductor light-emitting element 441*a* and first electrode 447*b* are connected to each other via metal wire W1. The upper surface of semiconductor light-emitting element 441*b* and first electrode 447*c* are connected to each other via metal wire W1. The upper surface of semiconductor light-emitting element 441*c* and second electrode 448 are connected to each other via metal wire W1. Second electrode 448 and second pad electrode 432*p* are connected to each other via metal wire W3. With this configuration, semiconductor light-emitting elements 441*a* to 441*c* can be connected in series. As a result, it is possible to supply the same current to each of the semiconductor light-emitting elements.

According to the above-described configuration, it is possible to increase the optical output of the emitted light emitted from semiconductor light-emitting device 410 compared to the case where a single semiconductor light-emitting element 41 is used. In addition, although the heat generated in semiconductor light-emitting device 410 increases with increase in the optical output, it is possible, with semiconductor light-emitting device 410 according to the present embodiment, to efficiently discharge the heat using a heat sink or the like. As a result, it is possible to inhibit degradation of each of the semiconductor light-emitting elements.

Variation, etc.

Although the semiconductor light-emitting device, etc. according to the present disclosure have been described based on the embodiments thus far, the present disclosure is not limited to the embodiments described above.

For example, in each of the above-described embodiments, an example in which the semiconductor light-emitting element is a semiconductor light-emitting element has been described, but the semiconductor light-emitting element is not limited to the semiconductor light-emitting element. For example, the semiconductor light-emitting element may be a superluminescent diode or a quantum cascade laser.

In addition, in each of the above-described embodiments, an example in which a metal substrate is used as the first substrate has been described, but the first substrate may be an insulating substrate. In this case, the wiring substrate need not include the first insulating layer.

In addition, in each of the above-described embodiments, a temperature sensing element has been used as an example of the functional element, but some other functional element may be used. As other functional element, it is possible to use, for example, a light-receiving element, a switching element such as a transistor, and various passive elements such as a capacitor, an inductor, and a resistor. In addition, the shape of the metal layer or pad electrode to be connected to the functional element can be arbitrarily selected according to the type, etc. of the functional element. In addition, the semiconductor light-emitting element and the functional element may be electrically connected above the wiring substrate.

In addition, although the semiconductor light-emitting device according to Variation 2 of the above-described Embodiment 2 includes shielding component 60*s*, cap unit 50 may function as a shielding component when temperature sensing element 60 is disposed outside cap unit 50. In other words, it is possible to cause cap unit 50 to function as a shielding component, by reducing the transmittance of light from semiconductor light-emitting element 41 at the side wall facing rear end surface 41R of semiconductor light-emitting element 41 among the four side walls of cap unit 50.

In addition, in each of the above-described embodiments, the semiconductor light-emitting element has been mounted on the metal substrate via the submount, but the semiconductor light-emitting element may be directly mounted without involving the submount. In this case, the semiconductor light-emitting element may be junction-up mounted above the metal substrate.

Figure 28:
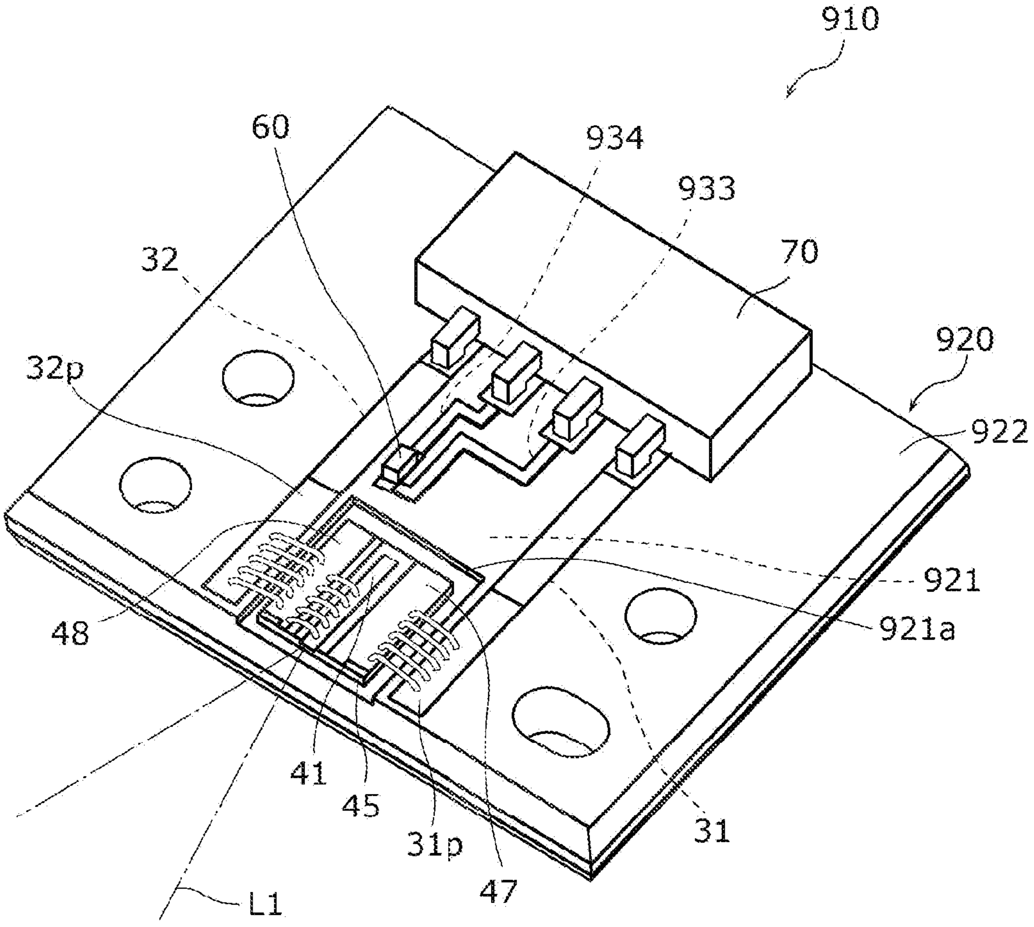
FIG. 28 is a perspective view schematically illustrating the configuration of a semiconductor light-emitting device according to a reference example.

It should be noted that, in each of the above-described embodiments, a semiconductor light-emitting device that includes a cap unit has been described, but it is possible to implement a semiconductor light-emitting device that does not include a cap unit as well. The following describes such a semiconductor light-emitting device with reference to FIG. 28. FIG. 28 is a perspective view schematically illustrating the configuration of semiconductor light-emitting device 910 according to a reference example.

Semiconductor light-emitting device 910 includes wiring substrate 920, semiconductor light-emitting element 41, submount 45, temperature sensing element 60, and connector 70. Semiconductor light-emitting element 41, submount 45, temperature sensing element 60, and connector 70 according to the reference example include configurations equivalent to the configurations of semiconductor light-emitting element 41, submount 45, temperature sensing element 60, and connector 70 according to Embodiment 1.

Wiring substrate 920 matches wiring substrate 20 according to Embodiment 1 in the configuration other than the configuration of first insulating layer 921, the configurations of third metal layer 933 and fourth metal layer 934, and the point that a spacer layer is not provided. Opening 921*a* of first insulating layer 921 extends to the end edge of wiring substrate 920. In other words, opening 921*a* has an open shape in first insulating layer 921, which is open on the side-surface side in the emission direction of emitted light L1 of semiconductor light-emitting element 41. Third metal layer 933 and fourth metal layer 934 have configurations equivalent to the configurations of third metal layer 233 and fourth metal layer 234 according to Embodiment 2, respectively. In addition, second insulating layer 922 has a configuration equivalent to the configuration of second insulating layer 222 according to Embodiment 2.

It is possible to implement a semiconductor light-emitting device which is high in optical output, with semiconductor light-emitting device 910 having the configuration not provided with a cap unit as descried above as well. Furthermore, since semiconductor light-emitting device 910 does not include a cap unit or a spacer layer, semiconductor light-emitting device 910 has a configuration more simplified than the configuration of semiconductor light-emitting device 10 according to Embodiment 1, and also is higher in the degree of freedom of design.

In addition, forms obtained by various modifications to the respective exemplary embodiments described above that can be conceived by a person of skill in the art as well as forms realized by arbitrarily combining structural components and functions in the respective exemplary embodiments described above which are within the scope of the essence of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor light-emitting device, etc. according to the present disclosure are applicable as, for example, a light source which is high in optical output and reliability, a laser processing machine, a vehicle lighting device such as a vehicle head light, a lighting device, a distance measuring devices such as a light detection and ranging (Lidar) device, a light source device for a projector, a medical light source device, a light source device for inspection, a light source device for sterilization, etc.

The invention claimed is:

1. A semiconductor light-emitting device comprising:
a wiring substrate;
a semiconductor light-emitting element disposed above an upper surface of the wiring substrate;
a cap unit which is disposed above the upper surface of the wiring substrate and covers the semiconductor light-emitting element; and
a plurality of first metal wires connected to the semiconductor light-emitting element and a plurality of second metal wires connected to the semiconductor light-emitting element, wherein
the wiring substrate includes:
a first substrate;
a first metal layer and a second metal layer that are spaced apart from each other above the first substrate;
a first pad electrode connected to the first metal layer;
a second pad electrode connected to the second metal layer; and
a spacer layer disposed above the first substrate,
the cap unit includes a bonding surface which is bonded to the wiring substrate, the bonding surface intersecting the first metal layer and the second metal layer in a top view of the wiring substrate,
the spacer layer is disposed between the bonding surface and the first substrate, at a position different from positions of the first metal layer and the second metal layer,
the wiring substrate further includes a first insulating layer disposed above the upper surface of the first substrate,
the first metal layer, the second metal layer, and the spacer layer are disposed above the first insulating layer,
an optical axis direction of the semiconductor light-emitting element is a direction parallel to an upper surface of the first substrate,
the first pad electrode and the second pad electrode each extend in the optical axis direction,
the first pad electrode and the second pad electrode are arranged in a direction perpendicular to the optical axis direction and parallel to the upper surface of the first substrate,
the semiconductor light-emitting element is disposed between the first pad electrode and the second pad electrode,
the first pad electrode and a lower surface of the semiconductor light-emitting element are electrically connected via the plurality of first metal wires, and
the second pad electrode and an upper surface of the semiconductor light-emitting element are electrically connected via the plurality of second metal wires.

2. The semiconductor light-emitting device according to claim 1, wherein
the semiconductor light-emitting element includes an optical waveguide that extends in a direction parallel to an upper surface of the first substrate.

3. The semiconductor light-emitting device according to claim 2, wherein
the semiconductor light-emitting device includes a submount disposed between the wiring substrate and the semiconductor light-emitting element, and
the semiconductor light-emitting element includes an emission surface which protrudes from an end surface of the submount.

4. The semiconductor light-emitting device according to claim 1, wherein
the cap unit includes a top plate which is rectangular, and four side walls each connected to a corresponding one of four sides at a peripheral edge of the top plate.

5. The semiconductor light-emitting device according to claim 4, wherein the four side walls are bonded to the wiring substrate above the spacer.

6. The semiconductor light-emitting device according to claim 4, wherein
one of the four side walls is a light-transmissive window including an inorganic light-transmissive plate and an antireflection film disposed on the inorganic light-transmissive plate, and
emitted light from the semiconductor light-emitting element passes through the light-transmissive window.

7. The semiconductor light-emitting device according to claim 6, wherein
the top plate is transparent.

8. The semiconductor light-emitting device according to claim 6, wherein
a gap between the light-transmissive window and an emission surface of the semiconductor light-emitting element is greater than zero and less than a thickness of the light-transmissive window.

9. The semiconductor light-emitting device according to claim 8, wherein
among the four side walls, side walls other than the light-transmissive window each have a thickness greater than the thickness of the light-transmissive window.

10. The semiconductor light-emitting device according to claim 4, wherein
the top plate is a light-transmissive window including an inorganic light-transmissive plate and an antireflection film disposed on the inorganic light-transmissive plate, and
emitted light from the semiconductor light-emitting element passes through the light-transmissive window.

11. The semiconductor light-emitting device according to claim 10, comprising:
a reflective optical element, wherein
the emitted light from the semiconductor light-emitting element is reflected by the reflective optical element, and propagates in a direction perpendicular to the upper surface of the wiring substrate.

12. The semiconductor light-emitting device according to claim 1, wherein
the first substrate is a metal substrate.

13. The semiconductor light-emitting device according to claim 1, wherein
a lower surface of the first substrate is a heat-dissipating surface.

14. The semiconductor light-emitting device according to claim 1, wherein
the first insulating layer includes an opening, and
the semiconductor light-emitting element is disposed in the opening.

15. The semiconductor light-emitting device according to claim 1, wherein
in the top view of the wiring substrate,
the bonding surface surrounds the semiconductor light-emitting element, and
the spacer layer is disposed along the bonding surface and surrounds the semiconductor light-emitting element.

16. The semiconductor light-emitting device according to claim 1, wherein
the wiring substrate includes a second insulating layer that covers at least one of a portion of the first metal layer, a portion of the second metal layer, or a portion of the spacer layer.

17. The semiconductor light-emitting device according to claim 1, wherein
the spacer layer comprises a metal material.

18. The semiconductor light-emitting device according to claim 1, wherein
the spacer layer comprises a material that one of the first metal layer or the second metal layer comprises, and is electrically connected to the one of the first metal layer or the second metal layer.

19. The semiconductor light-emitting device according to claim 1, comprising:
a functional element disposed above the wiring substrate.

20. The semiconductor light-emitting device according to claim 19, wherein
the functional element is covered by the cap unit.

21. The semiconductor light-emitting device according to claim 19, wherein
the functional element is a temperature sensing element.

22. The semiconductor light-emitting device according to claim 21, further comprising:
a shielding component disposed between the temperature sensing element and the semiconductor light-emitting element.

23. The semiconductor light-emitting device according to claim 1, wherein
the first substrate includes a slanted cut surface at an end portion.

24. A light source device comprising:
the semiconductor light-emitting device according to claim 1;
a heat sink on which the semiconductor light-emitting device is disposed; and
a fixing screw that fixes the semiconductor light-emitting device to the heat sink, wherein
the wiring substrate includes a through-hole, and
the fixing screw penetrates through the through-hole and is fixed to the heat sink.

25. The semiconductor light-emitting device according to claim 1, wherein
the first metal layer and the first pad electrode are arranged in the optical axis direction, and
the second metal layer and the second pad electrode are arranged in the optical axis direction.

26. The semiconductor light-emitting device according to claim 1, wherein
the first metal layer and the second metal layer each extend in the optical axis direction.

27. The semiconductor light-emitting device according to claim 1, wherein
the plurality of first metal wires are arranged in the optical axis direction, and
the plurality of second metal wires are arranged in the optical axis direction.

28. A light source device, comprising:
a semiconductor light-emitting device;
a heat sink on which the semiconductor light-emitting device is disposed;
a fixing screw that fixes the semiconductor light-emitting device to the heat sink;
a cable including a terminal; and
a terminal fixing screw, wherein
the semiconductor light-emitting device includes:
a wiring substrate;
a semiconductor light-emitting element disposed above an upper surface of the wiring substrate; and
a cap unit which is disposed above the upper surface of the wiring substrate and covers the semiconductor light-emitting element,
the wiring substrate includes:
a first substrate;
a first metal layer and a second metal layer that are spaced apart from each other above the first substrate; and
a spacer layer disposed above the first substrate,
the cap unit includes a bonding surface which is bonded to the wiring substrate, the bonding surface intersecting the first metal layer and the second metal layer in a top view of the wiring substrate,
the spacer layer is disposed between the bonding surface and the first substrate, at a position different from positions of the first metal layer and the second metal layer,
the wiring substrate includes a through-hole,
the fixing screw penetrates through the through-hole and is fixed to the heat sink,
the wiring substrate includes an extraction electrode electrically connected to the first metal layer, the extraction electrode includes an electrode through-hole at a center portion, the terminal fixing screw penetrates through the electrode through-hole, the terminal is disposed between the terminal fixing screw and the extraction electrode, and the extraction electrode and the terminal are electrically connected to each other.

* * * * *